(12) United States Patent
Baraniuk et al.

(10) Patent No.: US 8,687,689 B2
(45) Date of Patent: Apr. 1, 2014

(54) METHOD AND APPARATUS FOR ON-LINE COMPRESSED SENSING

(75) Inventors: Richard Baraniuk, Houston, TX (US); Dror Z. Baron, Houston, TX (US); Marco F. Duarte, Houston, TX (US); Mohamed Elnozahi, Houston, TX (US); Michael B. Wakin, Ann Arbor, MI (US); Mark A. Davenport, Houston, TX (US); Jason N. Laska, Houston, TX (US); Joel A. Tropp, Ann Arbor, MI (US); Yehia Massoud, Houston, TX (US); Sami Kirolos, Houston, TX (US); Tamer Ragheb, Houston, TX (US)

(73) Assignee: William Marsh Rice University, Houston, TX (US)

( * ) Notice: Subject to any disclaimer, the term of this patent is extended or adjusted under 35 U.S.C. 154(b) by 1079 days.

(21) Appl. No.: 12/091,340

(22) PCT Filed: Oct. 25, 2006

(86) PCT No.: PCT/US2006/041621
§ 371 (c)(1),
(2), (4) Date: Aug. 19, 2008

(87) PCT Pub. No.: WO2007/050680
PCT Pub. Date: May 3, 2007

(65) Prior Publication Data
US 2009/0222226 A1  Sep. 3, 2009

Related U.S. Application Data

(60) Provisional application No. 60/759,394, filed on Jan. 16, 2006, provisional application No. 60/735,616, filed on Nov. 10, 2005, provisional application No. 60/732,374, filed on Nov. 1, 2005, provisional application No. 60/729,984, filed on Oct. 25, 2005, provisional application No. 60/729,983, filed on Oct. 25, 2005.

(51) Int. Cl.
*H04N 7/12*  (2006.01)
*H04N 11/02* (2006.01)
*H04N 11/04* (2006.01)

(52) U.S. Cl.
USPC .................................... 375/240.01

(58) Field of Classification Search
USPC ....................... 375/240.01–240.29
See application file for complete search history.

(56) References Cited

U.S. PATENT DOCUMENTS 4,967,340 A * 10/1990 Dawes ............................ 712/19
5,189,683 A *  2/1993 Cowart .......................... 375/142

(Continued)

*Primary Examiner* — Chikaodili E Anyikire
(74) *Attorney, Agent, or Firm* — 24IP Law Group; Timothy R. DeWitt

(57) ABSTRACT

A typical data acquisition system takes periodic samples of a signal, image, or other data, often at the so-called Nyquist/Shannon sampling rate of two times the data bandwidth in order to ensure that no information is lost. In applications involving wideband signals, the Nyquist/Shannon sampling rate is very high, even though the signals may have a simple underlying structure. Recent developments in mathematics and signal processing have uncovered a solution to this Nyquist/Shannon sampling rate bottlenck for signals that are sparse or compressible in some representation. We demonstrate and reduce to practice methods to extract information directly from an analog or digital signal based on altering our notion of sampling to replace uniform time samples with more general linear functionals. One embodiment of our invention is a low-rate analog-to-information converter that can replace the high-rate analog-to-digital converter in certain applications involving wideband signals. Another embodiment is an encoding scheme for wideband discrete-time signals that condenses their information content.

53 Claims, 32 Drawing Sheets

(56) References Cited

U.S. PATENT DOCUMENTS

| | | | |
|---|---|---|---|
| 5,479,264 A * | 12/1995 | Ueda et al. | 386/317 |
| 6,539,122 B1 * | 3/2003 | Abousleman | 382/240 |
| 6,693,963 B1 * | 2/2004 | Taniguchi | 375/240.11 |
| 7,221,706 B2 * | 5/2007 | Zhao et al. | 375/240.08 |
| 7,271,747 B2 | 9/2007 | Baraniuk et al. | |
| 7,511,643 B2 | 3/2009 | Baraniuk et al. | |
| 2006/0029279 A1 | 2/2006 | Donoho | |

* cited by examiner

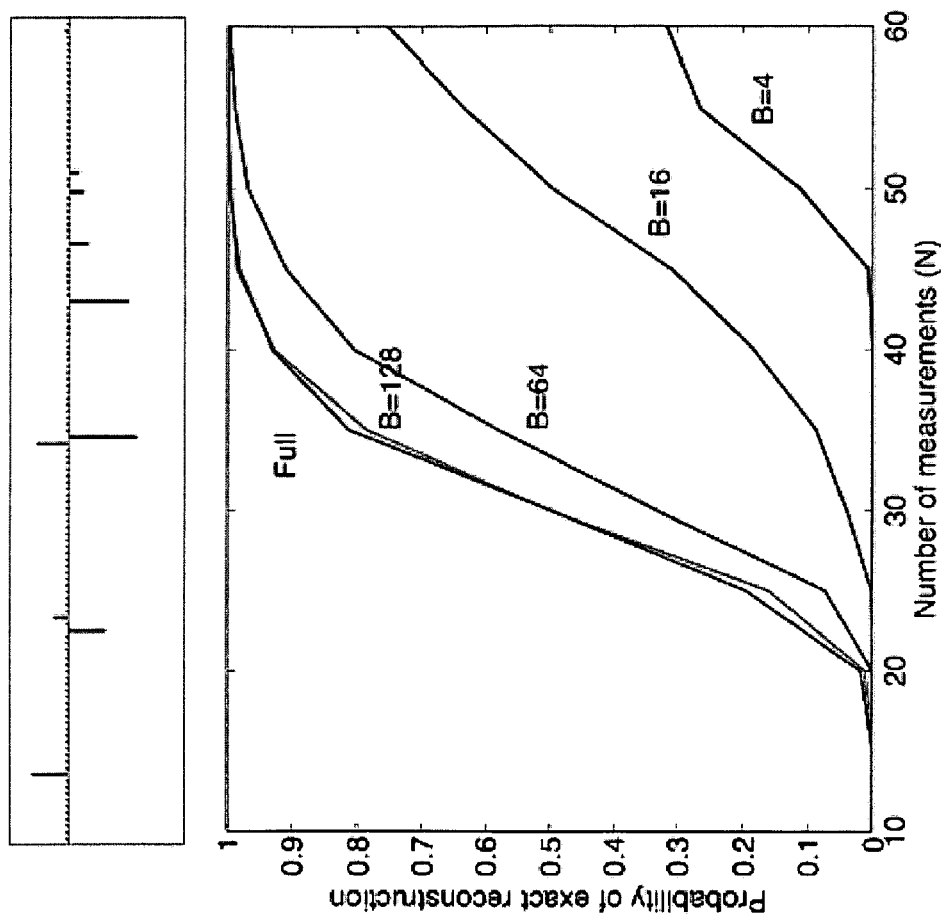

METHOD AND APPARATUS FOR ON-LINE COMPRESSED SENSING

CROSS-REFERENCE TO RELATED APPLICATIONS

The present application claims the benefit of the filing date of U.S. Provisional Application Ser. No. 60/729,983, entitled "Random Filters for Compressive Sampling and Reconstruction," and filed on Oct. 25, 2005 by inventors Joel A. Tropp, Michael B. Wakin, Marco E Duarte, Dror Baron and Richard G. Baraniuk.

The present application claims the benefit of the filing date of U.S. Provisional Application Ser. No. 60/729,984, entitled "Method And Apparatus For Sparse Signal Detection From Incoherent Projections," and filed on Oct. 25, 2005 by inventors Richard G. Baraniuk, Marco E Duarte, Mark A. Davenport, and Michael B. Wakin.

The present application claims the benefit of the filing date of U.S. Provisional Application Ser. No. 60/732,374, entitled "Method And Apparatus For Compressive Sensing for Analog-to-Information Conversion," and filed on Nov. 1, 2005 by inventors Richard G. Baraniuk, Michael B. Wakin, Dror Baron, Marco F Duarte, Mark A. Davenport, Yehia Massoud, Mohamed Elnozahi, Sami Kirolos, Tamer S. Mohamed, Tamer Ragheb and Joel A. Tropp.

The present application claims the benefit of the filing date of U.S. Provisional Application Ser. No. 60/735,616, entitled "Method and Apparatus for Distributed Compressed Sensing" and filed Nov. 10, 2005 by inventors Richard Baraniuk, Dror Baron, Marco Duarte, Shriram Sarvotham and Michael Wakin.

The present application claims the benefit of the filing date of U.S. Provisional Application Ser. No. 60/759,394, entitled "Sudocodes: Efficient Compressive Sampling Algorithms for Sparse Signals" and filed Jan. 16, 2006 by inventors Richard Baraniuk, Dror Baron and Shriram Sarvotham.

The above cross-referenced related applications are hereby incorporated by reference herein in their entirety.

STATEMENT REGARDING FEDERALLY SPONSORED RESEARCH OR DEVELOPMENT

The present inventions were developed with funding under the following grants: NSF DMS Grant 0503299; NSF CCF-0431150; NSF CNS-0520280; NSF CNS-0435425 and DARPA/ONR N6001-06-1-2011.

1 BACKGROUND OF THE INVENTION

1.1 Field of the Invention

The present invention relates to methods and apparatuses for signal detection, acquisition and processing. The invention is applicable all types of "signals" and data, including but not limited to signals, images, video and other higher dimensional data.

1.2 Brief Description of the Related Art
1.2.1 Limits of Analog-to-Digital Conversion The power, stability, and low cost of digital signal processing (DSP) has pushed the analog-to-digital converter (ADC) increasingly close to the front-end of many important sensing, imaging, and communication systems. An ADC converts an analog input waveform to a sequence of quantized, periodic discrete-time samples; a representation justified by the Nyquist/Shannon sampling theorem that states that any band-limited signal can be completely reconstructed from uniform time samples provided a sampling rate twice the highest frequency in the signal (the Nyquist rate). ADCs are characterized in terms of their sampling rate and the number of bits they use to represent each sample.

There are many applications that severely stress current ADC technologies. For example, consider signal acquisition and processing in the radio frequency (RF) bands. In a radar system, for example, the sampling bandwidth is inversely proportional to the resolution of the radar, and many bits are needed in order to tease weak target signals out from dominating clutter, jammers, and background noise. In signals intelligence, the receiver must surveil a wide RF bandwidth for weak, potentially covert signals of interest in a background of numerous other transmissions and noise; moreover, many bits are needed in order to differentiate among the numerous levels of increasingly complicated signaling constellations. In these settings, current ADC technologies cannot perform at the bit rate and depth required for faithful detection and reconstruction.

Even worse, the current pace of ADC development is incremental and slow. It will be decades before ADCs based on current technology will be fast and precise enough for pressing applications. Even after better ADCs become available, the deluge of data will swamp back-end DSP algorithms. For example, sampling a 1 GHz band at 16 bits-per sample would generate data at rate of 2 GB/s, which would fill a modern hard disk in roughly two minutes. In a typical application, only a tiny fraction of this information is relevant. Thus, it is our contention that incremental advances based on the Nyquist/Shannon sampling theory will be insufficient for many applications. Rather, it is necessary to revise the founding premises of sampling theory.

1.3 Related Work
1.3.1 Analog-to-Digital Converters

The demands of various analog-to-digital (ADC) applications vary from one application to another. Increasing the sampling frequency and increasing the resolution (number of bits) are the challenging tradeoffs for the current ADCs. For applications demanding high sampling frequencies or high data rates, the number of data bits is often sacrificed. For military applications, such as radar signal processing, high sampling frequency and high resolution is mandatory. Hence, designing a high precision ADC for wideband signals is the main goal in order to address such applications.

Flash, pipelined, and sigma delta analog-to-digital converters are the three main implementations of ADCs. Flash ADCs have the advantage of being very fast, as the conversion happens in a single cycle at the cost of the increased area and power consumptions. Each additional bit almost doubles the area and power consumption; a maximum resolution of eight bits is reported for a flash ADC converter at a sampling frequency of 2 GHz. See C. Azzolini, A. Boni, A. Facen, M. Parenti, and D. Vecchi, "Design of a 2-GS/s 8-b Self-Calibrating ADC in 0.18 m CMOS technology," *IEEE International Symposium on Circuits and Systems, ISCAS'05*, pages 1386-1389, May 2005. For wideband applications, such as radar and optical communications, multi-GHz sampling is necessary. However, increasing the sampling frequency of the flash ADC converter reduces the effective number of bits dramatically. Previously, for multi-GHz operations, expensive technologies, such as InP—InGaAs, were used to fabricate the wideband flash ADC. However, due to the high sampling frequency, low resolution was obtained. Flash ADC converters with a sampling frequency of 24 GHz with just 3-bits of resolution were reported in Nosaka, M. Nakamura, M. Ida, K. Kurishima, T. Shibata, M. Tokumitsu, and M. Muraguchi, "A 24-Gsps 3-bit Nyquist ADC using InP HBTs for Electronic Dispersion Compensation," *Proceedings of*

*IEEE MIT-S International Microwave Symposium*, 1:101-104, June 2004. On the other hand, current CMOS technologies do not support high sampling frequencies, because of the limited transistor cut-off frequency. Nevertheless, a 5 GHz 4-bit flash ADC using 0.18 m technology was reported recently in S. Sheikhaei, S. Mirabbasi, and A. Ivanov, "A 4-Bit 5 GS/s Flash A/D Converter in 0.18 m CMOS," In *IEEE International Symposium on Circuits and Systems, ISCAS'05*, pages 6138-6141, May 2005. For higher sampling frequencies, time-interleaved architectures, which are based on flash ADC, are commonly used. In these architectures, a number of lower speed converters, with a minimized input capacitance are placed in parallel. Using time interleaving, a high speed sampling is obtained. Because of the gain and offset mismatches among the different parallel channels and clock jitter, time-interleaved architectures usually require digital calibration methods that significantly increase the power and limits the resolution of the ADC. See W. Ellersick, C. K. Yang, M. Horowitz, and W. Dally, "GAD: A 12 GS/s CMOS 4-bit A/D converter for an equalized multilevel link," *IEEE Symposium on VLSI Circuits, Digest of Technical Papers*, pages 49-52, June 1999; C. K. Yang, V. Stojanovic, S. Mojtahedi, M. Horowitz, and W. Ellersick, "A serial-link transceiver based on 8-G samples/s A/D and D/A converters in 0.25 m CMOS," *IEEE Journal of Solid State Circuits*, pages 293-301, November 2001; L. Y. Nathawad, R. Urata, B. A. Wooley, and D. A. B. Miller, "A 40-GHz-Bandwidth, 4-Bit, Time-Interleaved A/D Converter Using Photoconductive Sampling," *IEEE Journal of Solid State Circuits*, pages 2021-2030, December 2003; and S. Naraghi and D. Johns, "A 4-bit analog-to-digital converter for high-speed serial links," *Micronet Annual Workshop*, pages 33-34, April 2004. To achieve higher resolution than in the case of flash converters, pipelined architectures are commonly used. Conventionally, pipelined ADCs are usually implemented using closed loop circuit design techniques that utilize a multiplying DAC. Due to the delay introduced by the settling time of the DAC, high sampling rates for high resolution ADC is one of the main challenges for pipelined ADC. Resolutions of 16 bits are obtainable for low sampling frequencies using the pipelined architectures, while the resolution reduces to 8 bits as the sampling frequency increases to 400 MHZ. See C. S. G Conoy, "An 8 bit 85 Msps parallel pipeline A/D converter in 1-m CMOS," *IEEE Journal of Solid State Circuits*, April 1993; W. Bright "8 bit 75 MSps 70 mW parallel pipelined ADC incorporating double sampling," *Solid State Circuits Conference*, February 1998; and Y. Kim, J. Koa, W. Yuu, S. Lim, and S. Kim, "An 8-bit 1 GSps CMOS Pipeline ADC," *IEEE Asia-Pacific Conference on Advanced System Integrated Circuits AP-ASIC2004*, pages 424-425, August 2004. Therefore, sub-GHz sampling rates characterize pipelined ADC, and, therefore, pipelined ADCs are not suitable for wideband applications.

Sigma delta ADCs are the most common type of oversampled converters. The main advantage of the sigma delta ADCs is the capability of pushing the quantization noise from the band of interest to other frequency bands (noise shaping), and, thereby, increase the resolution while attaining low power consumption. See E. J. van der Zwan and E. C. Dijkmans, "A 0.2 mW CMOS Modulator for Speech Coding with 80 dB Dynamic Range," In *IEEE International Solid-State Circuits Conference, Digest of Technical Papers, ISSCC*, pages 232-233, 451, February 1996; E. J. van der Zwan, K. Philips, and C. A. A. Bastiaansen, "A 10.7-MHz IF-to-baseband A/D conversion system for AM/FM radio receivers," *IEEE Journal of Solid State Circuits*, pages 1810-1819, December 2000; K. Philips, "A 4.4 mW 76 dB complex ADC for Bluetooth receivers," *IEEE International Solid-State Circuits Conference (ISSCC)*, pages 464-478, February 2003; and R. H. M. Van Veldhoven, "A Triple-Mode Continuous-Time Modulator With Switched-Capacitor Feedback DAC for a GSM-EDGE/CDMA2000/UMTS Receiver," *IEEE Journal of Solid State Circuits*, pages 2069-2076, December 2003. The oversampling relaxes the requirements of the anti-aliasing filter, and, hence, it could be easily implemented. In addition, using the continuous time architectures of the sigma delta ADC, the anti aliasing filter could be removed due to the inherent anti-aliasing property. However, the main limitations of the sigma delta ADC are the latency and oversampling. Hence, sigma delta ADC is used in applications where resolutions in excess of 10 bits are required while the signal bandwidth is very small compared to the sampling frequency. Increasing the order, oversampling ratio (OSR) or having a multi-bit DAC are the current challenges of sigma delta ADC in order to enhance their performance. The discrete time implementation of sigma delta is based on switched capacitor circuits, and, therefore, the maximum sampling frequency is limited by the opamp cut-off frequency and sampling errors. Sampling frequencies higher than 100 MHz are hard to achieve using the discrete time implementations. On the other hand, continuous time implementations, such as Gm C and passive sigma delta, support higher sampling requirements. However, continuous time implementations are limited by the excess loop delay, sampling jitter and non linearity of the used analog circuits.

Current research efforts are focusing on finding new circuit techniques and modifying existing architectures for solving technology related problems, such as non-linearities, clock jitter, and noise, in order to enhance the performance (increase the sampling frequency) of the ADC. On the other hand, our approach provides an innovative theory for building high performance ADC without the requirement of increasing the sampling frequency and it allows the use of the existing technology to build high performance ADCs.

1.3.2 Compressed Sensing

Over the past decades the amount of data generated by sensing systems has grown from a trickle to a torrent. This has stimulated much research in the fields of compression and coding, which enable compact storage and rapid transmission of large amounts of information. Compression is possible because often we have considerable a priori information about the signals of interest. For example, many signals are known to have a sparse or compressible representation in some transform basis (Fourier, DCT, wavelets, etc.) and can be expressed or approximated using a linear combination of only a small set of basis vectors.

The traditional approach to compressing a sparse signal is to compute its transform coefficients and then store or transmit the few large coefficients and their locations. This is an inherently wasteful process (in terms of both sampling rate and computational complexity), since it forces the sensor to acquire and process the entire signal even though an exact representation is not ultimately required. For instance, in many signal processing applications (including most communications and many radar systems), signals are acquired only for the purpose of making a detection or classification decision.

A new framework for simultaneous sensing and compression has developed recently under the rubric of Compressed Sensing (CS). Donoho and, independently, Candès, Romberg, and Tao have put forth this framework in the following series of papers:

D. Donoho, "Compressed sensing," *IEEE Trans. Information Theory*, Preprint, 2004;

E. Candès, J. Romberg, and T. Tao, "Robust uncertainty principles: Exact signal reconstruction from highly incomplete frequency information," Preprint, 2004;

D. Donoho, "High-dimensional centrally symmetric polytopes with neighborliness proportional to dimension," Preprint, 2005;

D. Donoho, "Neighborly polytopes and sparse solutions of underdetermined linear equations," 2005, Preprint;

E. Candès and T. Tao, "Near optimal signal recovery from random projections and universal encoding strategies," *IEEE Trans. Information Theory*, 2004, Submitted;

E. Candès and T. Tao, "Decoding by linear programming," *IEEE Trans. Information Theory*, Preprint, 2005; and E. Candès, J. Romberg and T. Tao, "Stable Signal Recovery from Incomplete and Inaccurate Measurements", Preprint, 2005

This series of work has enjoyed considerable recent attention.

CS enables a potentially large reduction in the sampling and computation costs at a sensor. CS relies on the concept that a signal having a sparse representation in one basis can be reconstructed from a small set of projections onto a second, measurement basis that is incoherent with the first. (Roughly speaking, incoherence means that no element of one basis has a sparse representation in terms of the other basis.) Interestingly, random projections are a universal measurement basis in the sense that they are incoherent with any other fixed basis with high probability. The CS measurement process is non-adaptive; the reconstruction process is nonlinear. A variety of reconstruction algorithms have been proposed; see E. Candès, J. Romberg, and T. Tao, "Robust uncertainty principles: Exact signal reconstruction from highly incomplete frequency information", Preprint, 2004, D. Donoho, "Compressed sensing", Preprint, 2004, and J. Tropp and A. C. Gilbert, "Signal recovery from partial information via orthogonal matching pursuit", Preprint, April 2005.

Reinterpreting their work in view of the theory of optimal recovery (discussed below), one finds that CS strives to recovery the signal identically. The signal statistics that CS computes are strictly the identity (or, in some situations, an orthogonal transformation of the signal). The algorithmic framework that CS employs involves linear programming and convex optimization. If we define signal recovery or information extraction to be exact, full recomputation of the original signal, then CS performs admirably. The CS recovery algorithm outputs a signal whose error matches the error rate for the input signal class.

There are situations in which we wish to reconstruct the signal exactly. Image processing and medical imaging, in particular, are two such applications. In medical imaging applications, we may be able to make a few measurements of a person, a piece of tissue, or an experimental subject and recovery or generate a full image of the object in question using the CS algorithms and framework. Medical professionals and diagnosticians are highly trained at reading full, specific images from such devices and we simply cannot present them with a few significant portions of these types of images.

If, however, we wish to extract different types of information other than the identity, then the compressed sensing framework is not applicable. We argue that if a signal is sparse or compressible, as is assumed in CS, then the information present in the signal is those significant transform coefficients only, not the many insignificant ones. Furthermore, we may reconstruct an approximation using only the significant coefficients obtained from reconstruction that produce an error rate equal or better that the rate prescribed by the CS reconstruction theory. We note that an algorithm which only needs to output a few significant transform coefficients should (and often will) run considerably faster than the CS algorithms, which take time to output a signal just as long as the input signal. The greedy algorithms pursued for CS recovery enjoy this dramatic computational advantage over other iterative optimization techniques proposed by Donoho, Candès and Tao, Nowak, and others in D. Donoho, "Compressed sensing," Preprint, 2005; E. Candès and T. Tao, "Near optimal signal recovery from random projections and universal encoding strategies," Preprint, 2004; and J. Haupt and R. Nowak, "Signal reconstruction from noisy random projections," Preprint, 2004. For many applications, the large transform coefficients are the only ones that matter and, for these applications, we need not compute the smaller ones.

In addition, there are many realtime applications for which these smaller coefficients are a luxury we cannot afford to spend time computing. Transform coefficients are but one type of statistics we might wish to compute from the signal. A number of applications might require nonlinear statistics (such as order statistics) or perform a simple classification procedure upon the signal (such as deciding whether or not a recorded signal contains an encoded communication). Compressed Sensing cannot currently address these needs.

Another important aspect of the CS theory is that it is designed for finite-length, discrete-time signals and so is not immediately applicable to analog and streaming signals.

1.3.3 Finite Rate of Innovation Sampling

In M. Vetterli, P. Marziliano, and T. Blu, "Sampling signals with finite rate of innovation," *IEEE Trans. Signal Proc.*, 50(6), June 2002, Vetterli et al. propose a methodology for sampling signals having a finite rate of innovation. Such signals are modeled parametrically with a finite number of degrees of freedom per unit time; R is deemed the rate of innovation. Examples include streams of delta functions with unknown positions and amplitudes or piecewise polynomial signals with unknown polynomial coefficients and breakpoints. Applications have also been proposed in Ultra Wideband (UWB) communications, where a stream of similar pulses may arrive with different delays and amplitudes. See J. Kusuma, A. Ridolfi, and M. Vetterli, "Sampling of communications systems with bandwidth expansion," *Proc. ICC,* 2002.

While conventional sampling theory would dictate that such signals be sampled at the Nyquist rate (which could even be infinite for a stream of delta functions), Vetteri et al. have shown instead that signals can be recovered when sampled at the rate of innovation. The idea is that, rather than sampling the signal directly, it is preferable to sample a filtered version of the signal. From these samples, then, it is possible to write a system of equations that describe the unknown signal parameters. These can be solved using a variety of techniques; one technique involving eigendecomposition is also robust to noise. See I. Maravic and M. Vetterli, "Sampling and reconstruction of signals with finite innovation in the presence of noise," *IEEE Transactions on Signal Processing*, Vol. 53, No. 8, pp. 2788-2805, 2005. Moreover, the computational complexity of the reconstruction techniques relate to the innovation rate R and not the Nyquist frequency.

The primary limitation of such an approach is that it pertains only to a limited class of signals. To date, the examples provided in the literature are essentially limited to delta sequences, splines, piecewise polynomials, and pulse trains. However, there may also be many interesting sparse signals that are not well-modeled with such a parameterization. One example is an arbitrary piecewise smooth signal, which is sparse in the wavelet domain but not easily expressed in parametric form.

1.3.4 AM-FM Energy Detection and Separation

In J. F. Kaiser, "On a simple algorithm to calculate the energy of a signal," *Proc. IEEE ICASSP*, Albuquerque, N. Mex., April 1990, Kaiser proposed the use of a nonlinear operator, called Teager's Algorithm, to estimate the measure of the energy in a sinusoidal signal $$s = a(t)\cos[\phi(t)]:\Phi(s)$$

$$= \frac{d^2s}{dt^2} - s\frac{ds}{dt} \approx a^2(t)w_i^2(t),$$

where $w_i = d\phi/dt$ is the instantaneous frequency. This operator motivated an energy separation algorithm (ESA) that estimates the squared amplitude envelope and squared instantaneous frequency:

$$\hat{a}^2(t) = \frac{\Phi^2(s)}{\Phi\left(\frac{ds}{dt}\right)} \text{ and } \hat{w}_i^2(t) = \frac{\Phi\frac{ds}{dt}}{\Phi(s)}.$$

See P. Maragos, J. E Kaiser, and T. E Quatieri, "On amplitude and frequency demodulation using energy operators," *IEEE Trans. Signal Processing*, 41(4):1532-1550, April 1993. The error bounds are small for the noiseless case with some general conditions. However, the presence of noise renders the operator Φ unpredictable, and thus the estimates become unreliable. In A. C. Bovik, P. Maragos, and T. E Quatieri, "AM-FM energy detection and separation in noise using multiband energy operators," *IEEE Trans. Signal Processing*, 41(12):3245 3265, December 1993, Bovik et al. presented a modified algorithm with high tolerance to noise, designed for detection of AM and FM signals in noisy environments. In this algorithm, the signal is filtered through a bank of bandpass filters, and analyzed using the Φ operator and ESA algorithm at the channel with dominant local response. Since the operator Φ becomes negligible in cases when the instantaneous frequency falls outside the passband of a given filter, the filter containing the dominant signal frequency can be easily identified. By using the filterbank structure, the signal-to-noise ratio of the input signal is reduced by the bandpass filtering at the dominant filter element.

The algorithm has also been adapted to discrete time signals, but requires sampling at the Nyquist rate for the highest frequency required to be detected, i.e., only frequencies up to half the sampling rate can be detected using the discrete-time algorithm. See P. Maragos, J. F. Kaiser, and T. F. Quatieri, "Energy separation in signal modulation with application to speech analysis," *IEEE Trans. Signal Processing*, 41(4): 3024-3051, April 1993. The noise tolerance is dependent on the bandwidth of each of the filters in the filterbank, and thus dependent on the number of filters. These two considerations restrict the feasibility of the approach in real-world AICs.

2 SUMMARY OF THE INVENTION

Recent developments in mathematics and signal processing have uncovered a possible solution to the ADC bottleneck. These developments center around two observations.

The first is that Nyquist/Shannon sampling represents a worst-case scenario since it applies to arbitrary bandlimited signals. In many applications (including radar and signals intelligence applications), we have considerable a priori information on the signals of interest. In particular, many signals of interest are known to have a sparse representation in some canonical system (Fourier, wavelets, etc.). Thus, with fewer sampled bits, it is possible to detect, represent, and reconstruct these signals without information loss. However, the bits will not necessarily come from quantized uniform samples as they do now.

The second observation is that, to distill the small amount of information contained in a sparse signal, it is not necessary to perform expensive, adaptive post-processing on nonsparse data such as discrete-time samples or Fourier or wavelet coefficients. Rather, such information can be extracted directly from the analog signal if we alter our notion of sampling to replace uniform time samples by more general linear functionals. CS establishes mathematically that a relatively small number of these functionals harvest all of the information necessary to faithfully reconstruct sparse signals. A closely related field in computer science, known as streaming algorithms, adds the capability to recover and characterize sparse signals in real time with limited computational resources. See S. Muthukrishnan, "Data streams: Algorithms and applications," 2004; A. C. Gilbert, S. Guha, P. Indyk, Y. Kotidis, S. Muthukrishnan, and M. Strauss, "Fast, small-space algorithms for approximate histogram maintenance," *ACMSTOC '02 Proceedings*, 2002; N. Alon, Y. Matias, and M. Szegedy, "The space complexity of approximating the frequency moments," *Proc. 28th ACM Symp. on Theory of Computing*, pages 20-29, May 1996.

The recovery of the signal or its statistics from the downsampled information is no longer a matter of simple linear filtering as in Nyquist/Shannon-based ADCs. Instead, the signal or its statistics are identified through typically nonlinear processes that seek the sparsest signal that explains the measured information.

These results justify a new paradigm, analog-to-information conversion (AIC), as a replacement for conventional ADC. A typical system is illustrated in FIG. 1. The information extraction 102 denoted by the operation Φ replaces conventional sampling. Back end DSP 104 reconstructs the signal, approximates the signal, computes key statistics, or produces other information. For sparse input signals, AIC promises greatly reduced digital data rates (matching the sparsity level of the signal), and it offers the ability to focus only on the relevant information. Although the first mathematical results on CS and streaming algorithms indicate that AIC offers an opportunity to break the sampling bottleneck, this theory does not present a ready-made solution for systems with an analog front end.

Indeed, several important challenges appear when one tries to envisage CS and streaming concepts embedded in real hardware that solves real problems. The most important problem is that CS theory currently studies finite-length, discrete-time signals, while practical systems must process streaming, continuous-time, analog signals. Thus, the CS and streaming concepts must be ported from the digital to the analog domain and implemented in real analog/digital circuitry running at up to RF bandwidths.

The present inventions close an important gap between the current mathematical theory for CS and streaming algorithms and the practical problems of interest to ADC designers and users. An important hallmark of the present approach is that it is information scalable in the sense that our AIC designs have the capability to acquire a range of different signal statistics (from the entire signal itself to a 1-bit detection decision) that are relevant for different applications; for example:

Recovery. For example, reconstruct a radar target signal of interest exactly from the AIC measurements.

Approximation. For example, find the best approximation of an RF signal using at most k Fourier modes or wavelets.

Estimation. For example, identify some signal statistic, such as the frequency and phase of a sinusoid or chirp, in the presence of noise and other interference; estimate the mean, variance, histogram, or quantiles of a signal's statistical distribution.

Detection/Classification. For example, determine if a satellite phone signal is present in some wide bandwidth; decide whether a signal is target or clutter.

Reducing the required information of the signal relaxes the number of measurements required, relaxes the design constraints on the AIC hardware and back-end DSP algorithms, and increases system performance. For instance, a system might yield enough measurements for signal detection even though exact recovery is impossible.

This invention approximates a discrete or continuous time signal s, its statistics, or linear functionals evaluated at such signal. Said signal has length n if discrete or bandwidth n if continuous; the invention operates by taking a set of measurements y for the signal s, where y comprises a vector with only m entries, where m is less than n for discrete time signals, and m is less than 2n for continuous time signals.

In a preferred embodiment, the invention is a method for producing an exact or approximate reconstruction of a signal s from a set of measurements y through the use of compressed sensing reconstruction algorithms, with examples such as optimization, greedy algorithms, homotopy-based algorithms or belief propagation algorithms.

In a version of this preferred embodiment, the signal s is well approximated by a k-parameter representation, where the k parameters can correspond to the coefficients for a linear combination of k functions that returns the approximation to the signal s. For discrete-time signals, the functionals are replaced by basis or dictionary vectors. The embodiment performs reconstruction of the signal by reconstructing exactly or approximately the set of k signal parameters; the embodiment may also produce an approximation to the signal s with quality similar to that given by the k parameter signal representation.

In another preferred embodiment, the invention establishes a method for estimating the value a functional $f$ on a continuous or discrete time signal s using compressed sensing. The invention operates by taking a set of measurements y for the signal s, and processing the set of measurements y to obtain an estimate of the value of the functional $f$ on a signal s. This processing of the set of measurements y may involve performing reconstruction or approximation of the signal s, followed by evaluation of the functional $f$ on the reconstruction or approximation.

In a third preferred embodiment, the invention implements an apparatus for taking measurements y of a discrete or continuous time signal s, including means for manipulating the signal s of length n, means for obtaining a set of m CS measurements y for the manipulated signal s, means for transmitting the measurements y of the manipulated signal s from the means for measuring to a signal processor, and means for recovering the signal s from the measurements y based on the parametric structure of the signal.

In an additional version of the third preferred embodiment, the invention implements an apparatus for estimating the value of a functional $f$ of a discrete or continuous time signal s, including means for manipulating the signal s of length n, means for obtaining a set of m measurements y of the manipulated signal s, means for transmitting the measurements y of the manipulated signal s from the means for measuring to a signal processor, and means for estimating the functional $f$ of the signal s from the measurements y.

Still other aspects, features, and advantages of the present invention are readily apparent from the following detailed description, simply by illustrating preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

3 BRIEF DESCRIPTION OF THE DRAWINGS

For a more complete understanding of the present invention and the advantages thereof, reference is now made to the following description and the accompanying drawings, in which:

FIG. 1 is a schematic of an analog-to-information converter (AIC). The operator (takes linear measurements of the analog signal x(t) to create the digital sequence y[n] that preserves its salient information. Back-end DSP produces the desired output, from signal reconstruction to signal detection.

Figure 4:
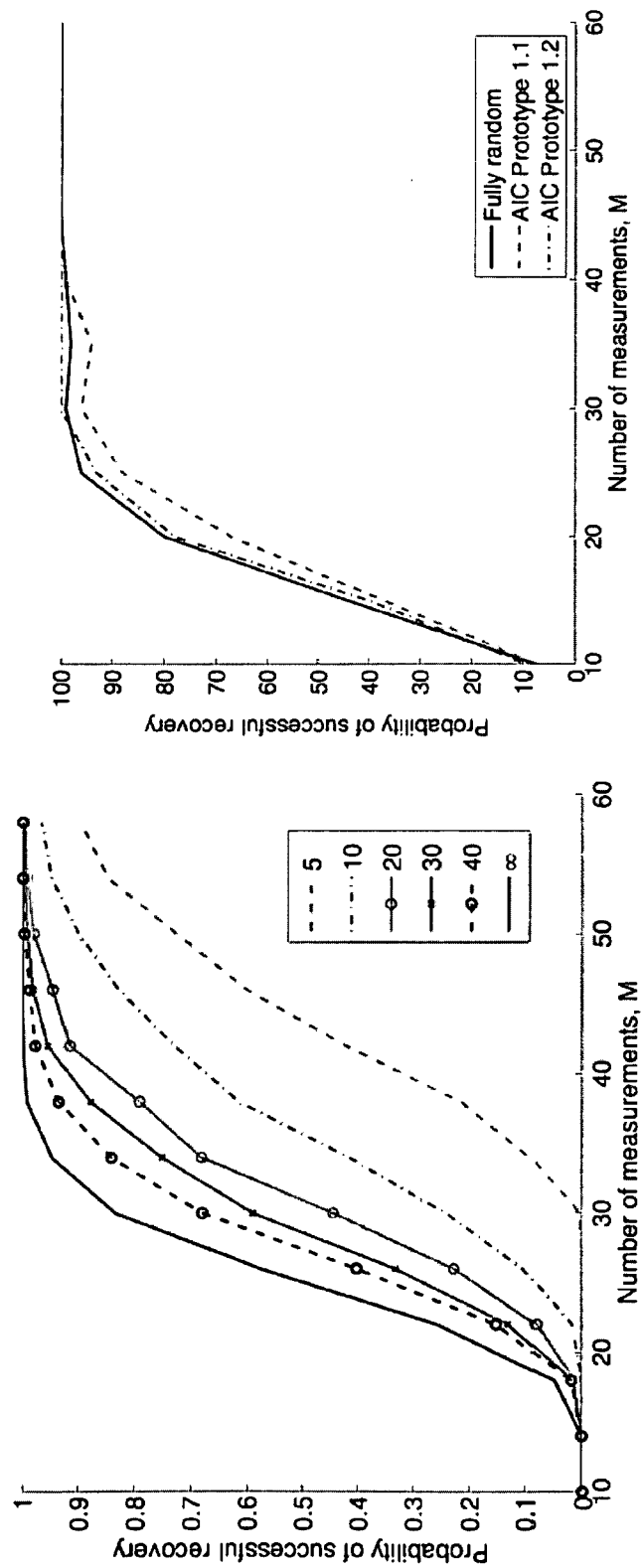

FIG. 4 shows examples of performance of AIC design 1. The left graph shows reconstruction performance using FIR random filters of various lengths on a signal of length N=100 with sparsity K=10. The reconstruction performance is dependent on the filter length; sufficiently long filters allow sampling rates well below Nyquist. The right graph shows reconstruction performance for both AIC prototypes (1 in green; 2 in red) is very close to using a fully random Φ (blue). Here, N=200 and K=5.

Figure 5A:
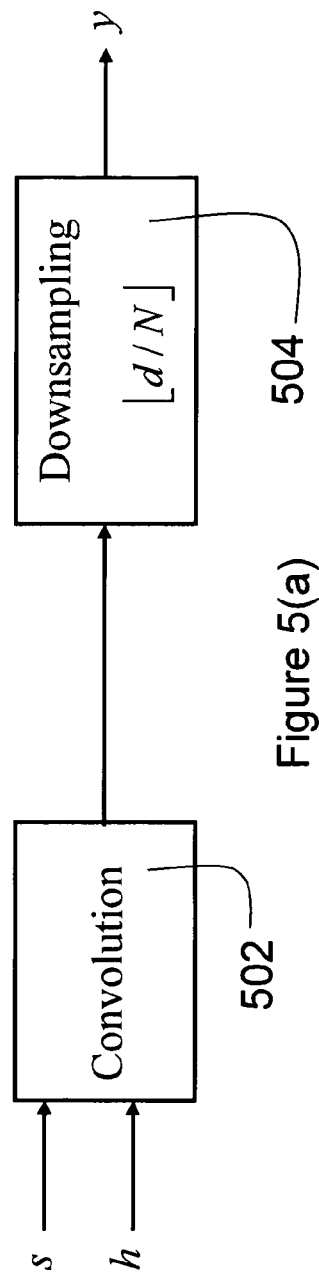

FIGS. 5(a) and (b) are block diagrams for signal acquisition through random filtering: (a) using convolution; (b) using Fast Fourier Transform (FFT) and Inverse FFT (IFFT). The FIR filter h has random taps, which must be known in order to recover the signal s from the compressed data y.

Figure 6B:
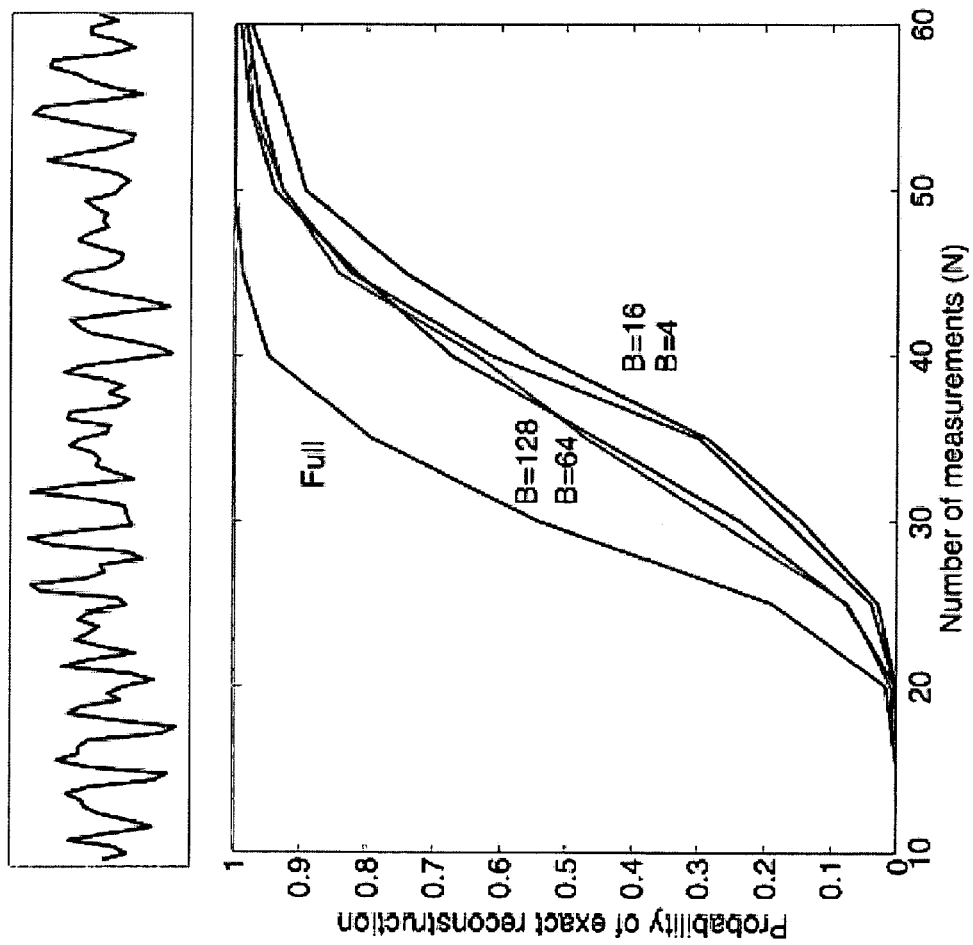
Figure 6C:
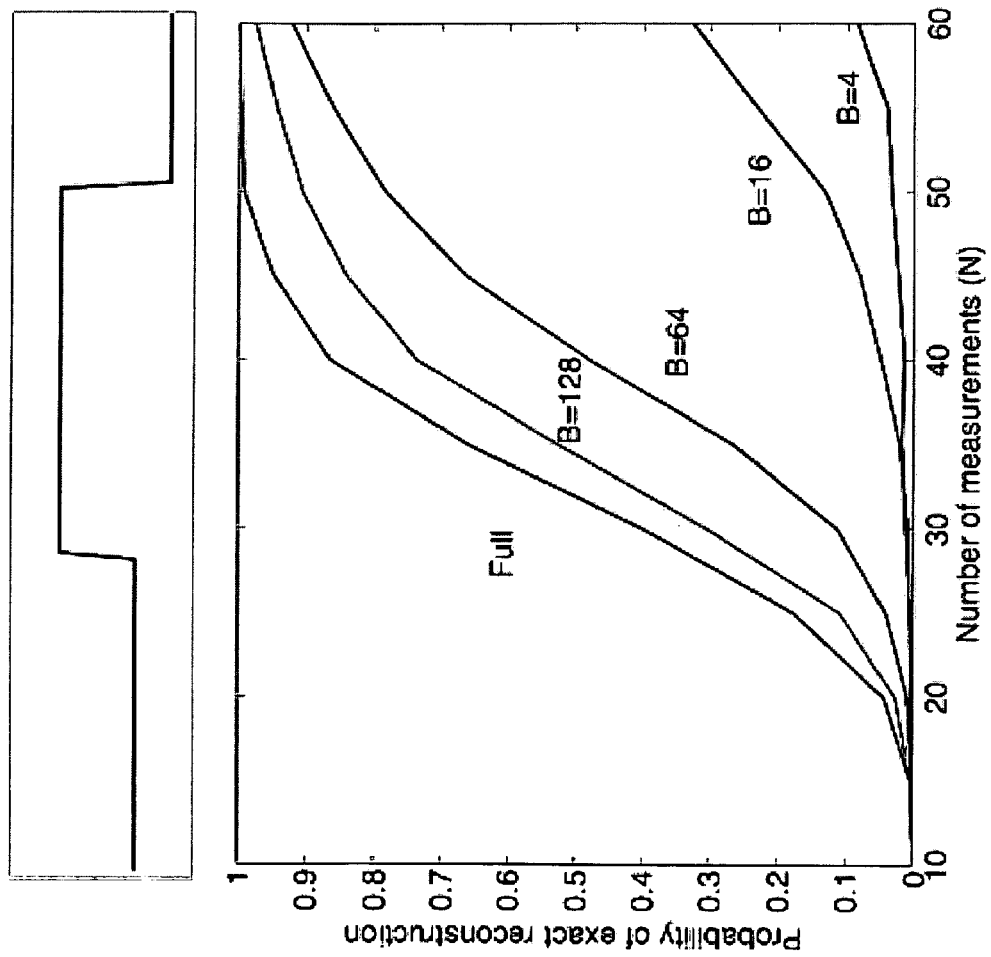

FIGS. 6(a)-(c): show results on AIC design 1 for the probability of correct reconstruction versus the number of measurements N for four filter lengths B. Signal length d=128. (a) Time-sparse signals. (b) Fourier-sparse signals. (c) Piecewise polynomial signals. Typical signals appear at top.

Figure 7:
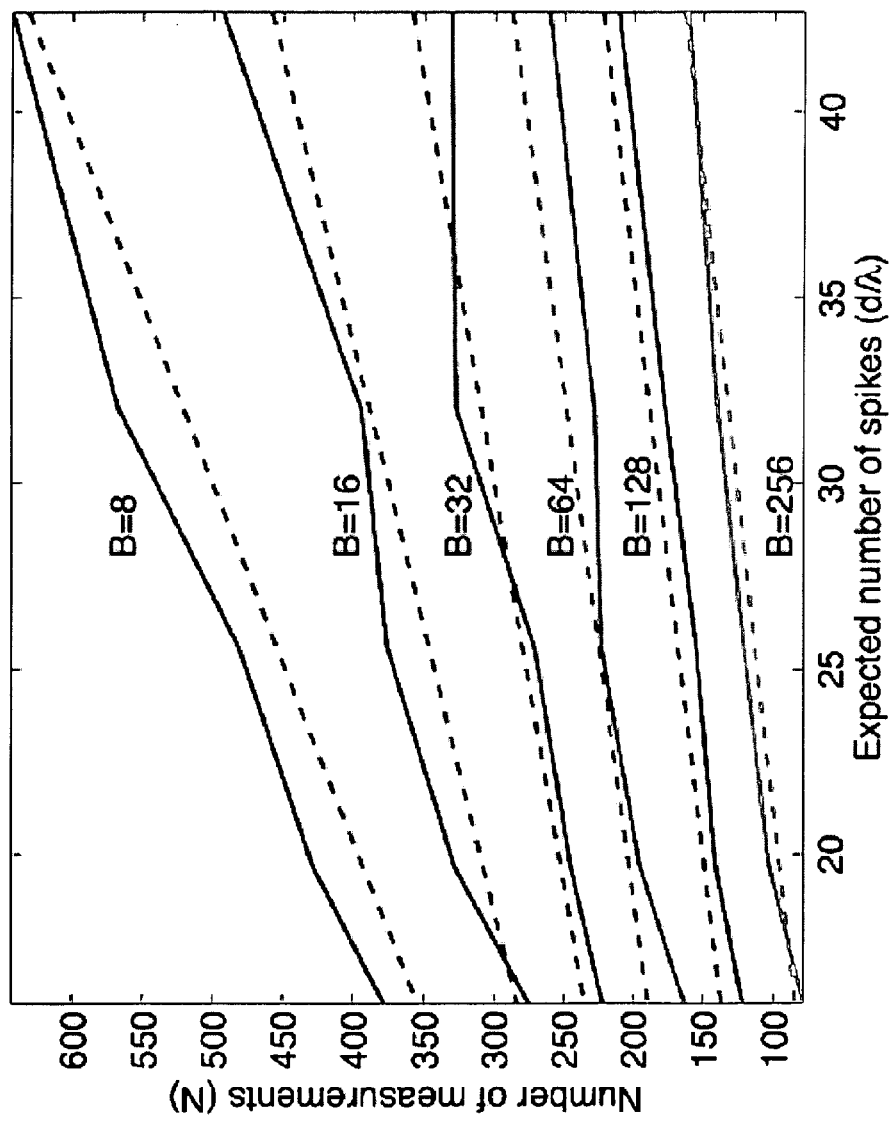

FIG. 7 show results on AIC design 1 for the necessary number of measurements N to achieve 90% probability of reconstruction of a discrete Poisson process as a function of interarrival rate λ for different filter lengths B. The dashed lines mark the trend described by a linear approximation. Signal length d=1024.

Figure 8:
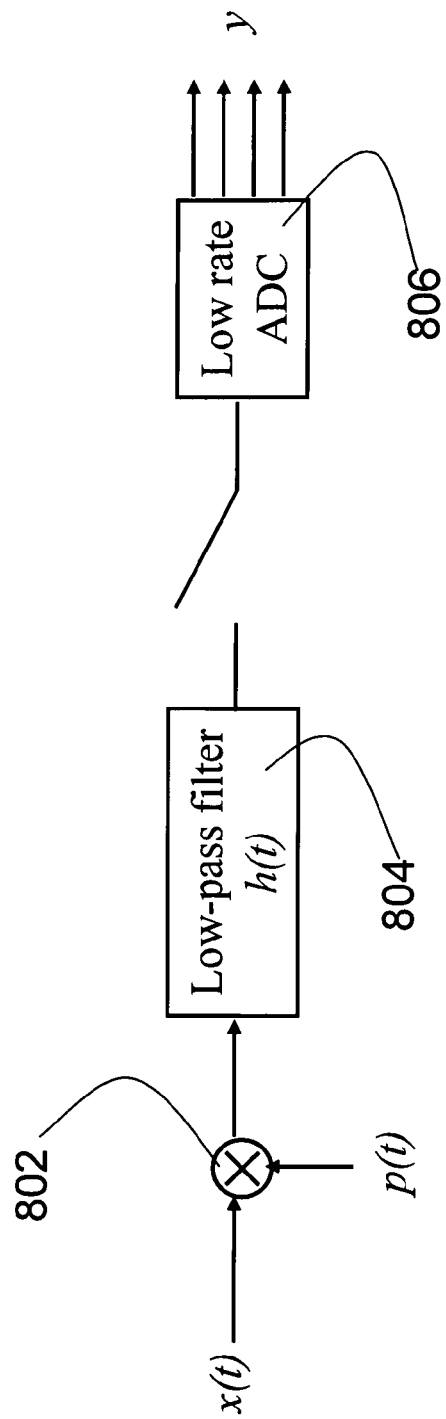

FIG. 8 is a block diagram for AIC design 2. The signal is modulated by a pseudorandom sequence and then passed through an analog low-pass filter before being sampled at a rate proportional to sparsity.

Figure 9:
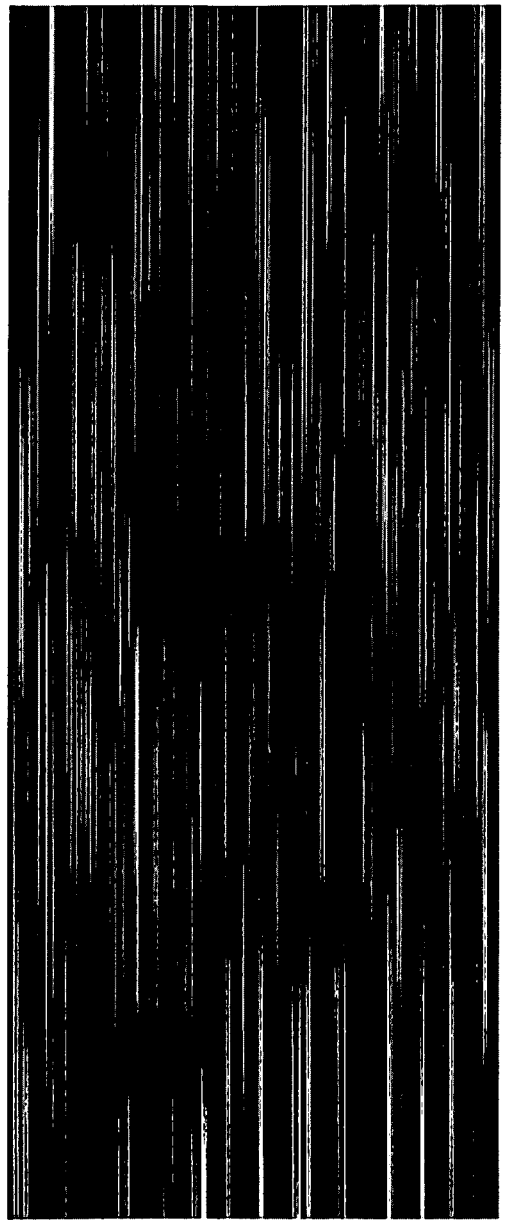
Figure 10A:
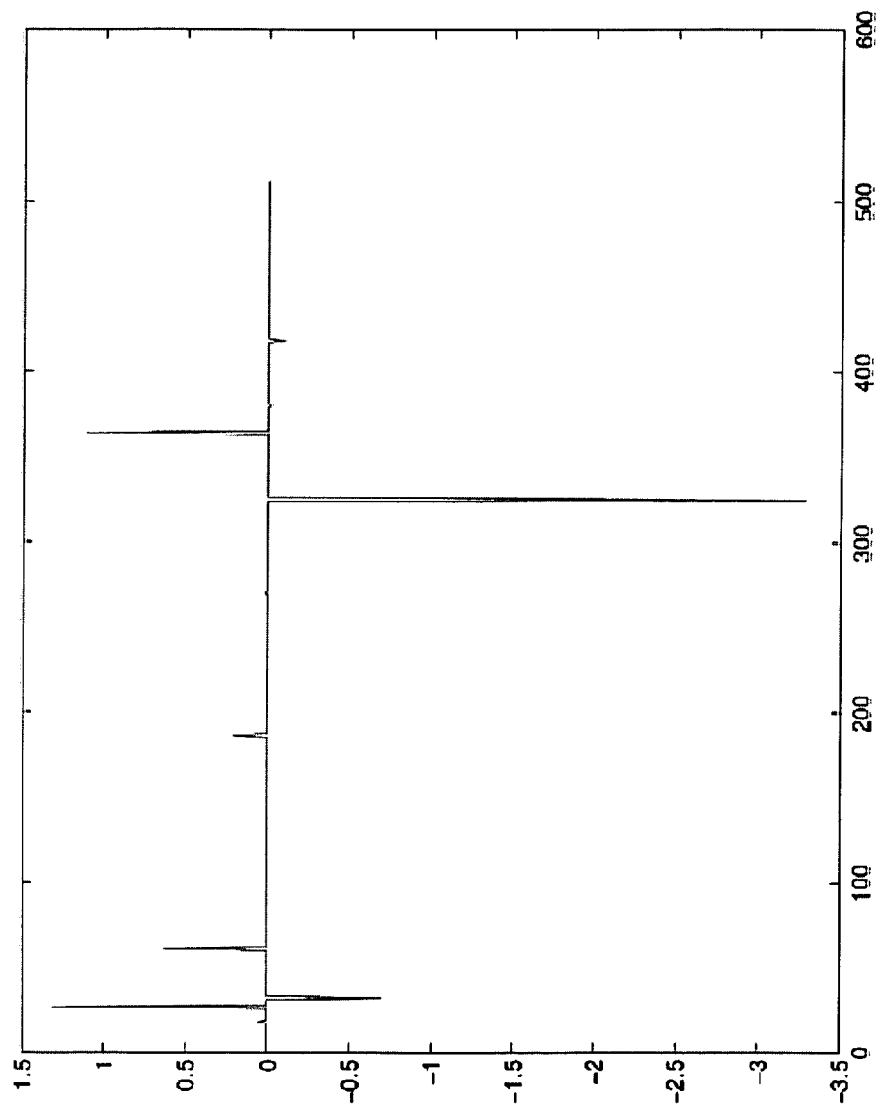
Figure 10B:
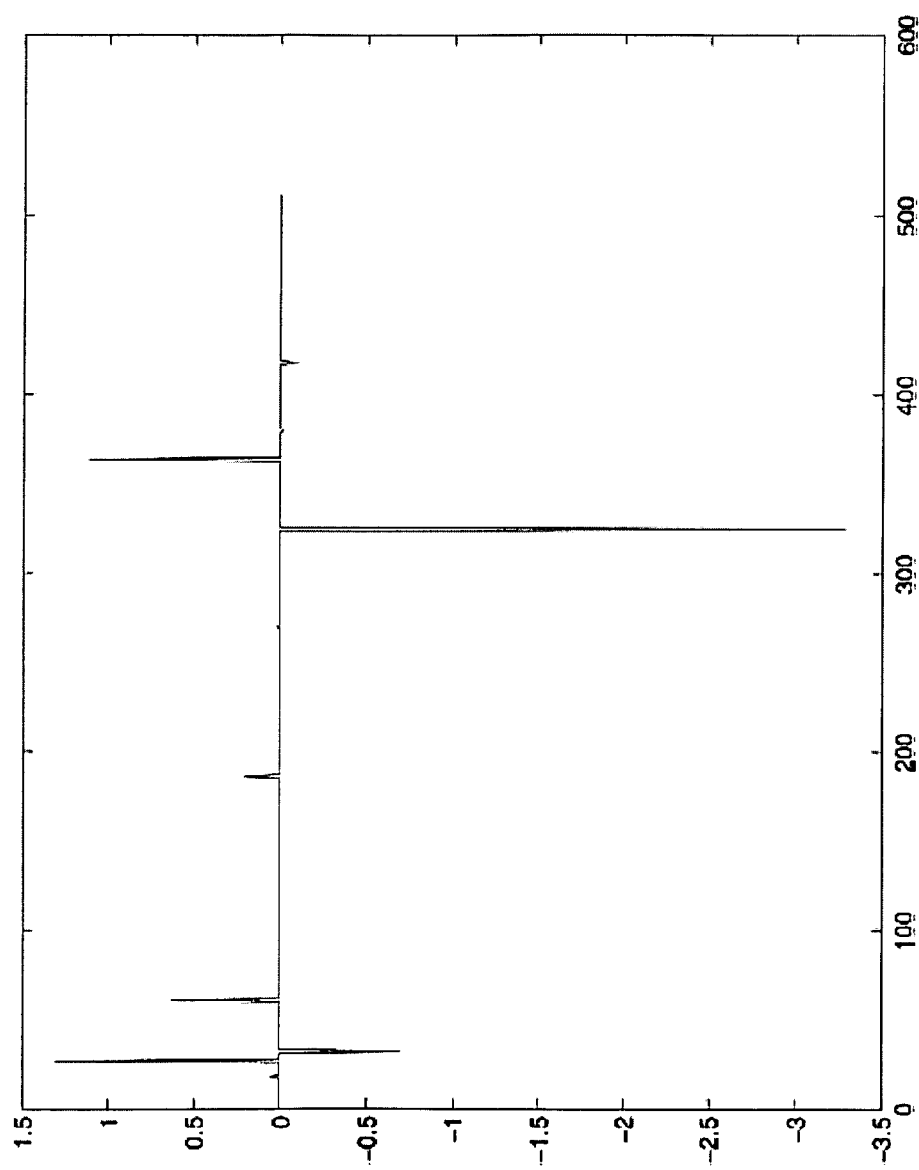
Figure 10C:
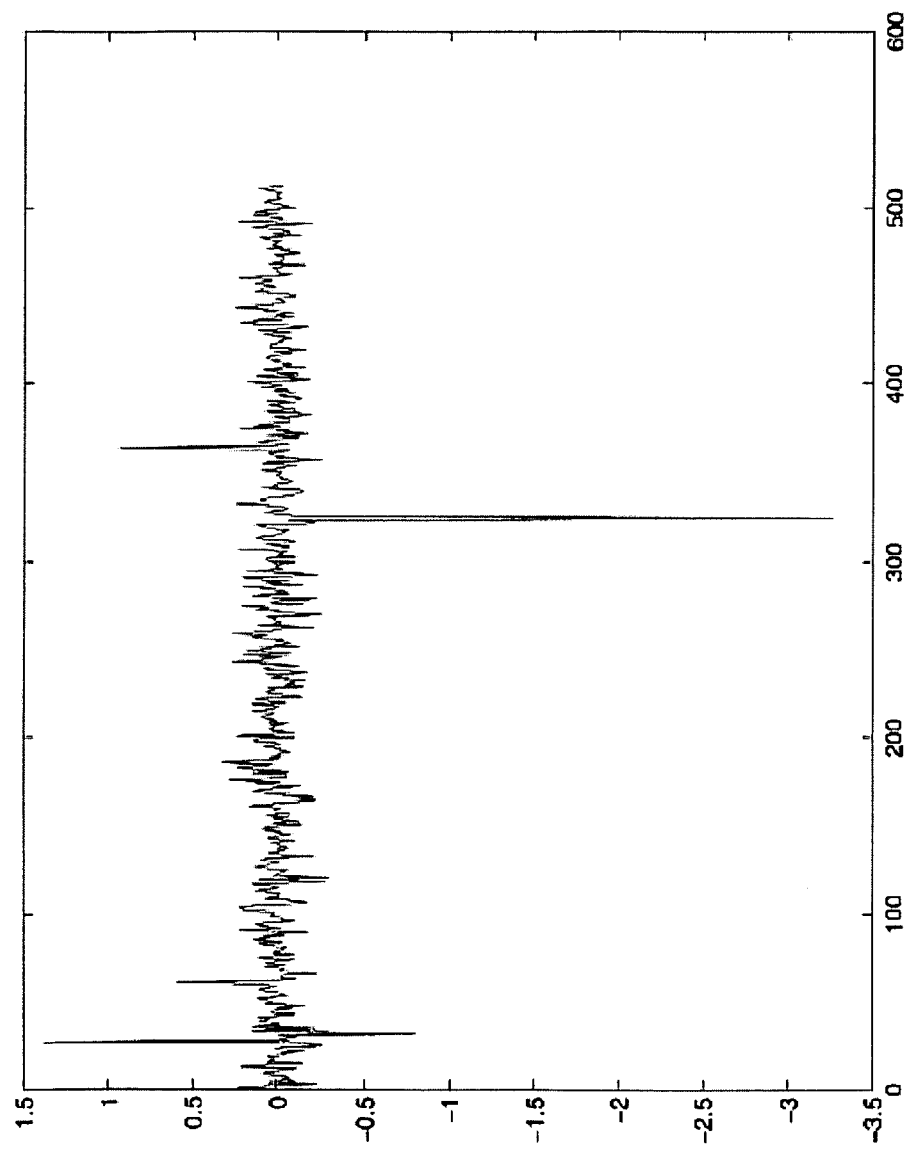
Figure 10D:
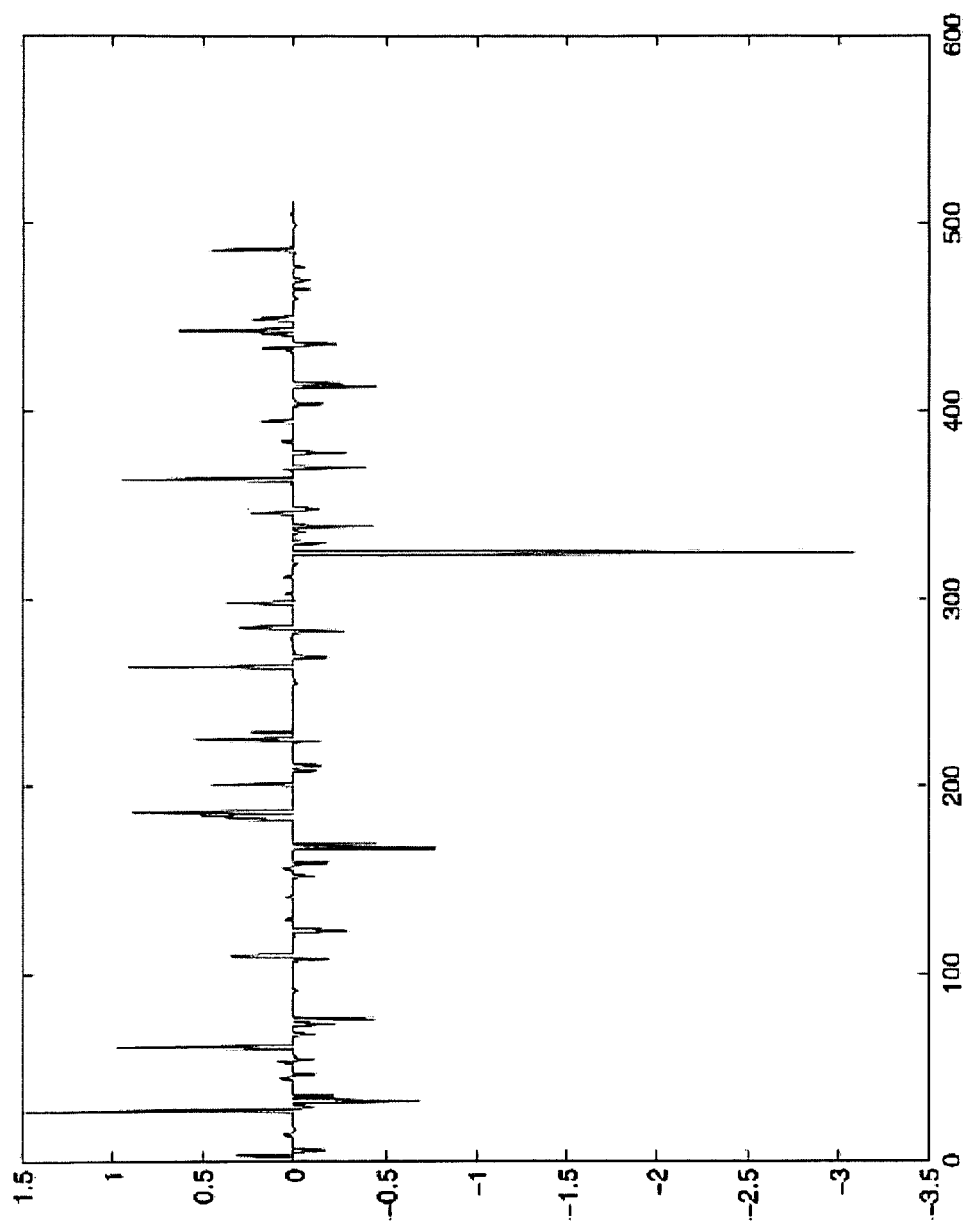
Figure 10E:
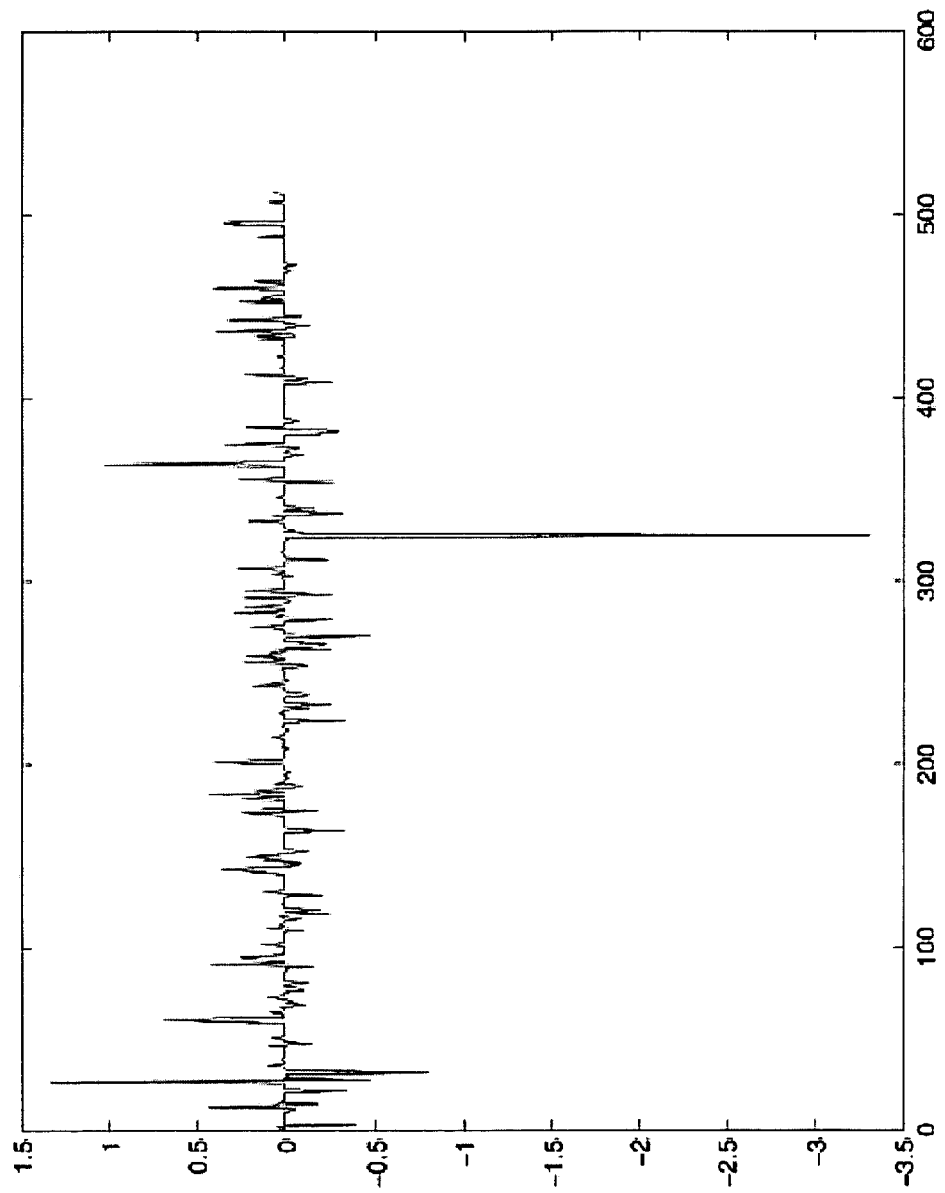

FIG. 9 is an image depicting the magnitude of one realization of the M×N complex matrix Θ for acquiring Fourier-sparse signals under the AIC 2 prototype.

FIG. 10 shows a set of idealized AIC 2 simulations. (a) Original sparse vector α. (b) Reconstructed sparse vector from measurements at 20% of the Nyquist rate. (c) Noisy sparse vector with additive Gaussian noise. (d),(e) Reconstructed sparse vector from measurements at 20% and 40% of the Nyquist rate, respectively.

Figure 11:
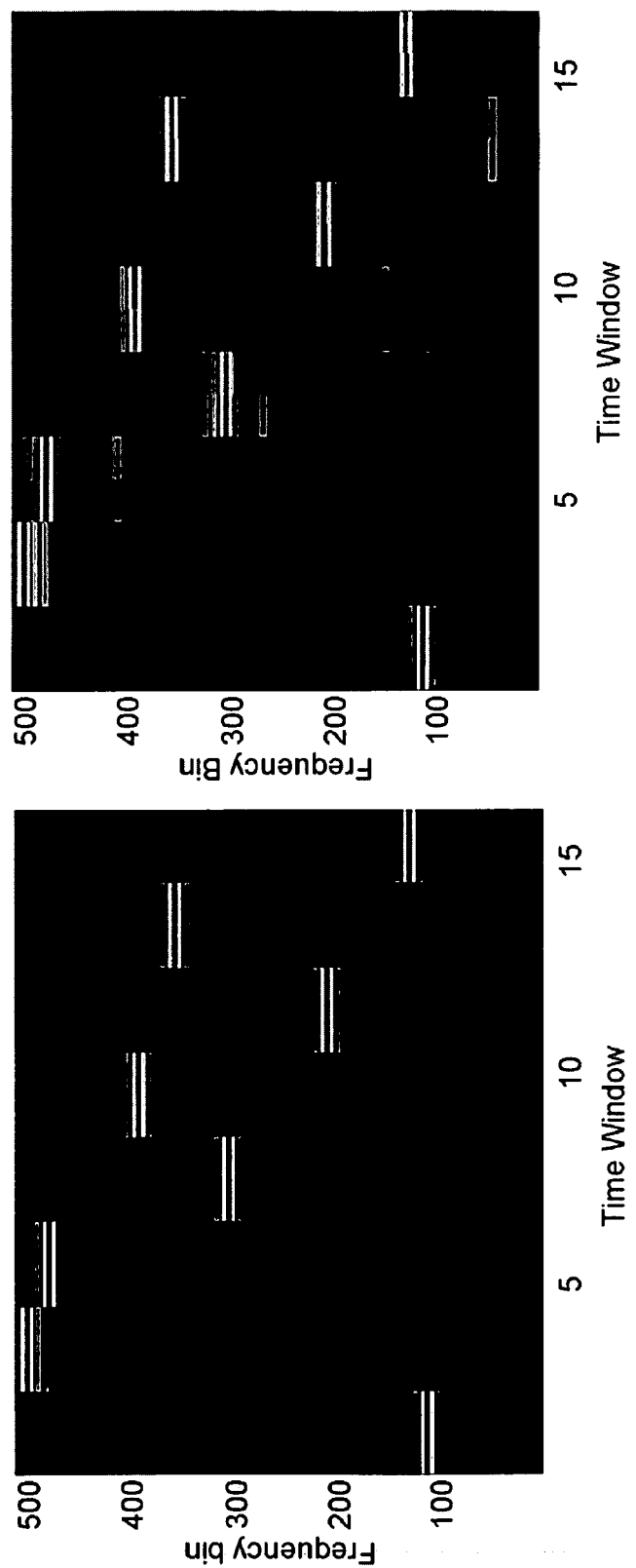

FIG. 11 shows a comparison of Spectrograms obtained from full and CS compressed versions of a frequency hopping signal. The signal is a single side-band AM signal, whose carrier frequency changes periodically over time. (left) Spectrogram from original signal. (right) Spectrogram from CS reconstruction with measurement rate equal to 25% of the Nyquist rate.

Figure 12:
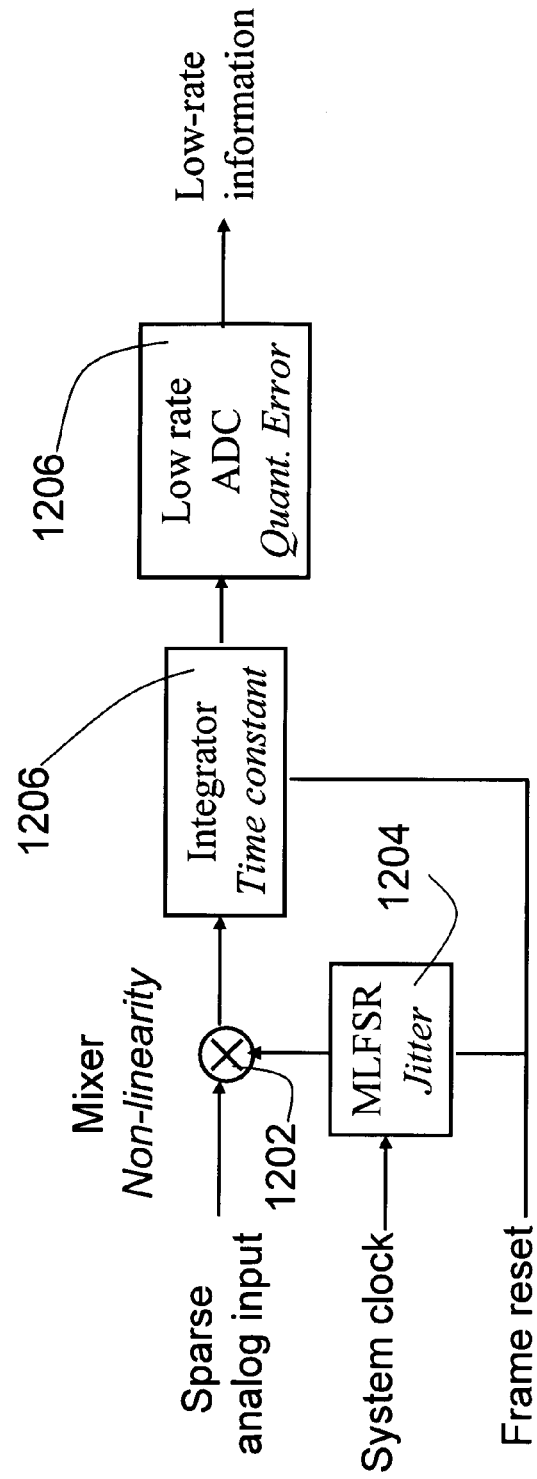

FIG. 12 is a AIC design 2 prototype System Block Diagram.

Figure 13:
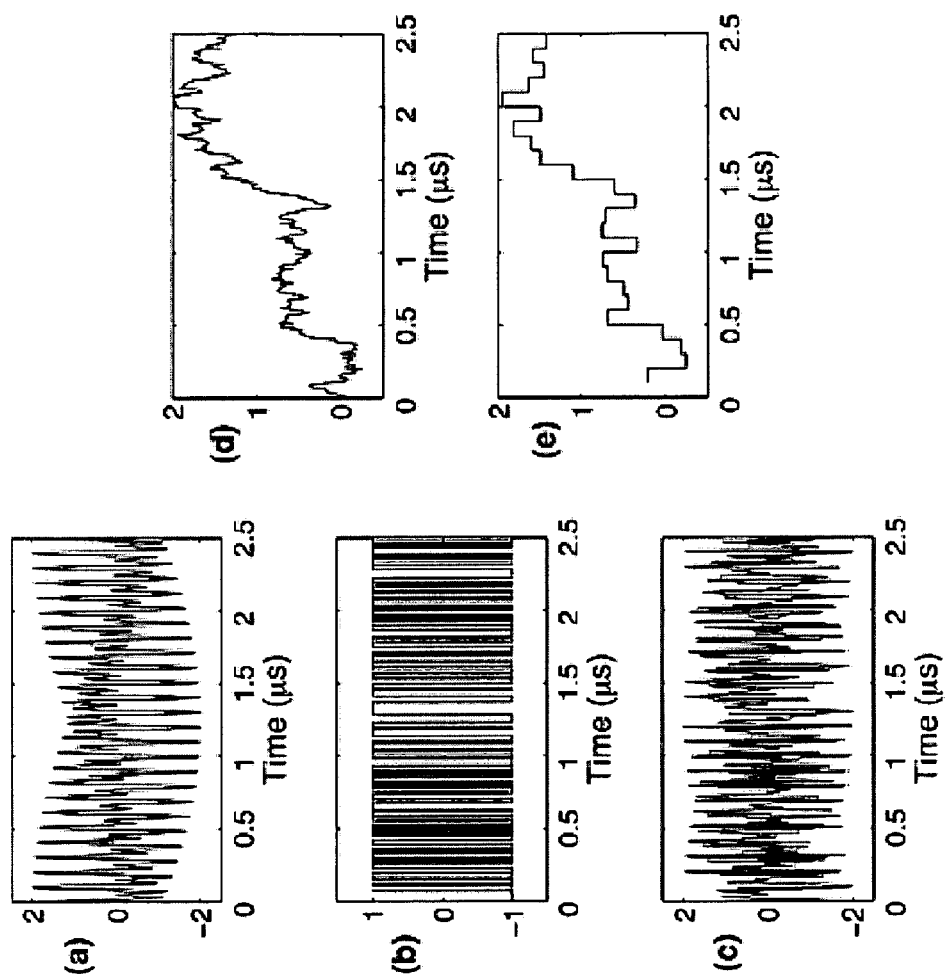

FIG. 13 shows time signals inside the AIC 2 prototype: (a) input signal, (b) pseudo-random chipping sequence, (c) signal after demodulation, (d) signal after the low-pass filter, (e) quantized, low-rate final output.

Figure 14A:
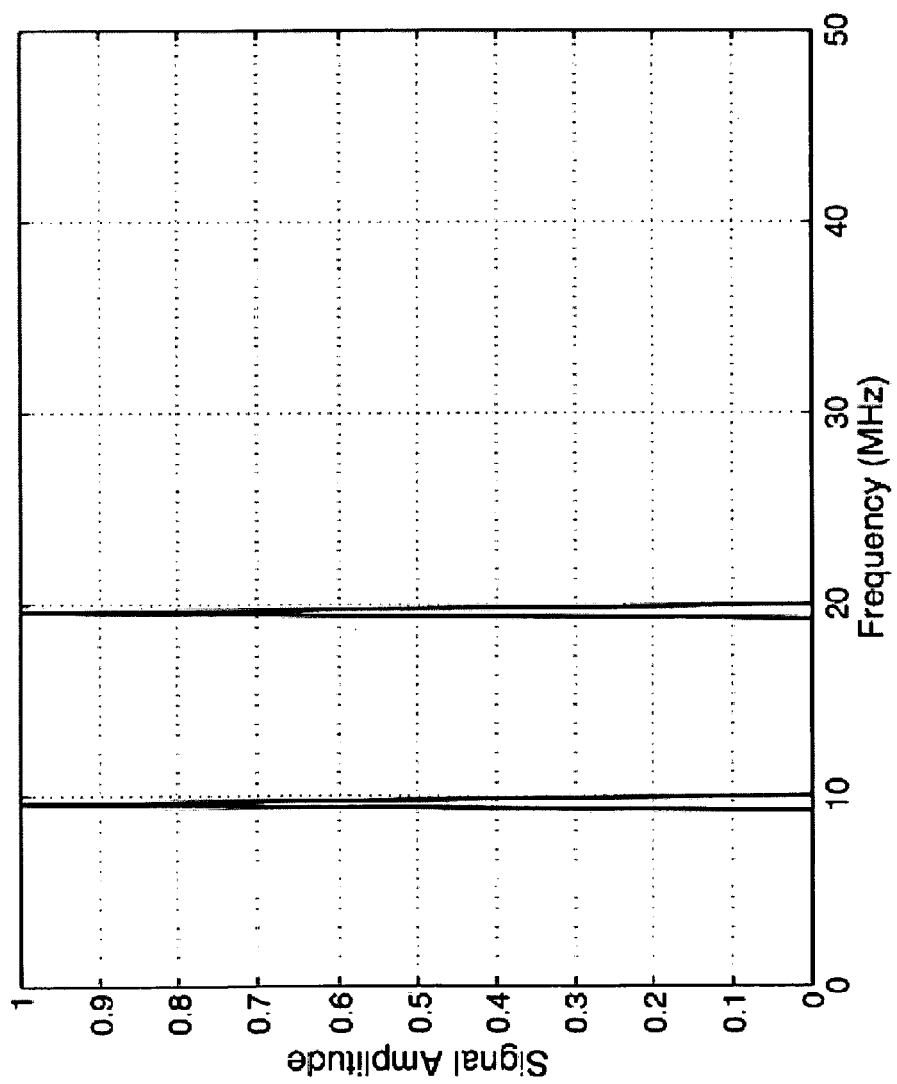
Figure 14B:
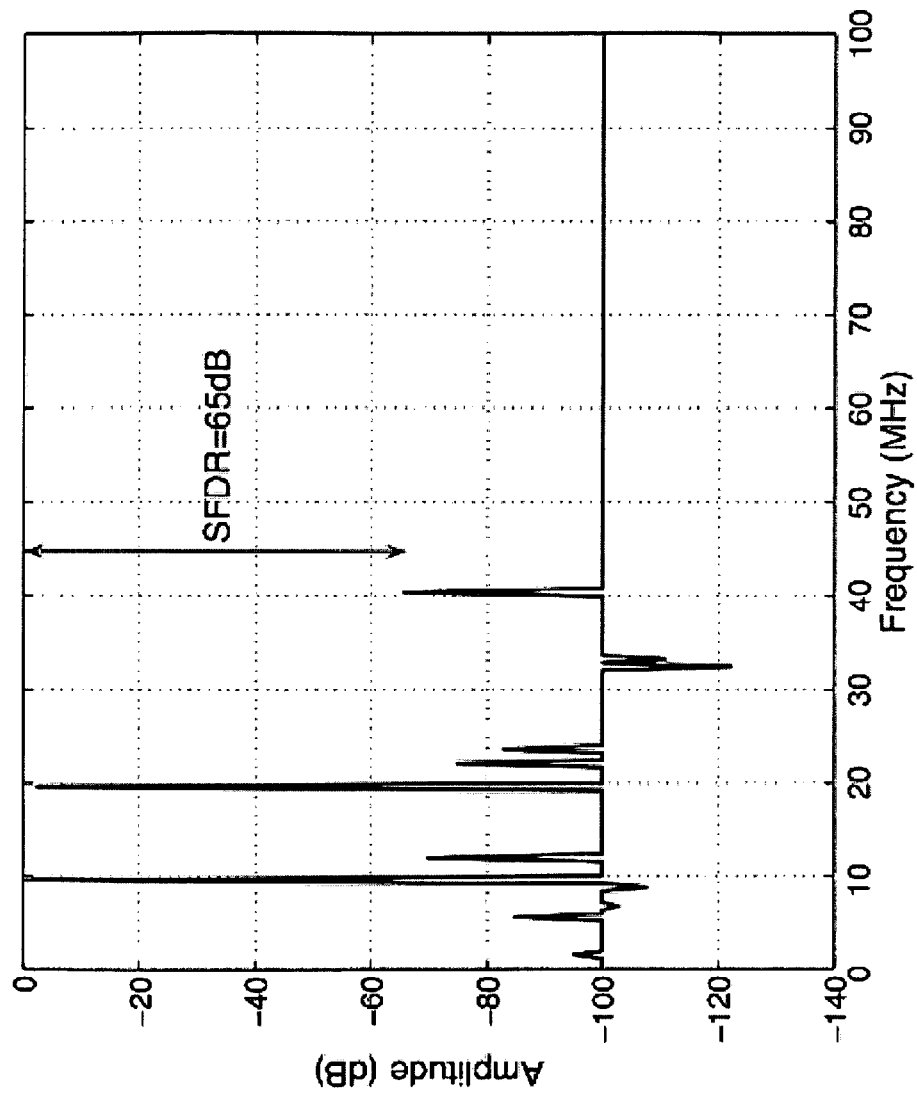
Figure 14C:
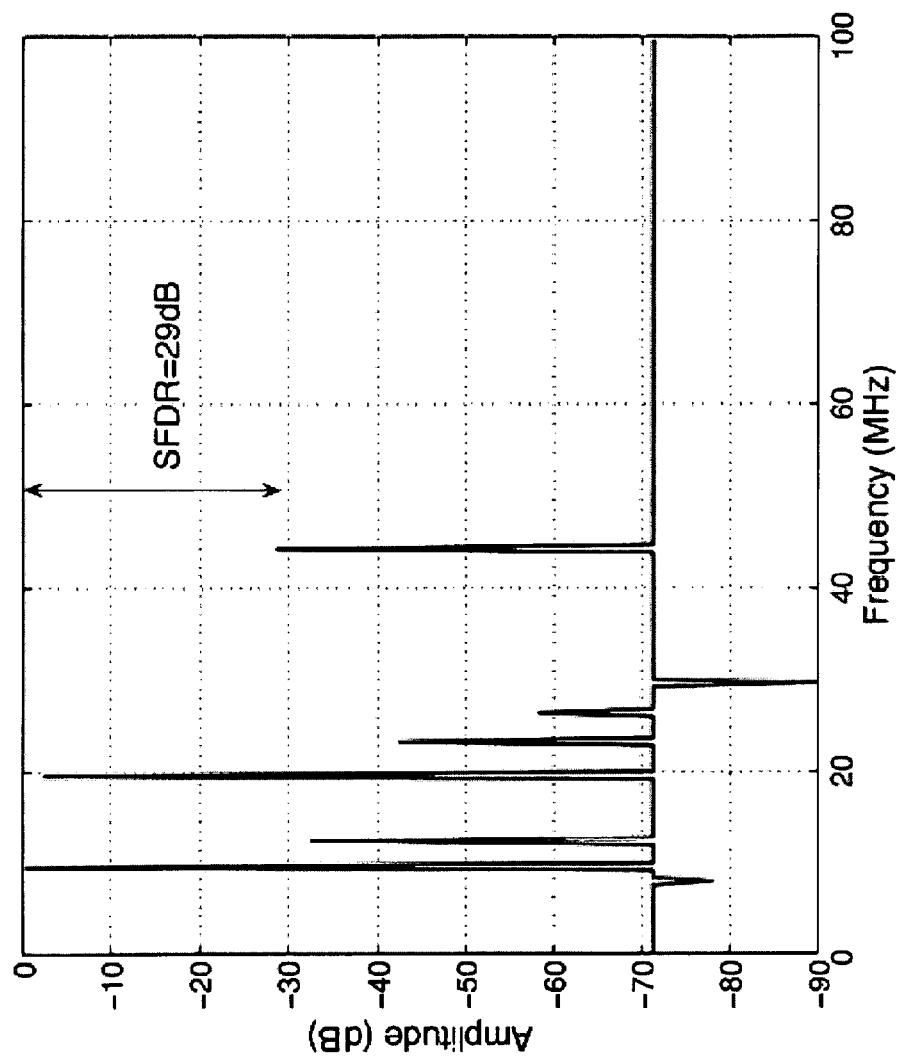
Figure 15:
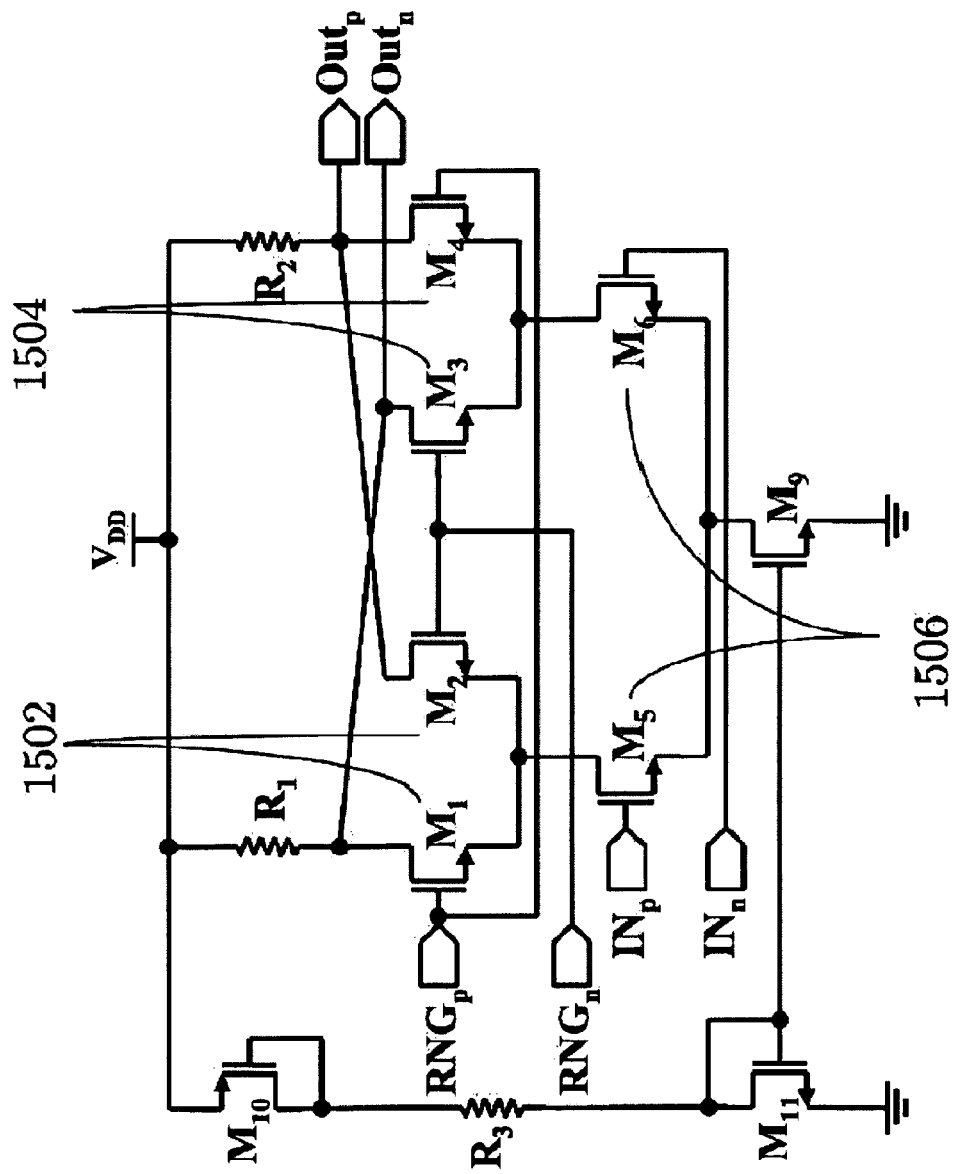

FIG. 14(a)-(c) shows results of a simulation of reconstruction with the AIC design 2 prototype (a) Example two tone input signal at 10 MHz and 20 MHz. (b) SFDR for the dual tone signal measured at 10 MSample/s. (c) SFDR for a dual tone signal measured at 5 MSample/s FIG. 15 shows AIC 2 prototype circuit diagram for the modulator circuit.

Figure 16:
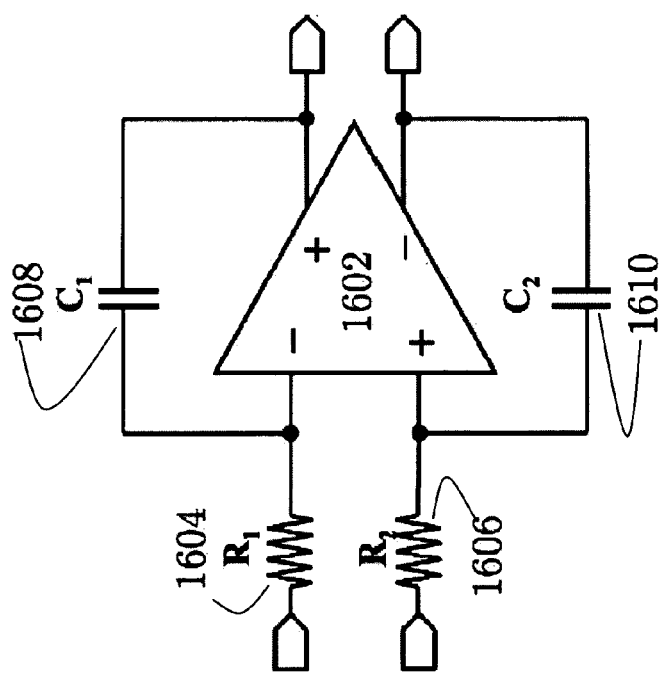
Figure 17B:
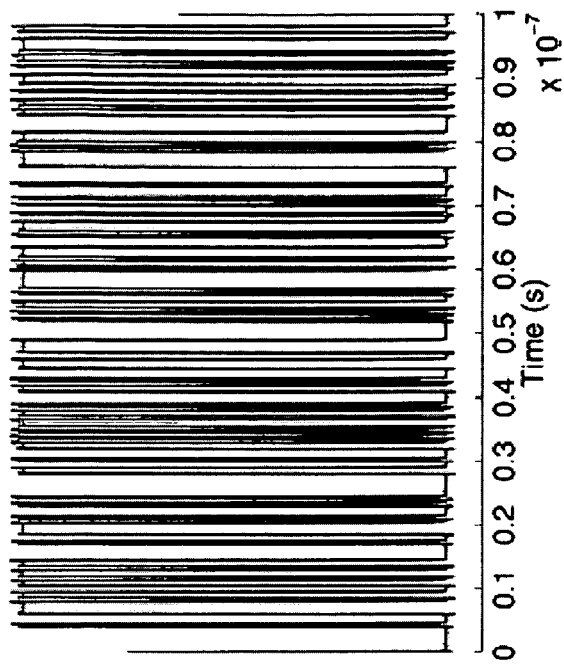
Figure 17A:
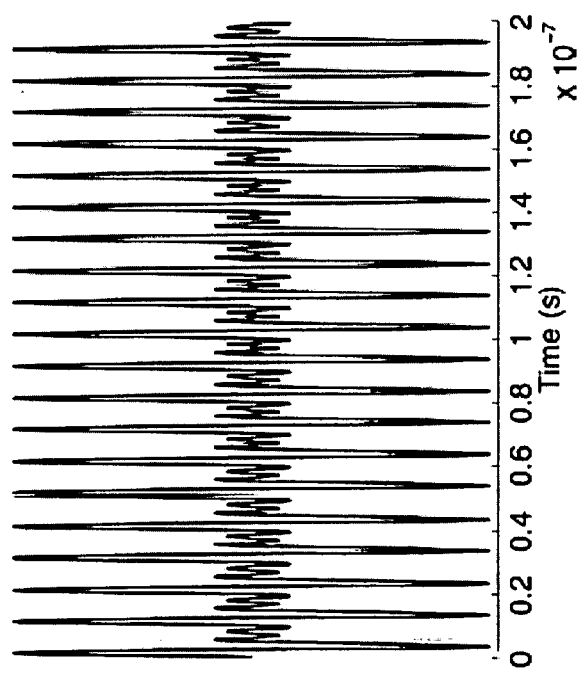
Figure 17D:
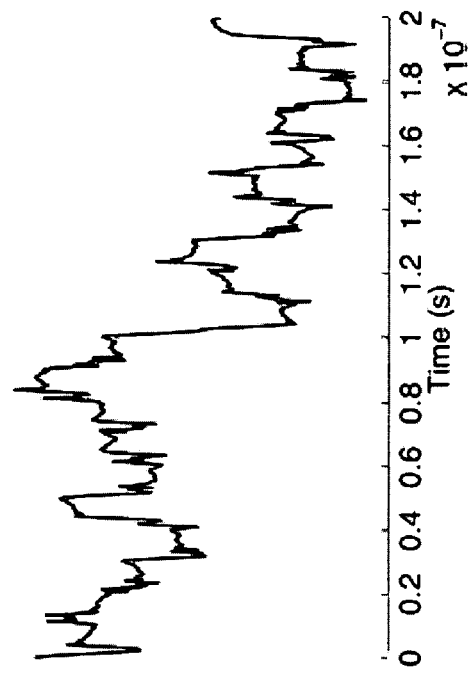
Figure 17C:
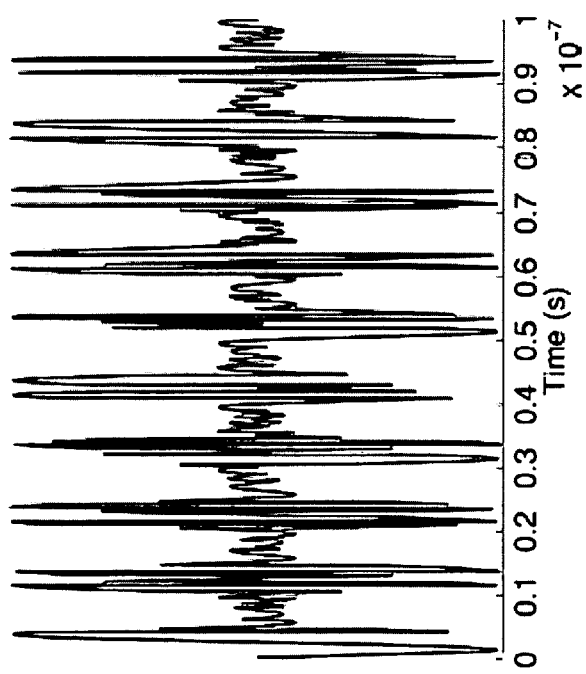
Figure 17F:
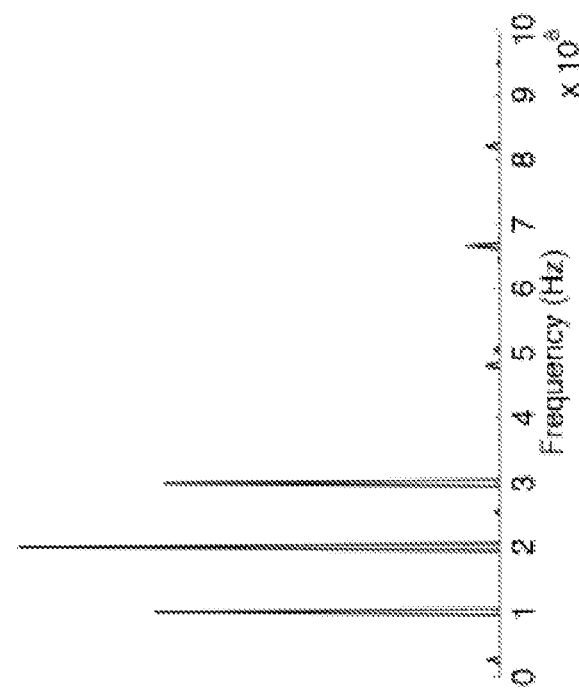
Figure 17E:
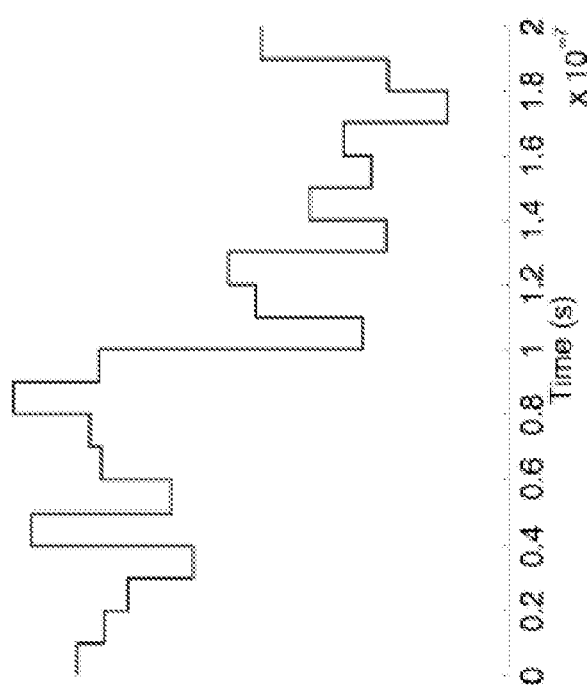

FIG. 16 shows AIC 2 prototype circuit diagram for the Integrator circuit.

FIG. 17(a)-(f) shows AIC 2 prototype HSPICE simulation results for: (a) The input analog compressible signal (b) The pseudo-random square wave generated from the random number generator (c) The multiplication result of both the analog signal and the pseudo-random square wave (d) The integration result of the randomized version from the analog signal (e) The result of the quantization (f) The reconstructed signal in FFT domain.

Figure 18:
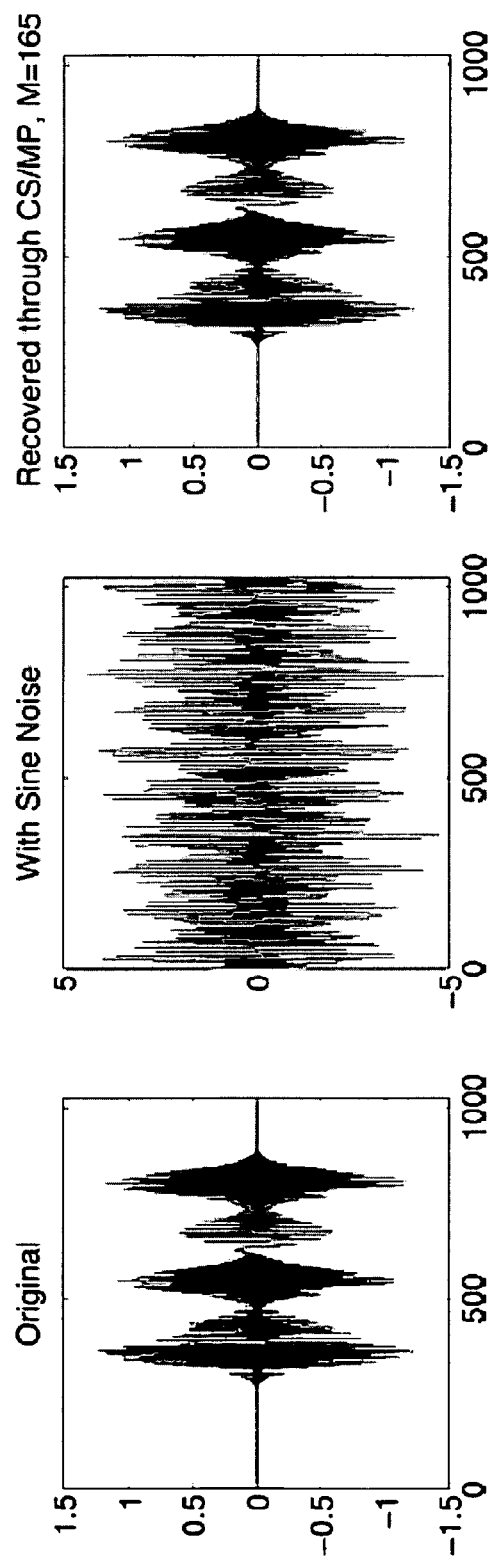

FIG. 18 shows experimental results for chirplet recovery using AIC 1. The left figure shows a chirp signal. The middle figure shows the chirp signal contaminated by sinusoidal jammers. The right figure shows the recovery of chirps from the contaminated signal using CS and M=165 measurements.

Figure 19:
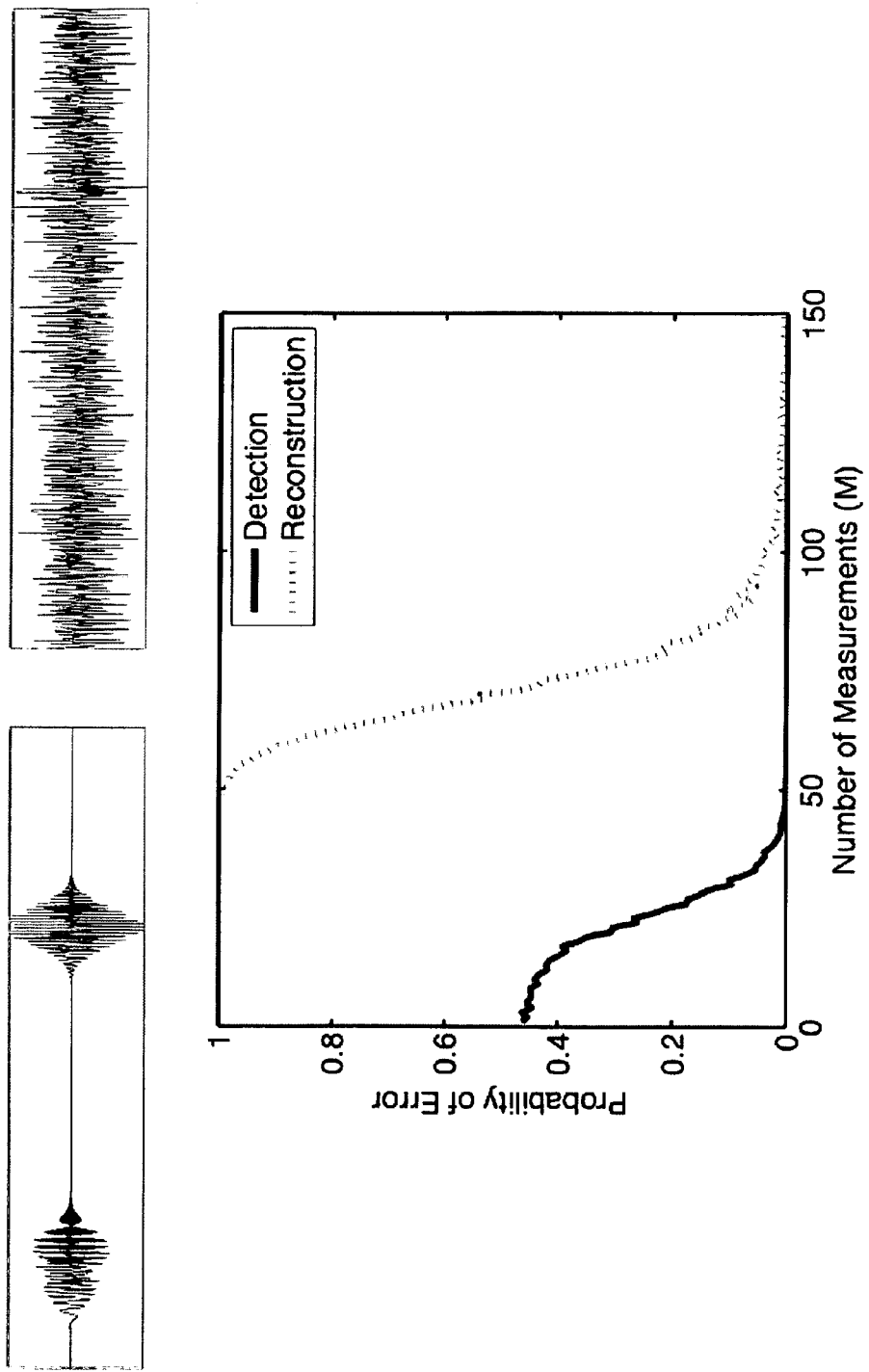

FIG. 19 shows experimental results for signal detection and reconstruction. The top figure shows a sample wideband chirp signal and same chirp embedded in strong narrowband interference. The bottom figure shows the probability of error to reconstruct and detect chirp signals embedded in strong sinusoidal interference (Signal to Interference Ratio SIR=−6 dB) using greedy algorithms. In this case, detection requires ⅓ the number of measurements and ¼ the number of computations necessary for equivalent probability of success with reconstruction.

Figure 20A:
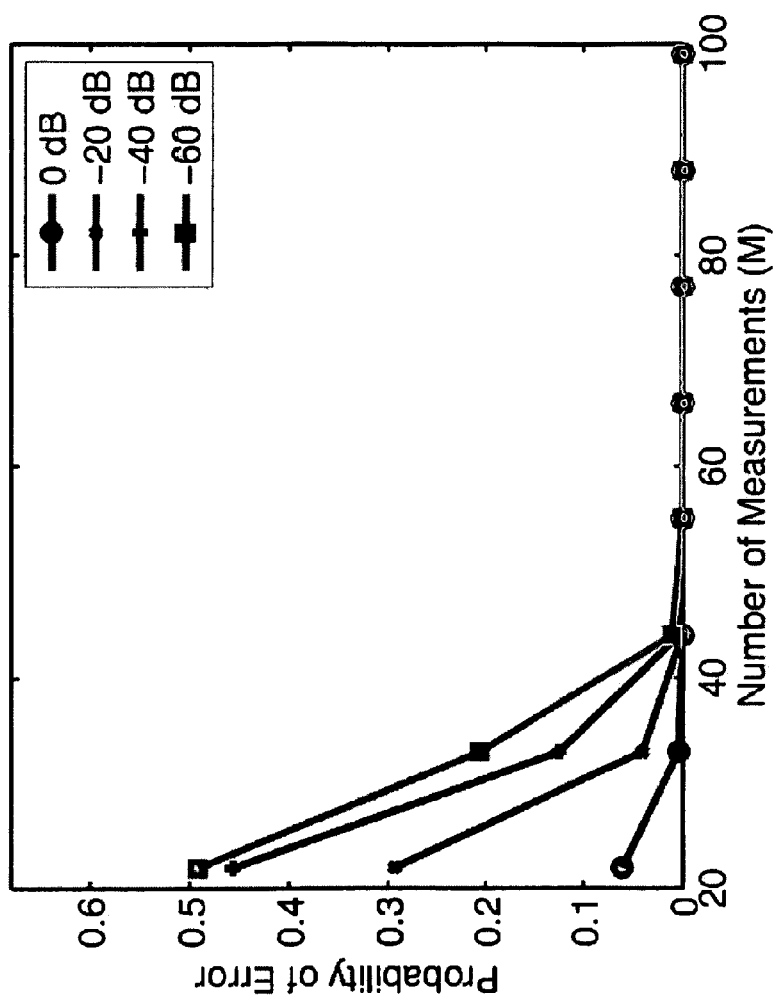
Figure 20B:
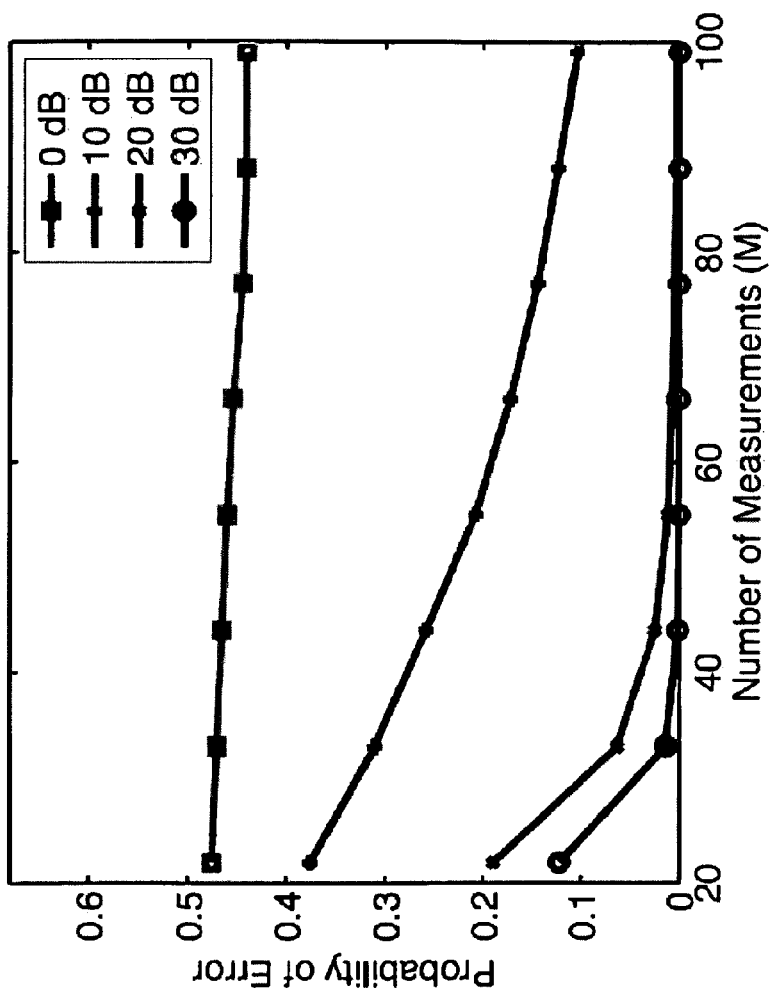
Figure 20C:
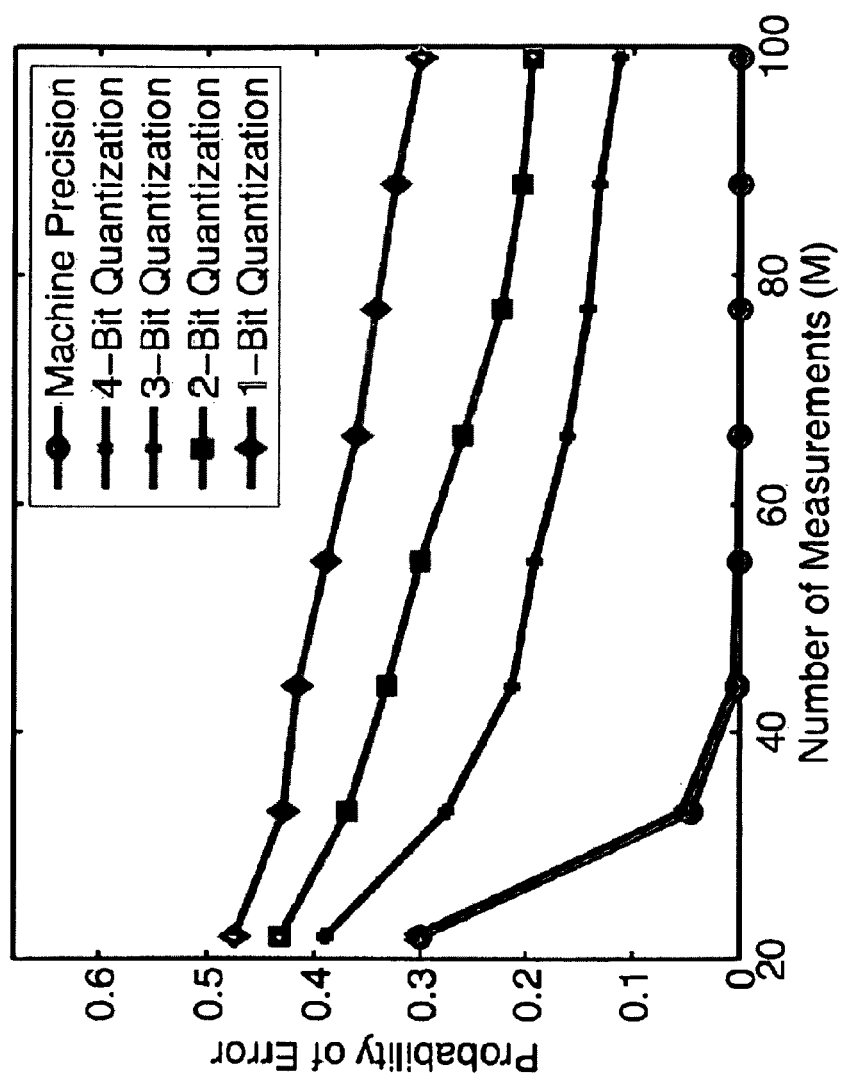

FIG. 20 sows results for experimental performance of wideband chirp detection. (a) Strong narrowband interference; each curve is a different SIR. (b) Narrowband and white noise interference; SIR=−6 dB, and each curve is a different SNR. (c) Effect of measurement quantization at SIR=−20 dB; each curve is a different number of quantization levels. In all cases, detection performance degrades gracefully as the distortion increases.

4 DETAILED DESCRIPTION OF THE PREFERRED EMBODIMENTS 4.1 Introduction to the Preferred Embodiments This section provides some background to better understand the present inventions. Several sparse RF signal models are developed in Section 4.1.1 (note that the illustration with RF signals is easily extendable to any signal that can be sparsely expanded or approximated in some representation, such as videos, images, sounds and other types of signals), an overview of various relevant mathematical techniques is presented in Section 4.1.2, and an introduction to the hardware building blocks for AIC implementation is presented in Section 4.1.3.

4.1.1 RF Signals and Environments

Many RF scenarios are ripe for AIC. The following example models are to be regarded as illustrative in nature, and not as restrictive.

Radar signals include linear-FM chirps (for air-to-ground imaging systems), phase coded waveforms such as Barker codes or PN sequences (for air-to-air systems, see R. H. Barker, "Group Synchronizing of Binary Digital Sequences", *Communication Theory*. London: Butterworth, pp. 273-287, 1953), and frequency hopping (Costas) codes. See F Le Chavalier, "Principles of Radar and Sonar Signal Processing" (2002); N. Levanon and E. Mozeson, "Radar Signals" (2004); and Merrill Skolnik, "Radar Handbook" (1970). The signal is generally pulsed at a fairly low repetition rate (25 kHz, for example) and then modulated up to the HF (3-30 MHz), VHF (30-300 MHz), or UHF (300 MHz-1 GHz) frequency bands. Wideband radars operate up to 3-30 GHz and higher. The radar's range resolution is inversely proportional to the signal bandwidth. With the advance of DSP technologies and algorithms, matched filtering (for pulse compression) and Doppler processing are typically performed digitally, post ADC.

In a typical air-to-air radar environment, the target signal returns are much weaker than the returns from clutter (potentially 90 dB), jammers (potentially 40 dB), entertainment noise (television and radio stations), and background noise. This large dynamic range coupled with the large radar signal bandwidth (for better range resolution) severely stress current ADCs.

Radar scenario 1—Surveillance in entertainment noise: Many signals intelligence tasks involve searching for (low-level) signals in a background of noise and (intentional or unintentional) jamming. An important example is detecting and classifying wideband chirp radar signals in the VHF and UHF frequency bands, which are populated by high powered (MW), narrowband TV and radio signals. TV signals are very inefficient in their bandwidth usage (the carrier contains 90% of the signal energy) and so to a first approximation can be modeled as sinusoids. The low amplitude linear-FM signal can be modeled as $w(t) e^{j\pi ct^2}$, with $w(t)$ a rectangular or other window. Methods to analyze a preliminary AIC design for detecting and approximately reconstructing signals consisting of chirps plus sinusoids and noise are discussed below.

Radar scenario 2—Air-to-air radar processing: Here, the analog signal input to the AIC can be modeled as a linear combination of a few weak pulses from the target (e.g., Barker code pulses) plus many strong pulses from clutter and high white noise due to jamming. The goal is to acquire just the weak target pulses and ignore as much as possible the jamming and noise. Ideally, the AIC approach should yield the same signal-to-noise, -clutter, and jammer ratios and range, doppler, and angle spread as a Nyquist/Shannon-based ADC approach for a range of different targets and clutters, while operating at a much lower sampling rate.

Communication signals include the gamut of FSK, PSK, QAM, CPM, and the myriad other signaling strategies employed in modern cellular, satellite, and point-to-point communication systems. See J. G. Proakis and M. Salehi, *Communication Systems Engineering*, Prentice Hall (1994). Modern signals intelligence requires surveillance of a broad range of potential frequencies of interest, which can span several GHz. Unlike radar systems, which use simple antipodal codes, communication systems use complicated signal constellations that can only be disentangled if the receiver ADC has a small quantization step size.

Communications scenario—Remote surveillance: A representative signals intelligence task is surveilling a large, remote area with an unmanned aerial vehicle (UAV) listening for potential and occasional communication signals, which could occur anywhere in a wide bandwidth. Even if this wide bandwidth could be covered by an ADC, it would output an unprocessable flood of samples. After detection, the UAV should glean additional information about the communication device in use, such as its communication mode, its frequency shift key (FSK) or frequency hopping sequence, it transmission frequency, or its CDMA code (from a library of CDMA codes). Natural performance metrics in this case are the signal detection probability and subsequent modulation scheme classification probability.

4.1.2 Mathematical Techniques

The departure point of the present invention is that classical ADC, based on modeling signals as bandlimited functions and optimal sampling at the Nyquist rate, is too pessimistic for many realistic sensing applications: it drastically overestimates the number of information bits necessary to recover signals in realistic sensing scenarios. The mathematical challenge addressed by the invention is to replace the canonical ADC by a new more realistic sensing model (AIC) and to demonstrate the superiority of this approach.

The mathematical description we envisage follows the classical paradigm of optimal recovery, which we now describe.

Optimal Recovery

The theory of optimal recovery was introduced in the late 1950s and polished to a shine by the mid-1980s. See M. Golomb and H. F Weinberger, "Optimal approximation and error bounds," R. E. Langer, editor, "On Numerical Approximation", pages 117-190, The University of Wisconsin Press (1959); C. A. Michelli and T. J. Rivlin, "A survey of optimal recovery," "Optimal estimation in approximation theory", Plenum Press, (1977); J. F. Traub and H. Wozniakowski, "A general theory of optimal algorithms", Academic Press (1980); and A. Pinkus, "N-widths and optimal recovery," C. de Boor, editor, *Approximation theory*, volume 36 of *Proceedings of Symposia in Applied Mathematics*, American Mathematical Society (1986). The present treatment is based on W. Cheney and W. Light, "A course in approximation theory", Brooks-Cole (2000).

Figure 1:
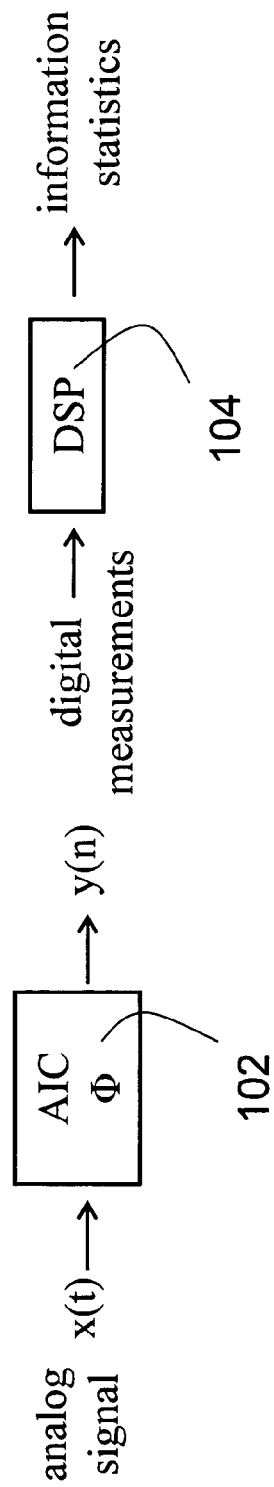
Figure 2:
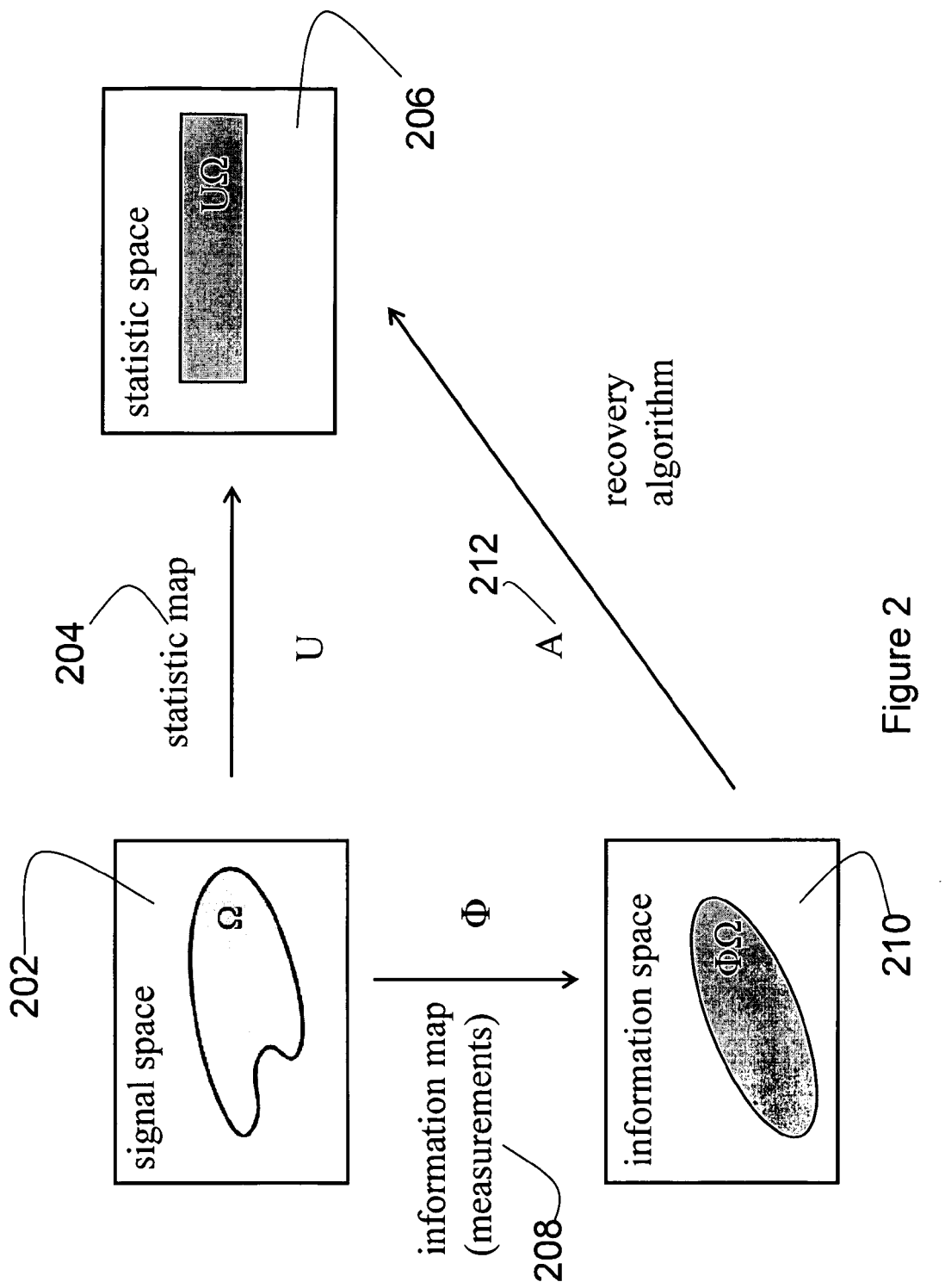
FIG. 2 is a sketch of the mathematical setting for an optimal recovery problem.

As illustrated in FIG. 2, let $\Omega$ be a model for signals of interest, which belong to some ambient signal space 202. Suppose that we are interested in calculating some (possibly nonlinear) statistic Uf 204 of each signal f 206 in $\Omega$. An essential point is that approximating signal statistics may be far easier than recovering the signal completely. We do not have access to the signal itself, but we can obtain some information 210 about the signal via a linear information operator $\Phi$ 208. The goal of the recovery problem is to produce an algorithm A 212 that estimates the statistic Uf from the information $\Phi$f.

If we are concerned primarily with how well the algorithm approximates the statistic per se, we could define the error as $$E(A) = \sup_{f \in \Omega} \|A(\Phi f) - Uf\|$$

where $\|\cdot\|$ is a norm on the statistic space. The intrinsic error in a recovery problem is defined as $$E_* = \inf_A E(A),$$

the minimal error attainable by any algorithm, computable or not. The intrinsic error is a fundamental mathematical bound on how well an algorithm can perform. An algorithm that attains the intrinsic error is called optimal.

Many of the basic concerns of the AIC can be described succinctly in this framework. The problem domain leads to a signal model $\Omega$ and to a relevant set of statistics U. Technological and economic limits on the analog sampling hardware constrain which information operators $\Phi$ are practicable, including the type and number of measurements. The algorithms A that can be used to approximate the signal statistics are restricted by the computational resources available, such as time and storage. The goal then is to design an information operator and an algorithm that are technologically feasible and still yield an error as small as possible.

Optimal Recovery of Sparse and Compressible Signals: Existing Theory

In the following discussion, we address the signal space properties, the information map properties, the statistics maps, and the recovery algorithms in detail.

Signal space models and sparsity: Sparsity is a fundamental feature of signals in many problem domains, with important implications for modeling signals, for constructing information operators, and for designing algorithms. Here is an informal definition. Let $\Psi=\{\psi_1, \psi_2, \ldots\}$ be an orthonormal system, and suppose that x is a signal. If x is well approximated by a short linear combination of vectors from $\Psi$, then we say that x is sparse with respect to $\Psi$. That is, $$x \approx \sum_{i=1}^{K} \alpha_{m_i} \Psi_{m_i}$$

where K is small. The concept of sparsity can also be extended from bases to dictionaries, which are general systems of vectors. See S. Mallat, A Wavelet Tour of Signal Processing, Academic Press, San Diego, Calif., USA (1999). An extension of sparsity concept that this theory covers as well is compressibility: a signal is compressible if it can be closely approximated in some metric by a sparse signal. Another notion closely related to sparsity (the innovation rate of a signal) has also been proposed; signals having a finite rate of innovation can be characterized using few degrees of freedom per unit time.

Sparse signals contain relatively little information in comparison with their bandwidth. Therefore, it is possible to approximate them from a small amount of data. In terms of optimal recovery, we expect that the rank of the information operator $\Phi$ can be small in comparison with the linear space dimension of the signal class.

It is common for sparsity to arise in RF settings. Entertainment signals may be approximable with a few high-energy sinusoids. Radar signals are carefully crafted as chirps or codes; target, clutter, and jammer returns could thus be sparse in certain bases (e.g., chirplets or codebased Weyl-Heisenberg frames). See R. G. Baraniuk and D. L. Jones, "Shear madness: new orthogonal bases and frames using chirp functions," *IEEE Trans. Signal Processing*, 41; R. G. Baraniuk and D. L. Jones, "Wigner-based formulation of the chirplet transform. *IEEE Trans. Signal Processing,* 44(12); and S. D. Howard, A. R. Calderbank, W. Moran, H. A. Schmitt, and C. O. Savage, "Relationships Between Radar Ambiguity and Coding Theory," *Proceedings of IEEE Intl. Conference on Acoustics, Speech, and Signal Processing (ICASSP 2005),* 2005. Communication signals are likewise carefully crafted and sport even more inner structure (e.g., an FSK signal is merely a sinusoid at any given instant). One of the goals of this study is to identify sparse models for signals in many domains of interest.

When sparsity is present, it can be exploited in many different ways. First, a sparse signal can be expressed efficiently in the basis of sparsity, which is a form of compression. A second advantage is that sparse approximation is an effective method of de-noising because noise is not compressible. See B. K. Natarajan, "Filtering random noise from deterministic signals via data compression," *IEEE Trans. Signal Processing,* 43(11):2595-2605, November 1995; and K. Fletcher, S. Rangan, V. K. Goyal and K. Ramchandran, "Denoising by sparse approximation: error bounds based on rate-distortion theory," *EURASIP J. Signal Processing,* 2005. Another significant consequence is that sparsity constraints can be used to regularize inverse problems that arise in signal processing. For example, sparsity constraints are frequently used in geophysics to improve deconvolution. See J. F Claerbout and E Muir, "Robust modeling of erratic data," *Geophysics,* 38(5): 826-844, October 1973; H. L. Taylor, S. C. Banks, and J. F. McCoy. "Deconvolution with the $l_1$ norm," *Geophysics,* 44(1):39-52, 1979; S. Levy and P. K. Fullagar, "Reconstruction of a sparse spike train from a portion of its spectrum and application to high-resolution deconvolution," *Geophysics,* 46(9):1235-1243, 1981; D. W. Oldenburg, T. Scheuer, and S. Levy, "Recovery of the acoustic impedance from reflection Seismograms," *Geophysics,* 48:1318-1337, 1983; and F. Santosa and W. W. Symes, "Linear inversion of band-limited reflection seismograms," *SIAM J. Sci. Stat. Comput.,* 7(4): 1307-1330, 1986.

Information maps: One foundation of this patent is the that signal statistics can be reconstructed from limited information. Furthermore, we can quantify the amount of information necessary to reconstruct the statistics in terms of the sparsity of the signal. We call this the Compressed Sensing Principle although we stress that we sometimes aim only to recover signal statistics, not the original signal itself. We call out this fundamental idea.

The Compressed Sensing Principle

Sparse Signal Statistics can be Approximately Recovered Given a Small Number of Nonadaptive Linear Measurements Here is a concrete example of the CS Principle where the goal is to reconstruct the signal exactly. Note first that signals in the $l_p^N$ unit ball with $0<p\leq 1$ are well approximated by signals with a small number of nonzero coefficients. More precisely, if $\|x\|_p \leq 1$, then its best K-term approximation $x_K$ satisfies $\|x-x_K\|_2 = O(K^{1/2-1/p})$.

A significant revelation in the CS theory is that it is possible to construct an M×N measurement matrix $\Phi$, where M<<N, yet the measurements y=$\Phi$x preserve the essential information about x. For example, if $\Phi$ is a K log(N)×N matrix with identical and independently distributed (i.i.d.) Gaussian entries, then it is possible, with high probability, to approximate every signal in the $l_p$ unit ball, given its image under $\Phi$. That is, the intrinsic error associated with this information operator satisfies $E_* = O(K^{1/2-1/p})$. Moreover, there are tractable algorithms that achieve not more than twice the intrinsic error. More generally, the important properties of the measurement matrix $\Phi$ have been characterized; one consideration is that $\Phi$ be incoherent with the sparsity basis $\Psi$—that is, rows of $\Phi$ should not be sparsely representable in $\Psi$. Specific measurement matrices have been proposed for certain bases $\Psi$; however a useful fact is that a randomly generated $\Phi$ is incoherent (with high probability) against any fixed $\Psi$. That is, $\Phi$ is nearly orthogonal to any fixed $\Psi$.

The CS principle has many precedents. Combinatorial group testing is just one example of such a precedent. See D.-Z. Du and E K. Hwang, "Combinatorial Group Testing and Its Applications", World Scientific, River Edge, N.J., 1993. Group testing assumes that we have a large collection of items, a small number of which are defective or represent the information present in this large collection. We want to find these items with as few tests as possible. Group testing is a combinatorial design problem which strives to design these tests so as to minimize the number we must compute. A number of high dimensional computational geometry algorithms and streaming algorithms construct information maps or embeddings from one metric space to another of much lower dimension in order to extract signal statistics such as $l_1$ norms or to answer nearest neighbor queries efficiently. See P. Indyk, "Stable distributions, pseudorandom generators, embeddings and data stream computation," *Proceedings of IEEE Symposium on Foundations of Computer Science (FOCS 2000),* pages 189-197, 2000; P. Indyk, *High-Dimensional Computational Geometry,* PhD thesis, Stanford, 2000; and E. Kushilevitz, R. Ostrovsky, and Y Rabani, "Efficient search for approximate nearest neighbor in high-dimensional spaces," *Proceedings of the Thirtieth Annual ACM Symposium on Theory of Computing,* pages 614-623, ACM Press, 1998. All of these precedents emphasize the number of measurements or the size of the information map necessary to reconstruct signal statistics, in addition to other resource constraints. The constructions are varied, from deterministic to random (including pseudorandom).

Signal recovery algorithms: The CS principle is the mathematical foundation for streaming algorithms, but the algorithms contain many innovations that answer how to apply the information operator and how to use the measurements extremely efficiently. There are several types of algorithms for approximately recovering the signal statistics. The approaches are sketched below.

Signal recovery via $l_1$ minimization: Most of the mathematics literature on CS has concentrated on optimization-based methods for signal recovery, especially $l_1$ minimization. Suppose that x is sparse with respect to $\Psi$, and let y=$\Phi_x$ be the set of measurements of x. This approach seeks a set of sparse coefficients $\hat{\alpha}$ by solving $\alpha$=arg min $\|\alpha\|_1$ subject to $\Phi\Psi\alpha$=y. This problem can be solved in polynomial time with standard software. See S. Boyd and L. Vanderberghe, *Convex Optimization,* Cambridge Univ. Press, 2004. Optimization based algorithms are slow, and they output signals with the same size as the original signal, which may be inappropriate for a number of applications. Fortunately, there are other approaches to signal recovery.

Signal recovery via greedy pursuit: Greedy pursuit methods, such as Matching Pursuit (MP) and Orthogonal Matching Pursuit (OMP), build up a signal approximation iteratively by making locally optimal decisions. It has been demonstrated experimentally and theoretically that greedy algorithms can recover sparse signals from incoherent measurements. See, for example, D. Baron, M. B. Wakin, S.

Sarvotham, M. F Duarte, and R. G. Baraniuk, "Distributed compressed sensing," 2005, Preprint; M. B. Wakin, S. Sarvotham, M. F Duarte, D. Baron, and R. G. Baraniuk, "Recovery of jointly sparse signals from few random projections," *Proceedings of Neural Information Processing Systems (NIPS)*, 2005; J. Tropp and A. C. Gilbert, "Signal recovery from partial information via orthogonal matching pursuit," April 2005, Preprint; and M. E Duarte, M. B. Wakin, and R. G. Baraniuk, "Fast reconstruction of piecewise smooth signals from random projections, 2005, Online Proc. SPARS Workshop, Rennes, France, November 2005.

Greedy algorithms have several important advantages over optimization-based approaches to sparse approximation. (i) The algorithms can be halted after few steps, so they form approximations that are genuinely sparse. Computational costs are proportional to the sparsity level. (ii) When the signal contains components of disparate magnitudes, as in some radar problems, greedy methods often outperform optimization-based methods. (iii) Greedy methods require a minimal amount of linear algebra. Typically, they involve only inner products and least squares. Moreover, they can sometimes be implemented without forming large vectors or matrices. There is also potential for fast implementations for structured information operators. (iv) Greedy algorithms can be useful in cases where optimization-based algorithms are impossible. For example, they apply when the sparsity basis is continuously indexed. (v) Greedy algorithms can exploit additional information to restrict the search in the dictionary and realize significant computational savings.

Streaming algorithms: Streaming algorithms respond to the challenge of performing sophisticated analysis on high volumes of data in real-time. Their hallmark is their extremely limited use of computational resources. If N is the length of the signal domain that streams past, the processing time for each item in the stream, the total storage, and the time to compute the function at any point in the stream are simultaneously polylog(N). In other words, these algorithms use not only relatively few measurements (i.e., storage space), but also little time to compute stream statistics and to process updates to signals. These qualities are critical for AIC applications. The heart of their recovery algorithms are iterative, greedy algorithms that are similar, but not necessarily the same as Matching Pursuit and Orthogonal Matching Pursuit; see A. C. Gilbert, S. Guha, P. Indyk, Y Kotidis, S. Muthukrishnan, and M. Strauss, "Fast, small-space algorithms for approximate histogram maintenance," *ACMSTOC'02 Proceedings*, 2002.

Additional Algorithms: Additional algorithms exist for sparse approximations of signals in the presence of noise, including Basis Pursuit with Denoising (see S. Chen, D. Donoho, and M. Saunders, "Atomic decomposition by basis pursuit", *SIAM Journal on Scientific Computing*, Vol. 20, No. 1, Pages 33-61, 1998), Dantzig Selector (see E. Candès and T. Tao, "The Dantzig selector: statistical estimation when p is much larger than n", Preprint, 2005), Complexity-Regularization (see J. Haupt and R. Nowak, "Signal reconstruction from noisy random projections", Preprint, 2004), and Lasso (see R. Tibshirani, "Regression shrinkage and selection via the lasso", *J. Royal. Statist. Soc B.*, Vol. 58, No. 1, 1996, pages 267-288). Other algorithms have been proposed for particular measurement schemes by borrowing communication decoding algorithms. These algorithms decode a streaming sequence of bits in real time; such algorithms include Belief Propagation and the Viterbi algorithm; see J. Proakis, "Digital Communications", McGraw Hill, 1995.

A New Theory of Analog-to-Information Conversion (AIC)

The optimal recovery description given above for sparse signals does not carry directly over AIC. Indeed, the CS principle and the algorithms we outlined above leave open many important practical problems. The existing theory pertains only to discrete-time signals, so a major challenge is to extend these ideas to analog signals. There are many challenges in adapting these digital-based algorithms to analog signals. These challenges are both mathematical and technological. We address mathematically what the effect is of discretizing an analog signal on the recovery algorithm. We address what is the appropriate analog equivalent of making a single sample. Furthermore, we determine what we can building in hardware that exploits the theoretical cost savings. The following discussion addresses these considerations. We begin with the signal space models and focus our discussion on the information map design and implementation in analog hardware.

Sparse models for analog signals: As in the discrete-time setting, sparsity plays a starring role. Suppose that $\Psi$ is a dictionary, or collection of waveforms, in $L_2[0,T]$. As before, we say that a continuous-time signal x is sparse with respect to $\Psi$ if it is well approximated in $L_2$ norm by a short linear combination of waveforms from $\Psi$: $x(t) \approx \sum_{i \in I} \alpha_i \psi_i(t)$ where $|I|$ is small. Since the information operator is linear, the measurements y satisfy $$y = \Phi x \approx \sum_{i \in I} \alpha_i \Phi \psi_i.$$

So we can view y as being sparse with respect to the dictionary $\{\Phi \psi_i\}$.

A central issue is that the sparse model must be identifiable from the measurements. If the dictionary $\Psi$ is infinite, then the set $\{\Phi \psi_i\}$ has a cluster point (or is unbounded). Even if the dictionary is finite, its image under the information operator may have geometric properties unfavorable for sparse approximation. We see that the model must be constructed carefully in concert with the information operator.

One potential approach to constructing identifiable models is to "thin out" a dictionary to a smaller number of elements while still preserving the basic sparsity characteristics. For example, if $\Psi$ contains all sinusoids up to some frequency (of which there are infinitely many), we could simply discretize these to integral frequencies.

Information operators: To perform compressed sensing, we must construct a linear information operator $\Phi$ that acts on finite-energy signals in $L_2[0, T]$ to produce a sequence of M real numbers as output. When designing an information operator $\Phi$, there are several considerations:

Information-theoretic: Will $\Phi_x$ contain enough information about x?

Technological: Can we implement $\Phi_x$ in analog hardware?

Computational: How hard is it to reconstruct x (or retrieve some critical statistics) from $\Phi x$?

The fundamental limitations and tradeoffs of these considerations are discussed below.

The information operator—analog side: The measurement operator must have properties favorable both for analog implementation and for digital processing. However, the operator $\Phi$ looks completely different from the analog and digital worlds. In analog, it is a set of circuits that process continuous-time signals, while in the digital world it is a matrix, a transform or an estimation algorithm or methodology; these two representations must be reconciled. Let us describe some of the issues that arise on the analog end.

Since the information operator will be implemented in analog hardware, it is natural to look for operators that can be factored as $\Phi=SH$ where H performs analog-analog processing of the signal (such as filtering and modulation) and S samples the resulting signal. The types of analog processing that can be performed are severely limited, as noted in Section 4.1.3. The bandwidth and bitrate of the sampling operator are also limited, as noted in Section 4.1.3. In addition, the digital algorithms and the mathematical analysis must both be sensitive to the fact that analog processing is inherently inexact.

The fact that the information operator maps continuous-time signals to discrete-time signals makes it difficult to apply methods of analysis from the current CS literature. As a result, it may be necessary to find the appropriate extension of concepts to the infinite dimensional setting (such as incoherence between $\Phi$ and the operator $\Psi$).

Another approach is to project the analog signals onto a finite-dimensional subspace to return the problem to the familiar discrete setting. For example, in case x is bandlimited, we can perform the following maneuver. Let R: $L_2$ [0, T]→$\mathbb{R}^B$ be another sampling operator with a rate above the Nyquist frequency for x, and let $R^{-1}$ be an interpolator. Therefore, we can express the action of the information operator as $\Phi(x)=(\Phi R^-)Rx$; where now $\Phi R^{-1}$ is genuinely a finite-dimensional matrix. Our techniques could then be applied with respect to the time-sampled dictionary $R\Psi$.

The information operator—digital side: At the same time, we must identify information operators that lead to efficient digital algorithms. To see why this point is so important, let us consider two diametric cases. First, suppose that $\Phi$ consists of independent Gaussians, as in much of the current literature. Then $\Phi x$ will contain "enough" information about x. Unfortunately, such a matrix will present technological and computational difficulties. It is difficult to realize a random Gaussian operator in hardware (particularly in the analog setting); any algorithm for reconstructing x requires storing the entire matrix $\Phi$; and the lack of structure in the matrix does not permit any shortcuts with linear algebra.

At the opposite extreme, the matrix $\Phi$ might extract just a few random Fourier coefficients. That is, suppose $x \in \mathbb{R}^N$ is a vector with K non-zero spikes. The matrix $\Phi$ is GF, where F is the N-by-N Fourier matrix and G is a K polylog(N)-by-N "group testing" matrix, which involves correlated random sampling; here polylog denotes a polynomial on the logarithm. The matrix F is fixed and non random, and need not be stored. The matrix G has approximately K non-zeros per row, so storing G and multiplying G by a vector (as arises in some reconstruction algorithms) is computationally efficient. In fact, by structuring G properly, the cost to multiply x by a sparse vector can be bounded at around K polylog(N) rather than $K^2$polylog(N).

Indeed, there are many ways to construct highly structured matrices that may succeed as CS information operators. Some of these approaches have been adopted in the computer science literature for solving related problems. We detail several approaches.

Error correcting codes: One way to construct measurement matrices uses the theory of error-correcting codes. One can view much of the group-testing literature including the group testing used in several sparse recovery algorithms—as part of the theory of error correcting codes. Furthermore, taking the rows of $\Phi$ to be random code words has certain useful provable properties; e.g., in each row, any r positions are independent, where r depends on the code. There is a long history of building actual devices to work with error-correcting codes and we hope to exploit this. For example, in certain sparse recovery algorithms, the matrix $\Phi$ can be taken to be K log $^{O(1)}$(N) random rows of a Hadamard matrix. There is a permutation of rows and columns of the Hadamard matrix that results in a Toeplitz matrix—this is a statement that the Hamming code (whose codewords are the rows of the Hadamard matrix) is a cyclic code.

The sampling operator: We also note that it may be useful algorithmic to consider analog sampling methods more sophisticated than the usual uniform sampler.

For some important dictionaries, including the Fourier orthonormal basis, the measurement matrix $\Phi$ can be a sampling matrix. That is, in the setting of a discrete signal $x \in \mathbb{R}^N$, to express or to approximate x as a linear combination of K Fourier basis functions, it suffices for $\Phi x$ to be a random sample of the positions in x. This is especially important in digital settings where the data acquisition cost is proportional to the number of signal values sampled. Furthermore, for certain structured dictionaries including the Fourier orthonormal basis, a sparse approximation to x can be computed from $\Phi x$ in computational time approximately K log $^{O(1)}$(N), using correlated random samples and group testing techniques (see A. C. Gilbert, S. Guha, P. Indyk, Y. Kotidis, S. Muthukrishnan, and M. Strauss, "Fast, small-space algorithms for approximate histogram maintenance," *ACMSTOC'02 Proceedings*, 2002, and A. Gilbert, S. Guha, P. Indyk, S. Muthukrishnan, and M. Strauss, "Near-optimal sparse fourier representations via sampling", 34*th Annual ACM Symposium on Theory of Computing*, 2002, pages 152-161). In the appropriate settings, then, this approach requires computational time around K log $^{O(1)}$(N) for both tasks of measurement and reconstruction. Besides the Fourier orthonormal basis, these techniques also apply to the Hadamard orthonormal basis (see E. Kushilevitz and Y Mansour, "Learning decision trees using the Fourier spectrum," pages 455-464, 1991) and the Kerdock redundant dictionary.

4.1.3 Analog/Digital Hardware Building Blocks

The CS and streaming algorithms in Section 4.1.2 point toward several potential AIC implementations. In this section, we describe a set of hardware building blocks that can be implemented in today's analog/digital technology and combined to create different information operators $\Phi$. The example implementations described in this section are to be regarded as illustrative in nature, and not as restrictive.

Analog filters compute the convolution x(t)*h(t) of the signal x(t) with impulse response h(t). We can consider many of the available active filter realizations. RC active filters tend to have higher tolerances as it is difficult to integrate precision resistors onto silicon. Switched-C filters use switches and capacitors instead of resistors, have low power consumption, and feature lowpass bandwidths up to 20 MHz. See A. Zahabi, O. Shoaei, Y Koolivand, and H. Shamsi, "A low-power programmable lowpass switched capacitor filter using double sampling technique", *Proceeding of the 16$^{th}$ International Conference on Microelectronics, ICM* 2004, pages 651-654, December 2004. While switched C filters provide very good linearity, they suffer from frequency response limitations due to the usage of op-amps as their main building blocks. Switched-C filters also depend on the charge conservation law, and so they may suffer from performance degradation due to leakage current effects or due to the switch jitter effect. Gm-C filters operate at frequencies up to 50 MHz with low power because they use simple building blocks, but their linearity can be poor. See T. Tanaka, C. Sungwoo, S. Shimizu, T. Ida, H. Ishihara, T. Matsuoka, K. Taniguchi, A. Sugimori, and H. Hihara, "A Widely Tunable Gm-C Filter using Tail Current Offset in Two Differential Pairs, *IEEE International*

Symposium on Circuits and Systems, ISCAS'05, pages 812-815, May 2005. ELIN (Externally Linear Internally Nonlinear) filters offer a good bandwidth-linearity compromise, low power, small area, and electronic tunability, but they suffer from secondary effects and are also very prone to noise because of the compression used.

All of the above discussed filters are infinite impulse response (IIR) filters and cannot be used for applications such as matched filters, which require the implementation of finite impulse response (FIR) filters. FIR filters can be implemented using newly developed techniques that use current-mode analog circuits or switched-current circuits with distributed arithmetic. See V Srinivasan, G. Rosen, and P. Hasler, "Low-power realization of FIR filters using current mode analog design techniques," *Thirty-Eighth Asilomar Conference on Signals, Systems and Computers, Conference*, pages 2223-2227, November 2004; and P. Sirisuk, A. Worapishet, S. Chanyavilas, and K. Dejhan, "Implementation of switched current FIR filter using distributed arithmetic technique: exploitation of digital concept in analogue domain," *IEEE International Symposium on Communications and Information Technology, ISCIT* 2004, pages 143-148, October 2004. In the case of matched filters (MFs), floating-gate analog CMOS and charge-domain operations techniques are preferred as they offer the design for low power and area compared to other techniques such as the switched-C implementations. T. Yamasaki, T. Taguchi, and T. Shibata, "Low-power CDMA analog matched filters based on floating-gate technology," *IEEE International Symposium on Circuits and Systems, ISCAS'02*, pages V-625-V-628, May 2002; and S. Nakamura and Y Nagazumi, "A matched filter design by charge-domain operations," *IEEE Transactions on Circuits and Systems I, Regular Papers*, pages 867-874, May 2005.

Modulators, also known as mixers, compute $x(t) \times m(t)$, where possible $m(t)$ include sinusoids, chirps, sequences of $\pm 1$'s, error correcting codes, etc. Passive mixers, such as diode mixers and passive field effect transistor (FET) mixers, have good linearity, good noise performance, and can operate at frequencies up to 5 GHz. However, active mixers are preferred for low-power integrated circuits as they provide conversion gain, require less power at the local input port, and have a broader design space. Mixers are generally based on the classic Gilbert cell. Several modifications can be made to this basic circuit to increase its frequency response, decrease its nonlinearity, and limit its noise level. An important issue is limiting the feed-through of a signal on an undesired path (isolation) since the mixer is essentially a three-port network. These techniques involve the use of matching networks and emitter degeneration. A CMOS ultra-wideband active mixer fabricated using 0.18 μm CMOS technology and operating in the range 0.3-25 GHz is reported in M. Tsai and H. Wang, "A 0.3-25-GHz Ultra-Wideband Mixer Using Commercial 0.18-m CMOS Technology," *IEEE Microwave and Wireless Components Letters*, pages 522-524, November 2004. Wide bandwidth is obtained through emitter degeneration of the transconductance stage. Input matching is achieved through the use of LC ladder matching networks at both the RF and LO ports. We will investigate the different modulator topologies and their associated tradeoffs in depth.

Linear feedback shift registers (LFSR) generate pseudorandom sequences and codes, such as maximal length sequences, etc. This type of register is commonly implemented using high-speed flip-flops. These include double edge-triggered flip-flops, fully differential circuit techniques, and current mode logic. Flip-flops operating at 17 GHz have been reported. In linear feedback shift registers we consider the output of a single flip-flop, and thus we are not concerned with input clock jitter nor glitches in internal stages transitions. The primary nonideality we will be concerned with is the loading effect on the output flipflop and the associated degradation of rise and fall times. We will model this effect in conjunction with the mixer nonidealities in order to assess the impact on the system performance.

Analog-to-digital converter (ADC) performance is affected by several parameters. Due to the non-linearity of the active components, difficulties matching between the various components, process variations, circuit noise, and finite conversion time, the actual performance of a fabricated ADC is less than ideal. In addition, clock jitter appears as an excess noise that further degrades performance. These nonidealities appear as offset, gain, absolute accuracy, integral non-linearity (INL), and differential non-linearity (DNL) errors. Increasing the sampling frequency enlarges the nonidealities.

4.2 Exemplary Embodiments

In this section, we provide details on our AIC inventions. We present two new AIC designs and develop a new approach to signal detection in AICs.

The present invention is also capable of other and different embodiments and its several details can be modified in various obvious respects, all without departing from the spirit and scope of the present invention. Accordingly, the drawings and descriptions are to be regarded as illustrative in nature, and not as restrictive.

4.2.1 AIC Design 1 Using Random Filtering

For illustration only, recall Radar scenario 1—Surveillance in entertainment noise wherewe aim to detect and estimate the parameters of a number of linear-FM radar chirps in the presence of a small number of strong sinusoidal TV interferers and noise.

First, assume that the chirps and sinusoids are chosen from known dictionaries of possibilities. We construct a frame that consists of the concatenation of two dictionaries: the first one yielding a sparse representation for chirps ($\Psi_C$), and the second one yielding sparse representations for the sinusoidal jammers ($\Psi_S$); thus, we have $\Psi = [\Psi_C \Psi_S]$. Under certain conditions on the sampling of chirp parameters, the family $\Psi$ is incoherent, meaning that the inner product between any pair of distinct chirps or sinusoids has a small upper bound—the signals are nearly orthogonal. Then, if the measurement process $\Phi$ consists of linear functionals that are incoherent and noise-like with respect to $\Psi$, it follows that a small number of chirps and sinusoids can be recovered by greedy pursuit techniques; see A. C. Gilbert, S. Muthukrishnan, and M. J. Strauss, "Approximation of functions over redundant dictionaries using coherence", *Proceedings of ACM/SIAM Symposium on Discrete Algorithms (SODA* 2003), pages 243-252, 2003.

Ultimately, the number of recoverable signal elements depends on the incoherence, which in turn depends on the minimum guaranteed separation of parameters. If we consider also additive Gaussian noise, then our ability to recover depends on the size of $\Psi$ and its incoherence, as well as the signal-to-noise ratio.

Preliminary theoretical evidence suggests that, if a K-term superposition accounts for an $\eta$ fraction of the energy in a signal of length N, then $K \log(N)/\eta^2$ measurements suffice for signal recovery, provided that $K\mu \ll 1$, where $\mu$ is the incoherence—the maximum inner product over pairs of sinusoids and chirps in our dictionary.

AIC 1: Signal Processing Algorithms

Implementing a measurement system to realize a fully random Gaussian $\Phi$ (to ensure generic incoherence with any $\Psi$—see E. Candès and T. Tao, "Near optimal signal recovery from random projections and universal encoding strategies", Preprint, 2004, and D. Donoho, "Compressed sensing", Preprint, 2004) is impractical. As an alternative, we implement two analog measurement systems that are realizable via simple hardware and yield measurement operators Φ that are sufficiently incoherent with the dictionary Ψ (and also with more generic dictionaries).

Our first measurement system (see FIG. 3) passes the input x(t) 302 through an analog filter 304 with impulse response h(t) and then samples the output y=x*h 306 with period Δ, yielding samples $y_n$=(nΔ). The sampling period Δ is determined by the sparsity K of the signal, rather than the Nyquist frequency. From this reduced set of samples, it is possible to recover information about the signal x(t) using greedy pursuit.

Design of such a system will be facilitated by considering its analogous discrete-time system (for more see Section 4.2.2). Each measurement can be written as an integral y[n]= (nΔ)=∫x(τ)h(nΔ−τ)dτ. This is analogous to the discrete-time measurement process, in which each measurement is collected as an inner product. In our setting, each measurement corresponds to an inner product of x against a shifted (and time-reversed) copy of h. A collection of distinct inner products can be obtained by sampling the output of the filter at different times.

The filter h should be designed to be incoherent with the dictionary Ψ. The discrete-time setting provides a useful visualization; see Section 4.2.2 for a discrete-time approach. Consider a discrete-time signal f, and suppose that we filter f using a discrete-time filter h. Then we can write the output y=f*h as $y_n=\Sigma_\tau f_\tau h_{n-\tau}$. In terms of matrix algebra, y=Hf, where f and y are N×1 vectors, and H is an N×N Toeplitz matrix with each row containing a shifted version of h. (For this illustration we ignore the border artifacts caused by finite signal lengths.) In this discrete-time setting, if we were to subsample the output of the filter, we would obtain a measurement matrix Φ that is a subsampled version of H.

Certain incoherence properties of Φ (in particular whether its rows are nearly orthogonal) derive from the inner product of h with shifts of itself. This inner product can be minimized in variety of ways. One possibility is to generate h as a random sequence; such a pattern tends to be incoherent not only with shifts of itself, but also (just as importantly) with the columns of Ψ. Other possibilities for h include wavelet scaling functions, which are orthogonal at scaled integer shifts, or coding sequences such as Barker or other codes (see F. Le Chavalier, "Principles of Radar and Sonar Signal Processing", Artech House, 2002, and N. Levanon and E. Mozeson, "Radar Signals", Wiley-Interscience, 2004) that have peaked autocorrelations. In some cases, the length of h may be well shorter than N; empirically, we have observed that a random h of finite length (<<N) still suffices for reconstruction of sparse signals (see FIG. 4). In these cases, Φ takes the form of a banded matrix, with zeros on areas sufficiently far from the diagonal.

Such a structured measurement system could also offer computational benefits during reconstruction. A linear program solver could exploit both the sparsity and the sub-sampled-Toeplitz structure of Φ. Greedy algorithms could save on computing inner products by exploiting both the sparsity and the fact that the columns are also shifts of each other. Finally, depending on the sparsity basis Ψ, it is feasible to implement a streaming decoder, using a Viterbi-like algorithm; see J. G. Proakis and M. Salehi, "Communication Systems Engineering", Prentice Hall, 1994. Such a system could progressively recover the signal (from left to right in time) as more measurements are received.

AIC 1: Hardware Implementation

Of course, the exact design of the system must consider the nuances of the analog front end. If Ψ merely consists of delta functions, then it can suffice for h to be a lowpass filter (LPF); see M. Vetterli, P. Marziliano, and T. Blu, "Sampling signals with finite rate of innovation", IEEE Trans. Signal Proc., Vol. 50, No. 6, June 2002, and E. Candès, J. Romberg, and T. Tao, "Robust uncertainty principles: Exact signal reconstruction from highly incomplete frequency information", Preprint, 2004.

Figure 3:
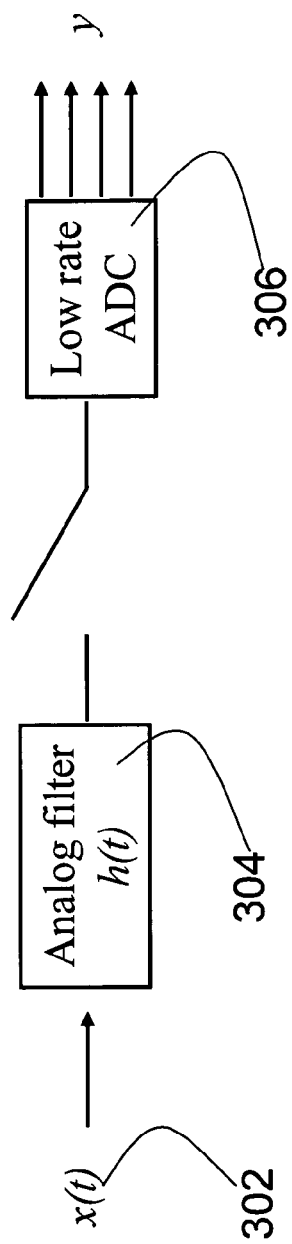
FIG. 3 is a block diagram for AIC design 1. The signal passes through an incoherent analog filter before being sampled at a rate proportional to its sparsity.

In order to design the described hardware for generic incoherent filtering, we utilize a filter that pseudo-randomly changes the magnitudes and phases of the input signal spectral components as shown in FIG. 3. Such incoherent analog filters can be implemented by either a single complex filter or a bank of simple parallel filters selected in a pseudorandom fashion by employing accurate switches with minimized jitter. This embodiment of the invention provides an efficient implementation of a measurement matrix with the qualities required for successful CS reconstruction, such as incoherence and randomness.

The incoherent analog filter can be built such that there is a large randomness in its phase response. This is required in order to reach a sufficient incoherence with the dictionary. This would require a very high order transfer function. Such very high order transfer function is very difficult to be implemented in VLSI without degrading the frequency response, linearity, power consumption, and the area of our system. The transfer function of such filter will be constant and hence the randomness will be fixed and that is may degrade the performance of the DSP part of our system.

Another approach for implementing the incoherent analog filter is to use Surface Acoustic Wave (SAW) filter technology. This family of filters is well known in wireless communications. SAW filters rely on the conversion of an electrical signal into acoustic waves through the use of piezoelectric substrate and Inter-Digital Transducers (IDT). In this type of filters the frequency response of the filter can be specified by building the IDTs in the shape of the time response of the filter. Therefore, by building the IDTs in discontinuous shapes, we can have random phase without affecting the magnitude response of the filter. The randomness of the phase depending on the amount of discontinuity in the IDT's shape and hence cause the randomness to be limited by the fabrication shape.

A third approach uses a bank of parallel low order different transfer function analog filters, which can be connected to the circuit via switches. This architecture randomly connects different combinations of filters to generate a pseudo-time variant transfer function with sufficient randomness in phase. Such bank of analog filters can be built using Gm-C, switched-C, and ELIN circuits depending on the required frequency response, linearity and complexity (area). Other possibilities filters include wavelet scaling functions, which are orthogonal at scaled integer shifts, or coding sequences such as Barker or other codes, which have peaked autocorrelations.

The sampler after the incoherent analog filter operates at the measurement rate which can be much lower than the Nyquist sampling rate. The measurement rate is basically determined by the sparsity of the signal, rather than the Nyquist frequency. After that we convert it to the digital domain for further DSP processing by a low rate ADC built using conventional ADC technology. Our system design incorporates a sigma-delta ADC for this purpose.

4.2.2 AIC 1: Example Implementation

In this section, we discuss the use of discrete-time random filters as a method for incoherent filtering in the purely discrete setting. Although this section focuses on the setting of discrete signal reconstruction, a mathematical framework for continuous signals has been presented in Section 4.2.1. The extension of the AIC 1 implementation described in this section to such case will be obvious from the description, or may be learned by practice of the invention.

Introduction

Figure 5B:
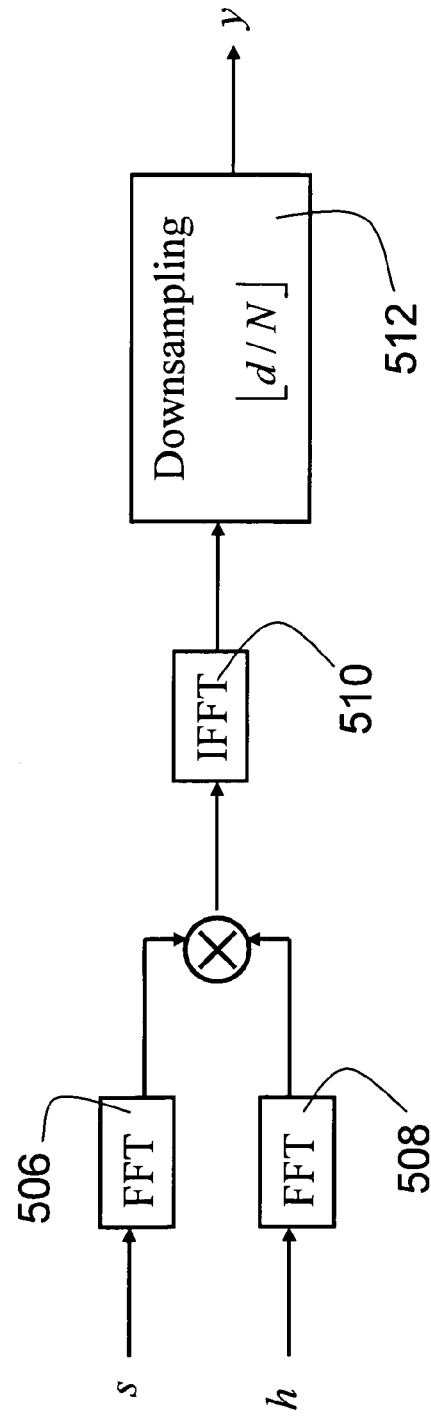

We now describe random filters as a new paradigm for discrete-time compressive signal acquisition. Our approach captures a discrete-time signal s by convolving it 502 with a random-tap FIR filter h and then downsampling 504 the filtered signal to obtain a compressed representation y. FIG. 5 illustrates the measurement process. Reconstruction of s involves a nonlinear algorithm. An alternative approach shown in FIG. 5(b) uses Fast Fourier Transforms (FFT) 506, 508 and Inverse FFT (IFFT) 510. The FIR filter h has random taps, which must be known in order to recover the signal s from the compressed data y.

At first glance, one might think this method would convert a signal into garbage. In fact, the random filter is generic enough to summarize many types of compressible signals. At the same time, the random filter has enough structure to accelerate measurement and reconstruction algorithms. Our method has several benefits:

Measurements are time-invariant and nonadaptive.
Measurement operator is stored and applied efficiently.
Can trade longer filters for fewer measurements.
Easily implementable in software or hardware.
Generalizes to streaming or continuous-time signals.

This section (Section 4.2.2) describes how random filters can be used to capture finite-length, discrete-time signals, and is organized as follows. After providing some background information, we discuss two different methods for signal acquisition that take full advantage of the structure of the random filter. We then present a reconstruction algorithm, based on Orthogonal Matching Pursuit (OMP), that uses the structure of the random filter to accelerate computations. We then report on extensive numerical experiments, which confirm that random filters are effective tools for signal acquisition and recovery.

Background

This section (Section 4.2.2) concentrates on signals that can be expressed efficiently in an orthonormal basis $\Psi$, called the sparsity basis. We say that a signal s of length d is m-sparse with respect to the basis if there is a vector $\alpha$ with m<<d nonzero entries for which s≈$\Psi\alpha$. This model covers many signal classes, including (i) Poisson processes and spike trains, (ii) piecewise polynomials and splines, and (iii) signals in weak $l_p$ balls.

Results from the CS literature provide a benchmark for studying the performance of random filters. Taking N linear measurements of the signal s can be viewed as multiplication by a d×N measurement matrix $\Phi$. Several distributions for $\Phi$ have been proposed. If $\Phi$ is fully i.i.d. Gaussian, then several different algorithms can recover m-sparse signals from N=O(m log d) measurements. If $\Phi$ is a Rademacher (i.e., ±1) matrix or a random row submatrix of the DFT matrix, then a similar number of measurements suffice in practice.

The costs for CS encoding and decoding depend significantly on the type of measurement matrix. Gaussian and Rademacher matrices require storage and computation O(dN) for encoding. Fourier measurement matrices improve storage to O(d) and encoding times to O(d log d). Two different algorithms, OMP and $l_1$ minimization, are commonly used for signal reconstruction. OMP requires O(mNd) arithmetic operations in general, but it can be improved to O(md log d) with Fourier measurements. Reconstruction costs via $l_1$ minimization have not been reported, but one expects them to be O($d^{3.5}$) in general.

Compressive Sampling

This section defines more precisely what we denote as random filter, and it compares two different methods for determining the compressed signal. A random filter of length B is an FIR filter whose B taps are i.i.d. random variables. In particular, we are interested in the cases where the taps are drawn (i) from the $\mathcal{N}$ (0, 1) distribution or (ii) from the Bernoulli/Rademacher distribution of {±1}'s.

Draw a random filter h of length B. Note that the filter requires just O(B) storage. To take N measurements of a signal s of length d, we must calculate $$y = M_{\downarrow}(h*s),$$

where $M_{\downarrow}$ downsamples by a factor of $\lfloor d/N \rfloor$. Note that, because this process is linear, the map from the signal s to the summary y can be viewed as y=$\Phi$s, where $\Phi$ is an N×d matrix. This matrix is banded and quasi-Toeplitz: each row has B nonzero entries, and each row of $\Phi$ is a copy of the row above, shifted right by $\lfloor d/N \rfloor$ places.

Method 1: The first method for calculating the measurements performs linear convolution and downsampling simultaneously. For n=0, 1, . . . , N–1, the n-th measurement is calculated as $$y(n) = \sum_{j=0}^{B-1} s(n\lfloor d/N \rfloor + j)h(B-j).$$

Computing N measurements requires O(BN) arithmetic operations. This method can be applied in systems where the input s is streaming, since the measurements are localized in time and also time-invariant.

Method 2: The second method uses FFTs to calculate the convolution. In this case, we compute $$y = M_{\downarrow} \mathcal{F}^{-1}\{H(w)X(w)\},$$

which is equivalent to using a circulant $\Phi$ matrix. The cost of computing the measurements is O(d log d), independent of the filter length or the number of measurements. Compared to Method 1, this calculation may be faster if the filter has many taps. Note, however, that the entire signal must be presented at once.

In practice, these two encoding methods are at least as efficient as anything described in the CS literature. We also note that filtering can be performed with other standard methods, such as overlap-add, but we omit this discussion; see A. V Oppenheim, R. W. Schafer, and J. R. Buck, "Discrete-Time Signal Processing", Englewood Cliffs, N. J.: Prentice Hall, 1989.

Number of Measurements

The number of measurements required to capture a class of signals depends on several different factors:

The sparsity level m and length d of signals.
The length B of the random filter.

The coherence between the measurement matrix and the sparsity basis. When $\Phi\Psi$ has small entries, signal acquisition requires fewer measurements.

Algorithm: Random Filter Reconstruction (RFR)

---

Initialize residual $r_0 = y$. For $t = 1, 2, \ldots, m$ do

A. Find the column $i_t$ of $\Phi\Psi$ such that $$i_t = \mathrm{argmax}_i |\langle r_{t-1}, (\Phi\Psi)_i \rangle|.$$

B. Compute the new residual $$r_t = y - P_t y$$

where $P_t$ is the orthogonal projector onto the span of the t columns chosen from $\Phi\Psi$.

Output: Columns $\{i_t\}$ and coefficients $\{\hat{\alpha}_{i_t}\}$ such that $$P_m y = \sum_{t=1}^{m} \hat{\alpha}_{i_t} (\Phi\Psi)_{i_t}.$$

---

Explaining these tradeoffs theoretically is a major project.

One expects that signals sparse in the time domain, i.e., $\Psi=I$, are the most difficult to acquire with random filters because of high coherence. Yet we present empirical evidence below that random filters are effective for recovering time-sparse signals: a random filter of length d performs as well as a fully Gaussian matrix. When the filter length decreases, the number of measurements increases somewhat. For signals sparse in the frequency domain, the number of measurements depends weakly on the filter length; a four-tap filter already yields good reconstruction probability.

Signal Reconstruction

Reconstructing a signal from the compressed data requires a nonlinear algorithm. The CS literature advocates greedy algorithms, such as Orthogonal Matching Pursuit (see J. Tropp and A. C. Gilbert, "Signal recovery from partial information via orthogonal matching pursuit", Preprint, April 2005) and Tree-based Matching Pursuit (see M. E Duarte, M. B. Wakin, and R. G. Baraniuk, "Fast reconstruction of piecewise smooth signals from random projections", *Proc. SPARS05*, November 2005), or optimization-based algorithms involving $l_1$ minimization (see E. Candès, J. Romberg, and T. Tao, "Robust uncertainty principles: Exact signal reconstruction from highly incomplete frequency information", Preprint, 2004, and D. Donoho, "Compressed sensing", Preprint, 2004) for this purpose. Both of these approaches can be accelerated using the properties of random filters, and we believe that random filters will also lead to novel reconstruction algorithms that take full advantage of the localization and time-invariance of the measurements. In this section, we adapt OMP to reconstruct signals.

Algorithm "Random Filter Reconstruction" (RFR) is a high-level description of our OMP reconstruction procedure. The inputs to Algorithm RFR are the random filter h (which determines the matrix $\Phi$), the sparsity basis $\Psi$, the sparsity level m, and the compressed data $y=\Phi s$. Algorithm RFR returns m locations and estimated values for the nonzero entries of $\alpha$.

Using the structure of the measurement process, we can implement Algorithm RFR very efficiently. For simplicity, suppose that the sparsity basis $\Psi=I$, so the input signal is well approximated by a small number of spikes. The primary cost in Algorithm RFR is the computation of the inner products in Step A, which nominally requires $O(dN)$ operations. This cost can be reduced substantially by taking into account the fact that $\Phi$ performs filtering and downsampling. First, upsample $r_t$ so it has length d and then convolve it with the time-reversed filter Rh. Using direct convolution, this step costs $O(dB)$ arithmetic operations. Using the FFT to implement the convolution, the cost is $O(d \log d)$.

We can also apply the orthogonal projector $P_t$ efficiently. Precompute the inner products between columns of $\Phi$ using the fact that the Gram matrix $\Phi^T\Phi$ is Toeplitz and banded. Then the marginal cost of calculating $P_t y$ drops from $O(tN)$ to $O(N)$, which is significant unless the sparsity level m is very small.

We believe that similar gains can be achieved in algorithms for $l_1$ minimization by exploiting the structure of the random filter.

Numerical Results

For illustration purposes, we present results from extensive numerical work, which offer compelling evidence that random filters are a powerful approach to compressive signal acquisition and reconstruction.

Three related experiments establish that random filters can capture sparse signals in three different sparsity bases. Let us describe the experimental setup. Each data point involves (i) a signal length d, (ii) a sparsity level m and a sparsity basis $\Psi$, (iii) a number N of measurements, and (iv) a filter length B. For each data point, we fix a random filter with $\mathcal{N}(0,1)$ taps. For each of 1000 trials, we generate a signal s whose m nonzero coefficients are $\mathcal{N}(0,1)$. We take N measurements and use Algorithm RFR to reconstruct the signal. If they match perfectly, then we record a success. The reconstruction probability is the fraction of the 1000 trials that result in success. As a control, we perform the same experiment using a fully random i.i.d. matrix $\Phi$ with $\mathcal{N}(0,1)$ entries; Algorithm RFR (without enhancements) is used for reconstruction.

We begin with signals that are sparse in the time domain, i.e., $\Psi=I$. Recall that this case is challenging due to high coherence. We choose the signal length d=128 and sparsity m=10. FIG. 6(a) displays the probability of success for several filter lengths, in comparison with fully random measurements. Observe that the two longest filters (B=64 and 128) succeed almost as well as the fully Gaussian matrix, despite having far fewer degrees of freedom.

We now consider signals that are sparse in the Fourier domain, i.e., $\Psi=\mathcal{F}$. As above, the signal length d=128 and sparsity m=10. FIG. 6(b) displays the probability of success for several filter lengths. Note that all four filters yield similar probabilities of success, which are slightly worse than the Gaussian matrix. The filter length has a limited impact since the Fourier basis is incoherent with the random filter.

We performed the same experiment for signals sparse in the Haar wavelet domain. The results were slightly superior to the first experiment and somewhat worse than the second experiment because the Haar basis is localized in time—but not as much as the Dirac basis. We omit the figure.

Two additional experiments examine the performance of random filters for signals with few degrees of freedom per unit time; see M. Vetterli, P. Marziliano, and T. Blu, "Sampling signals with finite rate of innovation", *IEEE Trans. Signal Proc.*, Vol. 50, No. 6, June 2002. First, we attempt to acquire and reconstruct piecewise constant signals. In each trial, the signal has two uniformly random breakpoints and $\mathcal{N}(0,1)$ coefficients. Reconstruction is performed with respect to the Haar wavelet basis. Otherwise, the experimental setup is identical. FIG. 6(c) displays the results for four filter lengths. Since the wavelet coefficients of piecewise polynomials are localized in time, the longer filters convey a significant advantage.

Finally, we attempt to acquire and reconstruct (discrete) Poisson processes using random filters. These signals contain spike trains with geometrically distributed interarrival times. The symbol λ denotes the expected interarrival time, so the expected number of spikes is d/λ. In this experiment, the signal length d=1024, and we examine five interarrival times. we determine the least number N of measurements required to achieve 90% recovery probability. The results appear in FIG. 7. The following trend matches the data well:

$$N = \frac{d}{\lambda}\left(\frac{61.4}{B} + 2.72\right) + 198 \cdot 0.9935^B. \qquad (*)$$

In words, the number of measurements is a linear function of the sparsity level m=d/λ. The intercept can be interpreted as a "startup cost" for using a filter of length B, which decreases for longer filters. The slope can be viewed as the number of measurements required to increase the number of spikes by one; there is a minimal cost of 2.72 plus another term inversely proportional to the filter length.

4.2.3 AIC 1: Discussion and Extensions

Sections 4.2.1 and 4.2.2 have described a new method, random filtering, for compressive sampling of sparse signals. We show that convolution with a random filter followed by downsampling yields an efficient summary of a compressible signal. This approach has some features in common with proposed methods for Compressed Sensing. In particular, random filters are universal, because they can capture a wide variety of sparse signals using a small number of random linear measurements. In contrast with CS, random filters require much less storage and computation for measurement and for reconstruction. Moreover, random filters are time-invariant and time-localized, so they can be used to acquire streaming signals, and they have potential for real-time applications.

AIC implementation through Random Filtering offers a cornucopia of directions for customization; we now describe a subset. First, there are tradeoffs between measurement and computation costs. In particular, a minor increase in the number of measurements makes the computation much more feasible, which may be useful in some applications. Second, this work can be extended to settings such as compressive sampling of images and video and other high-dimensional data. In these settings, possible measurement matrix included banded matrices, non-banded matrices, and matrices with a structure such that measurement is only influenced by a small number of pixels or voxels. Finally, analog filters can be designed to approximate a random filter response. In this case, sampling the signal as described in this section will enable to reconstruct the analog input signal well.

4.2.4 AIC Design 2 Based on Pseudorandom Demodulation

To make the AIC system as general as possible, we aim for an operator Φ that resembles white noise. Along these lines, we consider a second prototype design. It operates as follows (see FIG. 8): Multiply 802 the input x(t) by a mixing/demodulating sequence p(t); pass the result z(t)=x(t)p(t) through an analog low-pass filter (LPF) 804 with impulse response h(t); sample 806 the output y=z*h with period Δ, yielding samples $y_n$=y(nΔ).

While our concept holds for many different p(t), one special modulation signal that is particularly easy to implement in hardware is a pseudorandom square wave; that is p(t) randomly alternates between +1 and −1, where the possible switches occur at equispaced intervals, or chip times. (Note that the sequence p(t) must be known at the receiver to perform recovery; this is easily done by sharing the seed of the pseudorandom generator.) The sampling period Δ is matched to the bandwidth of the LPF (which derives from the signal sparsity K, rather than its Nyquist frequency). This embodiment of the invention provides an efficient implementation of a measurement matrix with the qualities required for successful CS reconstruction, such as incoherence and randomness.

Compared to AIC 1, this design features a simpler filter h, because it uses the sequence p to introduce incoherence into the system. The utility of such as system for CS measurement can be visualized as follows. Multiplying x by p is equivalent to convolving the Fourier transforms X(w) and P(w). Low-pass filtering is equivalent to keeping a subset of the remaining coefficients. In this sense, then, this system is analogous to AIC 1, except that it performs CS measurement calculation in the frequency domain.

The two critical design considerations in this system are the modulation sequence p and the filter h. First, the Fourier transform P(w) must be sufficiently noise-like. Our preliminary empirical results indicate that this criterion is satisfied for a pseudorandom square wave. Second, the bandwidth of P(w) must be large enough to "pull down" the high frequencies of X to the bandwidth of the LPF. This is accomplished by ensuring that the chip rate is on the same order as the Nyquist frequency for x. (However, we stress that the ultimate sampling at the end of the system operates at a rate determined by the sparsity of x.)

In practice, we believe that an ideal LPF will not be necessary. FIG. 4 shows a comparison in probability of correct reconstruction between fully random matrices and the two described approaches; the performance of the three methodologies is comparable. The basic structure for AIC 2 requires a fast modulator and a wideband LPF; for the simulation we choose a Butterworth LPF. Butterworth LPFs contain only poles and are easily implemented in the three studied filters families (Gm-C, Switched-C, and ELIN filters).

This system also has an interpretation in the discrete-time domain. The filter h corresponds to a Toeplitz matrix, as explained above. For a discrete-time input, a modulator of ±1 corresponds to a diagonal matrix containing the ±1 sequence on the diagonal. Multiplying H by this diagonal matrix has the effect of multiplying each column of H by the appropriate number, +1 or −1, in the sequence. Roughly speaking, this "sign-changing" of random columns of H can be enough to make the rows sufficiently incoherent with Ψ. We note that some basis functions (such as delta functions) are already incoherent with respect to the LPF. Instead, the modulator is necessary for quasi-Fourier dictionaries such as sinusoids and chirps. We can also follow the modulator with a small bank of different filters, to obtain more diversity.

Although the design description focuses on the setting of continuous signal reconstruction, the design can be extended to discrete time signals using the standard CS mathematical framework. The extension of the AIC 2 implementation described in this section to such case will be obvious from the description, or may be learned by practice of the invention.

AIC 2: Signal Processing Algorithms

Although our system involves the sampling of continuous-time signals, the discrete measurement vector y can be characterized as a linear transformation of the discrete coefficient vector α. As in the discrete CS framework, we can express this transformation as an M×N matrix Θ that combines two operators: Ψ, which maps the discrete coefficient vector α to an analog signal x, and Φ, which maps the analog signal x to the discrete set of measurements y.

To find the matrix Θ we start by looking at the output y[m], which is a result of convolution and demodulation followed by sampling at rate $\mathcal{M}$ $$y[m] = \int_{-\infty}^{\infty} x(\tau)p_c(\tau)h(t-\tau)d\tau \bigg|_{t=m\mathcal{M}}. \quad (1)$$

Our analog input signal is composed of a finite and discrete number of components of Ψ, and so we can expand (1) to $$y[m] = \sum_{n=1}^{N} \alpha_n \int_{-\infty}^{\infty} \psi_n(\tau)p_c(\tau)h(m\mathcal{M}-\tau)d\tau. \quad (2)$$

It is now clear that we can separate out an expression for each element $\theta_{m,n} \in \Theta$ for row m and column n $$\theta_{m,n} = \int_{-\infty}^{\infty} \psi_n(\tau)p_c(\tau)h(m\mathcal{M}-\tau)d\tau. \quad (3)$$

FIG. 9 displays an image of the magnitude of a realization of such a Θ (assuming that Ψ is the FFT).

AIC 2: Simulations

Consider a smooth signal consisting of the sum of 10 sine waves; this corresponds to 10 spikes in the Fourier domain. We operated on the sparse coefficients using the matrix Θ constructed via Equation (3) and illustrated in FIG. 9. We perform several tests; for clarity, the following figures show the results in the Fourier domain. FIG. 10(*a*) shows the original signal, and FIG. 10(*b*) shows a reconstruction of the signal from a measurement at 20% of the Nyquist rate. The recovery is correct to within machine precision (mean squared error is $2.22 \times 10^{-15}$). We next apply noise to the sparse vector (see FIG. 10(*c*)). FIGS. 10(*d*) and (*e*) show reconstruction results from measurement rates of 20% and 40% of the Nyquist rate. In the noisy situation, 20% of the Nyquist rate is still enough to reconstruct several of the sinusoids, however the noise floor (maximum noise value) decreases from FIGS. 10(*d*) to (*e*) with increased measurements. This demonstrates that the system still performs reasonably well in substantial amounts of additive noise, but more measurements may be required to produce a higher quality result.

We consider the case of wideband signals that are time-frequency sparse in the sense that at each point in time they are well-approximated by a few local sinusoids of constant frequency. As a practical example, consider sampling a frequency-hopping communications signal that consists of a sequence of windowed sinusoids with frequencies distributed between $f_1$ and $f_2$ Hz. The bandwidth of this signal is $f_2-f_1$ Hz, which dictates sampling above the Nyquist rate of $2(f_2-f_1)$ Hz to avoid aliasing. We are interested in the case where $f_2-f_1$ is very large and the signal is compressible, since the AIC will achieve much better performance than an ADC.

It is well known that signals that are localized in the time-frequency domain have compact transformations under the Gabor transform, which is defined as $$\hat{x}(\tau,f) = \langle x(t), \psi_{\tau,f}(t) \rangle,$$

i.e., the coefficient measures the inner product of the signal with the Gabor atoms $$\psi_{\tau,f}(t) = g(t-\tau)e^{-j2\pi ft}$$

where g is a window function with $\|g\|_2=1$, see S. Mallat, "A Wavelet Tour of Signal Processing". Academic Press, 1999. We will leverage this compact nature during the reconstruction of the signal to obtain a representation directly in the time-frequency domain, without performing reconstruction of the original time signal.

The conventional tool for this class of signals is a spectrogram. A spectrogram is assembled using the magnitude of short-time Fourier transforms (STFT) that performs Fourier analysis of shifted windowed versions of the input signals to establish frequency content at local time neighborhoods. The STFT is written as $$\alpha[l,m] = \left\langle x, \psi_{l\tau,\frac{m}{n}} \right\rangle$$

$$= \int_{-\infty}^{\infty} x(t)g(t-l\tau)e^{-j2\pi mt/n}dt$$

for l=1, . . . , n/τ and m=1, . . . , n. This tool provides a visual representation of the Fourier spectrum of a signal over time. The spectrogram can be thought of as a uniform sampling of the coefficients of the signal under the Gabor transform. Thus, by utilizing a dictionary matrix Ψ consisting of a sampling of the Gabor atoms, the signal x can be represented using a sparse or compressible vector a under the dictionary Ψ. In this fashion, our sparse reconstruction of the signal will be obtained directly in the time frequency domain—we observe the spectrogram directly without requiring reconstruction of the original signal. An example is shown in FIG. 11(*a*) where the spectrogram of a single sideband AM frequency hopping signal is displayed. We see that for small ranges of time, the signal is well identified by its carrier frequency, but when we consider the whole signal length there are many carriers to isolate. The spectrogram pictured in FIG. 11(*b*) shows reconstruction of the signal from AIC measurements using a Gabor dictionary with a boxcar window. The carriers in the reconstruction are easily identified. The noise appears due to the non-sparse structure of the input signal; however, its compressibility allows us to recover the largest components.

As a bonus, when the we reconstruct the sparse representation a from our measurements y, the values in a directly correspond to the coefficients in the spectrogram. This is apparent from the formulation of the Gabor atoms and the STFT. A spectrogram analysis can be immediately displayed from a without final reconstruction of the signal's estimated time representation $\hat{x}$.

4.2.5 AIC 2: Example Implementation

To demonstrate the AIC 2 system previously described, we examine the system implementation shown in FIG. 12. The multiplier 1202 modulates the input signal with a ±1 sequence coming from a pseudo-random number generator. The random number generator is implemented using a 10-bit Maximal-Length Linear Feedback Shift Register (MLFSR) 1204. Then the output from the multiplier is fed to the integrator 1206 for a second manipulation stage, with its output sampled by a low-rate ADC 1208 to obtain the low-rate representation of the information. The MLFSR has the benefit of providing a random sequence of ±1 with zero average, while offering the possibility of regenerating the same sequence again given the initial seed. This feature allows the decoder to re-generate the pseudo-random sequence in the reconstruction algorithm. The MLFSR is reset to its initial state every time frame, which is the period of time that is captured from the simulations and fed to the frame-based reconstruction algorithm. The time-frame based operation imposes synchronization between the encoder and the decoder for proper signal reconstruction. To identify the beginning of each frame, header bits can be added in the beginning of each data frame in order to synchronize the decoder; the overhead in the number of data bits is much smaller than the data rate compression of the decoder.

The $n^{th}$ column of the transfer function of the system $\Theta$ for use in the reconstruction algorithm can be extracted as the output of the AIC 2 system when we input the analog signal $\psi_n$. However, the system is time-varying because the random number generator has different values at different time steps. Therefore, we must input all N of the $\psi_n$ in order to account for the corresponding N elements in the pseudo-random number sequence. The resultant system impulse response can then be reshaped to form the $\Theta$ matrix. Alternatively, we can input impulses in order to extract the columns of the operator $\Phi$ and then determine $\Theta$ via (3) using, for example, numerical integration.

FIG. 13(a) illustrates an example analog input composed of two sinusoid tones located at 10 MHz and 20 MHz. The clock frequency of the random number generator is 100 MHz. (The MLFSR frequency must be at least 2× higher than the maximum analog input frequency in order to provide the necessary randomization.) The output of the demodulator is low-pass filtered as shown in FIG. 13(d), then its output is sampled with a low-rate ADC. In FIG. 13(e), the output sampling rate is 10 MSample/s, which is ¼ the traditional Nyquist rate.

In order to quantify the performance of the AIC 2 system in terms of the probability of success in recognizing the sparse components accurately, we measure the performance in terms of the Spurious Free Dynamic Range (SFDR) as shown in FIG. 14(b). The SFDR is the difference between the original signal amplitude and the highest spurs. For this example at ¼ Nyquist sampling, the SFDR was measured as 80 dB as shown in FIG. 14(b). Higher SFDR values can be obtained by increasing the sampling frequency. FIG. 14(c) presents another example with the sampling frequency further decreased to 5 MSample/s. This frequency is ⅛ of the Nyquist rate; the SFDR is reduced to 29 dB as expected.

In our AIC implementation, the modulation stage consists of a highly linear mixer operating at 2 GHz using standard CMOS 0.13 μm fabrication technology, as shown in FIG. 15. Transistors $M_1$ through $M_6$ 1502, 1504, 1506 utilize a double balanced Gilbert cell, which is the core for the modulator (multiplier). Transistors $M_1$ through $M_4$ 1502, 1504 are connected to the high-frequency modulating signal, which is the random number pattern at 2 GHz. Transistors $M_5$ and $M_6$ 1506 are connected to the low-frequency analog input signal that has to be modulated. We chose the double balanced Gilbert cell topology because of its ability to operate as a four quadrant multiplier as well as its high common mode rejection ratio.

In order to realize the low-pass filtering, we utilized a simple integrator circuit, as shown in FIG. 16. Although the integrator is the simplest low-pass filter, it is very effective in the reconstruction process. We used differential input differential output RC-active integrator 1602 in order to minimize the noise effect on the signal. The values of the resistors 1604 1606 and the capacitors 1608 1610 determine the closed loop gain value and the cutoff frequency of the integrator. The main source of non-ideality in the integrator circuit is the finite time constant that arises from the limited amplifier gain. The cutoff frequency of the presented amplifier was adjusted at 100 Hz with a linear slope of 20 dB/decade that extends to 20 GHz to cover the whole range of the modulated signal.

The example shown in FIG. 17 presents the measurement and reconstruction of a sparse single tone amplitude modulated (AM) signal. The input AM signal in FIG. 17(a) is composed of a 100 MHz signal amplitude modulated with a 200 MHZ carrier. FIG. 7(b) presents the pattern of the random pattern generator running at 2 GHz. The modulator output in FIG. 17(c) is the result of the multiplication of the input AM wave by the random pattern. The integrator is used to smooth the fast variations in the randomized signal and provide a signal that carries the sparse signal information in a much lower bandwidth (FIG. 17(d)). FIG. 17(e) shows the output of the back-end ADC that samples the signal at sub-Nyquist rate. In this example, the sampling frequency is 100 MSample/s, a reduction of one-sixth of the minimum Nyquist required rate for a conventional sampling ADC. The spectrum of the reconstructed AM signal is shown in FIG. 17(f).

In order to demonstrate the implementation, we built the transistor level implementation for each block and developed the designs to be suitable for best linearity and highest frequency operations. The end-to-end HSPICE simulations using real circuit implementation, shown in FIG. 17, demonstrate a full successful recovery of the original input signal.

4.2.6 AIC-based Signal Detection Using IDEA

While the CS literature has focused almost exclusively on problems in signal reconstruction, approximation, and estimation in noise (see E. Candès, J. Romberg, and T. Tao, "Robust uncertainty principles: Exact signal reconstruction from highly incomplete frequency information", Preprint, 2004, J. Tropp and A. C. Gilbert, "Signal recovery from partial information via orthogonal matching pursuit", Preprint, April 2005, D. Donoho, "Compressed sensing", Preprint, 2004, E. Candès and T. Tao, "The Dantzig selector: statistical estimation when p is much larger than n", Preprint, 2005, J. Haupt and R. Nowak, "Signal reconstruction from noisy random projections", Preprint, 2004, and M. B. Wakin, S. Sarvotham, M. E Duarte, D. Baron, and R. G. Baraniuk, "Recovery of jointly sparse signals from few random projections", *Proceedings of Neural Information Processing Systems (NIPS)*, 2005), the present invention shows that the CS framework is information scalable to a much wider range of statistical inference tasks. Such tasks, such as detection, do not require a reconstruction of the signal, but only require estimates of the relevant sufficient statistic for the problem at hand. Our key finding is that it is possible to directly extract these statistics from a small number of random projections without ever reconstructing the signal. The two upshots are that (i) significantly fewer measurements are required for signal detection than for signal reconstruction (3× fewer in the example in FIG. 19), and (ii) the computational complexity of detection is much reduced compared to reconstruction (4× lower in the example in FIG. 19). Both of these bode well for many applications. As in reconstruction, random measurements are universal, in the sense that with high probability the sufficient statistics can be extracted from them regardless of the signal structure.

Although this section focuses on the setting of discrete signals, a mathematical framework for continuous signals has been presented in Section 4.2.1. The extension of the framework described in this section to such case will be obvious from the description, or may be learned by practice of the invention.

This section of the document is organized as follows. We first provide background on CS. Next, we state our detection problem and formulate a greedy algorithm for CS detection. We then present a case study involving wideband signal detection in narrowband interference. We also give ideas for extensions to classification, and we end with suggestions for some straightforward extensions of these ideas.

Compressed Sensing Background

Let $x \in \mathbb{R}^N$ be a signal and let the matrix $\Psi := [\psi_1, \psi_2, \ldots, \psi_Z]$ have columns that form a dictionary of vectors in $\mathbb{R}^N$. (This dictionary could be a basis or a redundant frame.) When we say that x is K-sparse, we mean that it is well approximated by a linear combination of K vectors from $\Psi$; that is, $$x \approx \sum_{i=1}^{K} \alpha_{n_i} \psi_{n_i}$$

with K<<N.

Incoherent Measurements

Consider a signal x that is K-sparse in $\Psi$. Consider also an M×N measurement matrix $\Phi$, M<<N, where the rows of $\Phi$ are incoherent with the columns of $\Psi$. For example, let $\Phi$ contain i.i.d. Gaussian entries; such a matrix is incoherent with any fixed $\Psi$ with high probability (universality). Compute the measurements $y = \Phi x$ and note that $y \in \mathbb{R}^M$ with M<<N. The CS theory states that there exists an oversampling factor c>1 such that only M:=cK incoherent measurements y are required to reconstruct x with high probability; see D. Donoho, "Compressed sensing", Preprint, 2004. That is, just cK incoherent measurements encode all of the salient information in the K-sparse signal x.

Reconstruction from Incoherent Projections

The amount of oversampling c required depends on the (nonlinear) reconstruction algorithm. Most of the existing literature on CS (see E. Candès and T. Tao, "Near optimal signal recovery from random projections and universal encoding strategies", Preprint, 2004, D. Donoho, "Compressed sensing", Preprint, 2004, D. Donoho and Y Tsaig, "Extensions of compressed sensing", Preprint. 2004, and J. Haupt and R. Nowak, "Signal reconstruction from noisy random projections", Preprint, 2004) has concentrated on optimization-based methods for signal recovery, in particular $l_1$ minimization. The $l_1$ approach seeks a set of sparse coefficients $\hat{\alpha}$ by solving the linear program $$\hat{\alpha} = \arg\min_{\alpha} \|\alpha\|_1 \text{ subject to } \Theta\alpha = y,$$

where $\Theta = \Phi\Psi$ is named the holographic basis.

Greedy reconstruction algorithms build up a signal approximation iteratively by making locally optimal decisions, see J. Tropp and A. C. Gilbert, "Signal recovery from partial information via orthogonal matching pursuit", Preprint, April 2005, M. F. Duarte, M. B. Wakin, and R. G. Baraniuk, "Fast reconstruction of piecewise smooth signals from random projections", *Proc. SPARS*05, November 2005, and M. B. Wakin, S. Sarvotham, M. F Duarte, D. Baron, and R. G. Baraniuk, "Recovery of jointly sparse signals from few random projections", *Proceedings of Neural Information Processing Systems (NIPS)*, 2005. In this document, we focus on Matching Pursuit (MP) (see S. Mallat and Z. Zhang, "Matching pursuits with time-frequency dictionaries", *IEEE Trans. Signal Processing*, Vol. 41, No. 12, 1993), an efficient greedy algorithm that selects basis vectors one-by-one from a dictionary to optimize the signal approximation at each step. In its application to CS, MP seeks a sparse representation of the measurement vector y in the dictionary $\{\theta_i\}$ consisting of column vectors from the holographic basis $\Theta$.

MP Algorithm for CS Reconstruction

1. Initialize the residual $r_0 = y$ and the approximation $\alpha \hat{0} = 0$, $\hat{\alpha} \in \mathbb{R}^N$ Initialize the iteration counter t=1.
2. Select the dictionary vector that maximizes the value of the projection of the residual onto $\Theta$ $$n_t = \arg\max_{i=1,\ldots,Z} \frac{\langle r_{t-1}, \theta_i \rangle}{\|\theta_i\|}. \quad (4)$$

3. Update the residual and the estimate of the coefficient for the selected vector $$r_t = r_{t-1} - \frac{\langle r_{t-1}, \theta_{n_t} \rangle}{\|\theta_{n_t}\|^2} \theta_{n_t}, \quad (5)$$

$$\hat{\alpha}_{n_t} = \hat{\alpha}_{n_t} + \frac{\langle r_{t-1}, \theta_{n_t} \rangle}{\|\theta_{n_t}\|^2}. \quad (6)$$

4. Increment t. If t<T and $\|r_t\|_2 > \epsilon \|y\|_2$, then go to Step 2; otherwise, go to Step 5.
5. Obtain the signal estimate $\hat{x} = \Psi \hat{\alpha}$.

The parameter $\epsilon$ sets the target error level for convergence, and T sets the maximum number of algorithm steps.

Challenges to CS Signal Recovery

The implications of CS are very promising. Instead of sampling a sparse signal N times and then compressing it, only cK<<N incoherent measurements suffice. CS with random measurements is advantageous for low-power and low-complexity sensors (such as in sensor networks) because it integrates sampling, compression and encryption of many different kinds of signals, see J. Haupt and R. Nowak, "Signal reconstruction from noisy random projections", Preprint, 2004, and M. B. Wakin, S. Sarvotham, M. E Duarte, D. Baron, and R. G. Baraniuk, "Recovery of jointly sparse signals from few random projections", *Proceedings of Neural Information Processing Systems (NIPS)*, 2005. However, several significant challenges to CS-based signal reconstruction remain. In particular, (i) the oversampling factor c required for perfect reconstruction can be quite large, typically $c \approx \log_2(1+N/K)$ for linear programming based reconstruction, see M. B. Wakin, S. Sarvotham, M. F Duarte, D. Baron, and R. G. Baraniuk, "Recovery of jointly sparse signals from few random projections", *Proceedings of Neural Information Processing Systems (NIPS)*, 2005; (ii) the computational complexity of a linear program or greedy algorithm for signal reconstruction is high, typically $O(N^3 \log N)$ for a linear program. Greedy algorithms use fewer computations, but even larger c.

Greedy Detection for Sparse Signals

While the CS literature has focused almost exclusively around signal reconstruction, we now show that incoherent measurements can also be used to solve signal detection problems without ever reconstructing the signal. In the process, we will be able to save significantly on both the number of measurements and computational complexity (see FIG. 19).

Detection Problem Setup

Suppose that the dictionary $\Psi$ contains particular elements of interest that we wish to detect as components of x. (For example, we might want to detect smooth signals, and $\Psi$ might contain a basis of sinusoids or orthogonal polynomials.) Let $\Omega \subset \{1, 2, \ldots, Z\}$ denote the set of target indices that represent these components of interest, and let $\Psi_\Omega$ and $\alpha_\Omega$ denote the corresponding restrictions of the dictionary and coefficients, respectively. Given a set of incoherent measurements y=Φx, we aim to determine whether or not x was generated using any of the target components in $\Phi_\Omega$. That is, we must decide between two composite hypotheses:

$$\mathcal{H}_0: \alpha_\Omega=0 \text{ vs. } \mathcal{H}_1: \alpha_\Omega\neq 0 \quad (7)$$

Sparse Signal Detection

To begin, suppose that the signal x is provided directly. If Ψ is an orthonormal basis, then the solution to (7) can be obtained easily by matched filtering. That is, we can directly compute $\alpha_\Omega$ using inner products of x against the columns of $\Psi_\Omega$ and then compare the components of $\alpha_\Omega$ to a threshold.

However, if Ψ is not orthogonal or if Ψ is a redundant dictionary, then inner products of x against the columns of $\Psi_\Omega$ will not suffice for detection. (Indeed, if Ψ is redundant then there likely will be many $\alpha_\Omega$ that could have led to the observation x.) Difficulties arise because the columns of Ψ are correlated with each other, so that the presence of one interferes with the detection of another. This is analogous to multiuser detection, a classical problem in communications which is known to be NP-hard, see S. Verdú, "Multiuser Detection", Cambridge Univ. Press, 1998. The practical near-optimal iterative decoding algorithm known as successive cancelation or onion peeling is very similar in spirit to MP. These algorithms identify the strongest component of Ψ in x, remove it from x, and then proceed to find the next strongest component. Essentially, this invokes a model for x, namely that it has a sparse expansion in Ψ. This suggests that for our detection problem we should employ a greedy algorithm such as MP from Section 4.2.6. We can then look for significant energy among the coefficients $\alpha_\Omega$.

Now suppose that instead of x we are provided with the incoherent measurements y=Φx. In this case, y will have the same linear expansion among the columns of Θ that x has among columns of Ψ. This strongly motivates an MP approach to solving the sparse detection problem under incoherent measurements. Furthermore, it may be possible to extract the sufficient statistics of interest from a smaller number of incoherent projections; as in reconstruction, random measurements can give us a universal representation of the sufficient statistics, i.e. the statistics can be obtained for a wide range of signal classes and processing tasks.

It is important to note that, just as in any detection problem, it is not necessary to reconstruct precise values for the expansion coefficients $\alpha_\Omega$. Rather, we generally only need to know whether there is a significant contribution from these elements. Moreover, there is no requirement to accurately reconstruct the coefficients $\alpha_{\Omega^c}$. This allows us to considerably reduce the number of measurements and computation required when detecting compared to reconstructing. Additionally we anticipate that a minimal number of projections will be necessary to accurately reconstruct the necessary sufficient statistics.

Incoherent Detection and Estimation Algorithm (IDEA)

Based on the above motivation, we formulate a new Incoherent Detection and Estimation Algorithm (IDEA) for signals hidden in incoherent measurements. The IDEA is based on the MP reconstruction algorithm from Section 4.2.6 with two important modifications. First, we use a larger convergence parameter ϵ and a much smaller number of iterations T than that necessary for reconstruction. Second, we replace Step 5 with the following:

5. If $\|\hat\alpha_\Omega\|_\infty$ exceeds a threshold γ, detect $\mathcal{H}_1$; else choose $\mathcal{H}_C$.

Due to the larger ϵ and smaller T, the vector $\hat\alpha$ might not accurately reconstruct the signal. However, it may still contain sufficient information for detection. Our detection decision is made simply by examining the components $\hat\alpha_\Omega$ and comparing the maximum coefficient to the threshold γ. We will see in the next section that, despite potential imprecision in $\hat\alpha$, the detection decision can be remarkably accurate. Indeed, the detection process can succeed even when M is far too small to recover x (using any convergence parameter). Thus, the number of measurements can be scaled back significantly if detection, rather than reconstruction, is the ultimate goal.

Case Study: Dictionary-based Detection

IDEA is very well suited to detecting signals in the presence of interference and noise when the signals and interference can be sparsely represented in distinct, incoherent dictionaries. We formalize the problem as follows. We aim to distinguish between two hypotheses $$\mathcal{H}_0: x=n+w \text{ vs. } \mathcal{H}_1: x=s+n+w,$$

where s denotes the signal of interest (from some class of signals), n denotes the interference, and w denotes additive white Gaussian noise with w~$\mathcal{N}(0, \sigma_w^2 I)$. Each component is sparse in some dictionary; that is, s=$\Psi_s\alpha_s$, $\|\alpha_s\|_0=K_s$, and n=$\Psi_n\alpha_n$, $\|\alpha_n\|_0=K_n$; however, the noise is not sparse in either dictionary. (The $l_0$ norm $\|\alpha\|_0$ merely counts the number of nonzero components in the vector α.) We can restate the detection problem in terms of the concatenated dictionaries and coefficients, writing $$x = [\Psi_s \Psi_n]\begin{bmatrix}\alpha_s\\ \alpha_n\end{bmatrix} + \omega =: \Psi\alpha + \omega.$$

Now, from the measurements y=Φx (with Φ incoherent with both $\Psi_s$ and $\Psi_n$), we must distinguish between the two hypotheses $$\mathcal{H}_0: \alpha_s 0 \text{ vs. } \mathcal{H}_1: \alpha_s\neq 0$$

We set Ω in IDEA such that $\alpha_\Omega=\alpha_s$ to obtain detection decisions.

IDEA offers several advantages in this detection scenario. First, the sparsest approximation of y will tend to correctly separate the contributions from the signal and interference components thanks to the incoherency of the two dictionaries. Second, the additive noise is attenuated during sparse approximation since its energy is distributed over all of the expansion coefficients, see S. Mallat and Z. Zhang, "Matching pursuits with time-frequency dictionaries", *IEEE Trans. Signal Processing*, Vol. 41, No. 12, 1993.

Wideband Signals in Strong Narrowband Interference

As a concrete example, we study the problem of detecting from random measurements the presence of weak wideband signals corrupted by strong interfering narrowband sources and additive noise. This is a potentially difficult problem: The weakness of the wideband signal precludes an energy detection approach, and if the wideband and narrowband signals overlap in the frequency domain, then bandpass interference suppression may damage the signal beyond detectability. We seek to detect wideband signals that are frequency modulated chirps. Chirps are sparsely represented in the chirplet dictionary (see R. G. Baraniuk and D. L. Jones, "Shear madness: new orthogonal bases and frames using chirp functions", *IEEE Trans. Signal Processing*, Vol. 41, No. 12, pages 3543-3549, 1993) that is incoherent with the Fourier basis that sparsifies narrowband signals. Hence, we can apply IDEA directly. We choose a chirplet dictionary for $\Psi_s$ (see R. G. Baraniuk and D. L. Jones, "Shear madness: new orthogonal bases and frames using chirp functions", *IEEE Trans. Signal Processing*, Vol. 41, No. 12, pages 3543-3549, 1993) and the Fourier basis for $\Psi_n$.

Simulations

We set the signal length to N=1024 and construct a 432-element normalized chirplet dictionary consisting of 64-sample chirplets having 16 start times, 9 starting frequencies, and 3 chirp rates. When present, we generate the chirp signal $s=\Psi_s\alpha_s$ with $K_s=5$, and we assign $\mathcal{N}(0, \sigma_s^2)$ coefficients to the nonzero elements of $\alpha_s$. For the interference we set $K_n=6$ and assign $\mathcal{N}(0, \sigma_n^2)$ coefficients to its nonzero elements. The M×N measurement matrix $\Psi$ contains i.i.d. $\mathcal{N}(0, 1)$ entries. Since the number of measurements required for signal reconstruction is proportional to $K_s+K_n$, the detection results will extend directly to other sparsity levels when the number of measurements increases appropriately.

To illustrate the ability of such measurement systems to preserve the information in x, we give a simple example in the traditional discrete CS setting. We simulate our measurement/reconstruction system for digital signals of length N=1024. For $\Psi_s$ we use a Fourier basis, in which sinusoidal jammers should be sparse. For $\Psi_c$ we assume a linear chirplet dictionary (see R. G. Baraniuk and D. L. Jones, "Shear madness: new orthogonal bases and frames using chirp functions", *IEEE Trans. Signal Processing*, Vol. 41, No. 12, pages 3543-3549, 1993, R. G. Baraniuk and D. L. Jones, "Wigner-based formulation of the chirplet transform", *IEEE Trans. Signal Processing*, Vol. 44, No. 12, pages 3129-3135, 1996, and R. G. Baraniuk and D. L. Jones, "New dimensions in wavelet analysis", *IEEE Int. Conf. on Acoustics, Speech and Signal Processing (ICASSP)*, May 1992) consisting of length-64 pulses that have been amplitude weighted to reduce range sidelobes; see N. Levanon and E. Mozeson, "Radar Signals", Wiley-Interscience, 2004. We construct a test signal x consisting of the sum of five randomly chosen chirplets and six randomly chosen sinusoids (having 4× higher energy than the chirps). For this experiment, we simulate AIC 1 using a banded measurement matrix $\Phi$ having a common pseudorandom sequence of length 128 on each row. We use a greedy reconstruction algorithm (MP) to the recover expansion coefficients in the dictionary $\Psi$—see J. Tropp and A. C. Gilbert, "Signal recovery from partial information via orthogonal matching pursuit", Preprint, April 2005; additional greedy and optimization-based algorithms would also be possible—see S. Chen, D. Donoho, and M. Saunders, "Atomic decomposition by basis pursuit", *SIAM Journal on Scientific Computing*, Vol. 20, No. 1, Pages 33-61, 1998, D. Donoho and Y. Tsaig, "Extensions of compressed sensing", Preprint. 2004, E. Candès, J. Romberg, and T. Tao, "Stable signal recovery from incomplete and inaccurate measurements", Preprint, 2005, and E. Candès and T. Tao, "The Dantzig selector: statistical estimation when p is much larger than n", Preprint, 2005. The recovered chirp signal is generated using only the chirplet coefficients in $\Psi_C$ (that is, ignoring the contributions from the sinusoidal jammers).

FIG. 18 demonstrates successful recovery using only M=165 measurements, an oversampling factor of 15 relative to the total sparsity K=11 of the signal in $\Psi$. This measurement rate is 6 times lower than the highest digital frequency, indicating the promise for significant savings over Nyquist for large problem sizes.

Detection vs. reconstruction: Given the measurements y=$\Psi$x, we attempt to reconstruct x using MP; the probability of error $P_e$ as a function of the number of measurements M (averaged over 10,000 trials) is given in FIG. 19. We define an error as failing to achieve a sufficiently small reconstruction error in the wideband signal s; hence $P_e=\Pr(\|s-\hat{s}\|_2 > 10^{-3}\|s\|_2)$.

Given the same measurements, we also attempt to detect the presence of a wideband component s; detection $P_e$ as a function of M (averaged over 10,000 trials) is also given in FIG. 19. We use IDEA with T=15 and $\epsilon=0$ and set $\Pr(\mathcal{H}_0)=\Pr(\mathcal{H}_1)=\frac{1}{2}$. We choose $\gamma$ using an oracle to minimize $P_e$. The chirps are embedded in strong interference; FIG. 19 features Signal-to-Interference Ratio SIR:=$10 \log_{10}(\sigma_s^2/\sigma_n^2)=-6$ dB and $\sigma_w=0$. We see that low-$P_e$ signal detection requires only about 50 measurements, while low-$P_e$ reconstruction requires about 150 measurements. Moreover, each MP detection requires approximately 4× fewer iterations than reconstruction. We note that a target $P_e$ can be achieved with fewer iterations by obtaining more measurements, thus providing a valuable tradeoff.

Effect of interference: We now focus exclusively on detection performance. FIG. 20(*a*) illustrates $P_e$ as a function of M for several SIRs. For M<50, detection performance degrades with the SIR. However, M>50, detection performance remains largely unaffected. We believe that this is due to the general robustness of CS recovery—for M>50 there seems to be enough information in the measurements to accurately estimate the interference components (those with the most energy). However, with few measurements, some of the interference energy is incorrectly assigned to the signal components, which corrupts performance.

Effect of noise: IDEA shares the same robustness to additive white Gaussian noise as CS reconstruction. FIG. 20(*b*) illustrates the detection performance in noise for different levels of the Signal-to-Noise Ratio (SNR) at the fixed SIR=−6 dB. We see a graceful performance degradation as the SNR decreases; indeed, when the power of the noise becomes comparable to that of the signal to be detected, most detection methods suffer.

Effect of quantization: FIG. 20(*c*) illustrates the detection performance for different levels of quantization of the measurements, with a fixed SIR=−20 dB and no noise. Note in particular that the detection performance is remarkably robust with 4-bit (16 level) quantization; we expect the acceptable level of quantization to be dependent on the SIR and SNR of the received signal.

Extensions to Classification

The properties of incoherent measurements allow us to formulate a simple algorithm for sparse signal classification. Assume that we have a signal of interest of length N and known sparsity≤K in one of C sparse signal classes, each one having a sparsity inducing basis or dictionary; we require that the different bases are incoherent with each other. Our goal is to determine the class to which the signal best fits. If the signal were available, then we could perform sparse approximation using each one of the bases and choose the class that gives the sparsest representation. This requires a set of N signal samples to make the decision.

We can also use random projections; due to their universal quality, cK measurements will suffice to find the sparsest representation of a signal that belongs to any of the C classes. Algorithms such as Orthogonal Matching Pursuit (see J. Tropp and A. C. Gilbert, "Signal recovery from partial information via orthogonal matching pursuit", Preprint, April 2005) allow for the verification of the sparsity of the signal in the basis used by monitoring the number of iterations taken; therefore, by simultaneously running OMP algorithms using each of the C bases or frames, we can find the class to which the signal belongs and its sparse approximation by selecting that class for which the OMP algorithm terminates first. The incoherence between the bases for different classes implies that only one class will have a sparse representation for the given signal.

Additional Extensions of IDEA

IDEA provides reliable detection performance from just a few incoherent measurements when the signals of interest are sparse or compressible in some basis or dictionary. In addition to its efficiency gains over CS reconstruction in terms of the number of measurements and computations required, IDEA shares the many known benefits of CS reconstruction, including the universality of random measurements, progressivity, and resilience to noise and quantization; see E. Candès and T. Tao, "Near optimal signal recovery from random projections and universal encoding strategies", Preprint, 2004, J. Tropp and A. C. Gilbert, "Signal recovery from partial information via orthogonal matching pursuit", Preprint, April 2005, D. Donoho, "Compressed sensing", Preprint, 2004, E. Candès and T. Tao, "The Dantzig selector: statistical estimation when p is much larger than n", Preprint, 2005, J. Haupt and R. Nowak, "Signal reconstruction from noisy random projections", Preprint, 2004, and M. B. Wakin, S. Sarvotham, M. E Duarte, D. Baron, and R. G. Baraniuk, "Recovery of jointly sparse signals from few random projections", *Proceedings of Neural Information Processing Systems (NIPS)*, 2005.

The extension of IDEA to other signal and interference scenarios is straightforward. When the sparse signal decomposition can be parameterized, i.e., when each signal dictionary vector $\psi_i = f(\beta_i)$ with $\beta$ a parameter vector, the CS methodology enables new algorithms for parameter estimation and other statistical signal processing tasks. In particular, detection experiments with the efficient random filtering approach of Section 4.2.2 found little to no performance degradation for streaming signals.

While our examples here have used 1-D signals, IDEA applies to signals of any dimension, including images, video, and other even higher-dimensional data. One potential application would be using IDEA to detect edges in incoherent measurements of images via sparsity in the 2-D wavelet or curvelet domains.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A method for obtaining a compressed representation of a continuous-time signal s, the method comprising:
    taking a sequence y of measurements for the continuous-time signal s, wherein the continuous-time signal s is of sparsity k with respect to a dictionary of continuous-time functions, wherein k is a positive integer, wherein said taking a sequence y of measurements comprises:
        supplying the continuous time signal s to an analog filter in order to obtain a filtered signal, wherein an impulse response of the analog filter is incoherent with respect to the dictionary of continuous-time functions; and
        sampling the filtered signal with a sampler at a sampling rate determined by the sparsity k of the continuous-time signal s, wherein the sampling rate is less than a Nyquist frequency of the continuous-time signal s.

2. A method according to claim 1, further comprising:
    providing the sequence y of measurements to a signal processor; and
    computing with said signal processor an approximate reconstruction of the continuous-time signal s from said the sequence y.

3. A method according to claim 2, wherein said signal processor uses a greedy pursuit method to compute said approximate reconstruction of the continuous-time signal s.

4. A method according to claim 1, wherein the dictionary includes a subdictionary that represents a signal class of interest, the method further comprising:
    providing said set of measurements y to a signal processor; and
    detecting whether the continuous-time signal s contains signal energy within the signal class by operating on the sequence y of measurements.

5. A method according to claim 1, wherein said continuous-time signal s belongs to a signal class that is parameterized by one or more parameters, the method further comprising: estimating the one or more parameters for the continuous-time signal s based on the sequence y of measurements.

6. A method according to claim 1, wherein the dictionary of continuous-time functions comprises one or more of the following types of functions:
    Dirac deltas, sinusoidal functions, wavelets, linear-FM chirps, chirplets, binary chirp sequence signals, polynomial functions, phase coded waveforms, Barker code pulses, pseudorandom noise (PN) sequences, and communication signals.

7. A method for estimating the value of a functional $f$ on a continuous-time signal s, the method comprising:
    acquiring a sequence y of measurements of the continuous-time signal s, wherein the continuous-time signal s is of sparsity k with respect to a dictionary of continuous-time functions, wherein k is a positive integer, wherein each of the measurements y(n) corresponds to the value of a corresponding linear functional $\phi_n$ on the continuous-time signal s, wherein the number of measurements in the sequence y is determined by the sparsity k, wherein the number of measurements in the sequence y is less than a product of a time interval of acquisition and a Nyquist rate of the continuous-time signal s; and
    processing the sequence y of measurements with a signal processor to obtain an estimate of the value of the functional $f$ on the continuous-time signal s.

8. A method according to claim 7, wherein said processing the sequence y of measurements comprises:
    computing an approximate reconstruction of said continuous-time signal s based on the sequence y, and
    evaluating said functional $f$ on said approximate reconstruction.

9. A method according to claim 7, wherein said functional $f$ is designed according to a signal processing task desired on the continuous-time signal s.

10. A method according to claim 9, wherein said signal processing task comprises:
    detection of whether the continuous-time signal s contains significant signal energy in a signal class of interest, or classification of the continuous-time signal s into one of a plurality of signal classes.

11. A method according to claim 9, wherein said number of measurements in the sequence y is selected according to the signal processing task desired.

12. A method according to claim 7, wherein said processing of said set of measurements y comprises the use of one or more of the following:
a sparse approximation algorithm, $l_0$ minimization, $l_1$ minimization, a greedy algorithm, an optimization algorithm, a complexity-regularization algorithm, a homotopy-based algorithm, a group testing algorithm and a belief propagation algorithm.

13. An apparatus for obtaining a compressed representation of a discrete-time signal s of length n, the apparatus comprising:
a multiplier configured to mix the discrete-time signal s with a pseudorandom sequence to obtain a modulated discrete-time signal, wherein the discrete-time signal s is of sparsity k with respect to a dictionary of discrete-time signals, wherein k is a positive integer;
a filter configured to filter the modulated discrete-time signal to obtain a filtered discrete-time signal;
a downsampler configured to obtain a sequence y of m samples of the filtered discrete-time signal, with m being less than n.

14. An apparatus according to claim 13, wherein said pseudorandom sequence alternates pseudorandomly between two amplitude states.

15. An apparatus according to claim 13, wherein the downsampler is configured to downsample the filtered discrete-time signal uniformly in time.

16. An apparatus for estimating the value of a functional $f$ of a discrete-time signal s of length n, the apparatus comprising:
means for acquiring a sequence y of m measurements of the discrete-time signal s, wherein the discrete-time signal s is of sparsity k with respect to a dictionary of discrete-time signals, wherein k is a positive integer, wherein m is less than n, wherein the sequence y of m measurements is characterized by the expression y=Φs, wherein the rows of the m×n matrix Φ are incoherent with respect to the dictionary of discrete-time signals;
means for estimating the value of said functional $f$ of the discrete-time signal s from the sequence y.

17. An apparatus for obtaining a compressed representation of a continuous-time signal s, the apparatus comprising:
a mixer configured to mix the continuous-time signal s with a pseudorandom sequence in the analog domain to obtain a modulated signal, wherein the continuous-time signal s is of sparsity k with respect to a dictionary of continuous-time functions, wherein k is a positive integer;
an analog filter configured to filter the modulated signal to obtain a filtered signal; and
a sampling device configured to sample the filtered signal at a sampling rate less than a Nyquist rate of the continuous-time signal s in order to obtain a sequence y of measurements.

18. An apparatus according to claim 17, wherein said pseudorandom sequence is configured to alternate pseudorandomly between two amplitude states.

19. An apparatus according to claim 17, wherein said sampling device is configured to perform said sampling uniformly in time.

20. An apparatus for estimating a value of a functional $f$ of a continuous-time signal s, the apparatus comprising:
means for acquiring a sequence y of m measurements of the continuous-time signal s, wherein the continuous-time signal s is of sparsity k with respect to a dictionary of continuous-time functions, wherein k is a positive integer, wherein each of the measurements y(n) corresponds to the value of a corresponding linear functional $\phi_n$ on the continuous-time signal s, wherein the number of measurements in the sequence y is determined by the sparsity of the continuous-time signal s, wherein the number of measurements is less than a product of a time interval of acquisition and a Nyquist rate of the continuous-time signal s;
means for processing the sequence y of measurements to obtain an estimate of the value of said functional $f$ of the continuous-time signal s.

21. A method according to claim 2, wherein said signal processor uses one or more of the following methods to compute said approximate reconstruction of the continuous-time signal s:
a sparse approximation algorithm; $l_0$ minimization; $l_1$ minimization; a greedy algorithm; an optimization algorithm; a complexity-regularization algorithm; a homotopy-based algorithm; a group testing algorithm; a Viterbi algorithm; and a belief propagation algorithm.

22. A method according to claim 4, wherein said detecting includes:
performing a plurality of iterations of a greedy pursuit algorithm to obtain a coefficient vector with respect to the dictionary; and
determining whether a restriction of the coefficient vector to a subspace corresponding to the subdictionary has co norm greater than a threshold.

23. A method according to claim 1, wherein the filter is configured to pseudo-randomly change the phases of spectral components of the continuous-time signal s.

24. A method according to claim 1, wherein the filter includes a plurality of inter-digital transducers and a piezoelectric substrate.

25. A method according to claim 1, wherein the filter includes a bank of parallel low-order analog subfilters and a respective plurality of switches, wherein the switches are configured to randomly connect different combinations of the subfilters over time.

26. A method for obtaining a compressed representation of a continuous-time signal s, the method comprising:
obtaining a sequence y of measurements of the continuous-time signal s, wherein the continuous-time signal s is of sparsity k with respect to a dictionary of continuous-time functions, wherein k is a positive integer wherein said obtaining comprises:
mixing the continuous-time signal s with a pseudorandom sequence in the analog domain to obtain a modulated signal;
supplying the modulated signal to an analog low-pass filter to obtain a filtered signal;
sampling the filtered signal to obtain the sequence y of measurements, wherein said sampling is performed at a sampling rate less than a Nyquist rate of the continuous-time signal s.

27. A method according to claim 26, wherein the pseudorandom sequence changes states at a rate that is on the same order as the Nyquist rate of the continuous-time signal s.

28. A method according to claim 26, wherein the pseudorandom sequence takes values from the set {a,−a}, where a is a positive value.

29. A method according to claim 26, further comprising:
generating the pseudorandom sequence based on a known seed using a linear feedback shift register (LFSR).

30. A method according to claim 26, wherein the filter is an integrator circuit.

31. A method according to claim 26, wherein the dictionary comprises a set of Gabor atoms.

32. A method according to claim 26, further comprising:
providing the sequence y of measurements to a signal processor; and
computing with said signal processor an approximate reconstruction of the continuous-time signal s from the sequence y.

33. A method according to claim 32, wherein said signal processor uses a greedy pursuit method to compute said approximate reconstruction of the continuous-time signal s.

34. A method according to claim 32, wherein said signal processor uses one or more of the following methods to compute said approximate reconstruction of the continuous-time signal s:
a sparse approximation algorithm; $l_0$ minimization; $l_1$ minimization; a greedy algorithm; an optimization algorithm; a complexity-regularization algorithm; a homotopy-based algorithm; a group testing algorithm; a Viterbi algorithm; and a belief propagation algorithm.

35. A method according to claim 26, wherein the dictionary includes a subdictionary that represents a signal class of interest, the method further comprising:
providing the sequence y of measurements y to a signal processor; and
detecting whether the continuous-time signal s contains a significant amount of signal energy within the signal class by operating on the sequence y of measurements.

36. A method according to claim 35, wherein said detecting includes:
performing a plurality of iterations of a greedy pursuit algorithm to obtain a coefficient vector with respect to the dictionary; and
determining whether a restriction of the coefficient vector to a subspace corresponding to the subdictionary has ∞ norm greater than a threshold.

37. A method according to claim 26, wherein the continuous-time signal s belongs to a signal class that is parameterized by one or more parameters, the method further comprising: estimating the one or more parameters for the continuous-time signal s based on the sequence y of measurements.

38. A method according to claim 26, wherein the dictionary of continuous-time functions comprises one or more of the following types of functions:
Dirac deltas, sinusoidal functions, wavelets, linear-FM chirps, chirplets, binary chirp sequence signals, polynomial functions, phase coded waveforms, Barker code pulses, pseudorandom noise (PN) sequences, and communication signals.

39. A method according to claim 7, wherein the functional $f$ is a statistic of the continuous-time signal s.

40. A method according to claim 7, wherein the functional $f$ is a linear functional.

41. A method according to claim 9, wherein said signal processing task comprises one or more of the following:
dimensionality reduction, parameter estimation and manifold learning.

42. An apparatus according to claim 13, further comprising:
means for computing an approximate reconstruction of the discrete-time signal s from the sequence y of m measurements.

43. An apparatus according to claim 42, wherein the means for computing employs a greed pursuit algorithm to compute the approximate reconstruction.

44. An apparatus according to claim 13, wherein the downsampler is configured to downsample the filtered discrete-time signal non-uniformly in time.

45. A method according to claim 17, wherein the sampling rate is proportional to the sparsity k of the continuous-time signal s.

46. A method comprising:
receiving a sequence y of m measurements of a signal s, wherein the signal s is of sparsity k with respect to a dictionary $\Psi$ of functions, wherein k is a positive integer, wherein m is a positive integer, wherein the sequence y of m measurements is characterized by the expression y=$\Phi$s, wherein $\Phi$ is a linear operator on a space including the linear span of the dictionary $\Psi$;
performing one or more iterations of a greedy pursuit algorithm on the sequence y of m measurements to obtain a sparse approximation $\Phi\Psi\alpha$ of the signal s, wherein $\alpha$ is an n-element coefficient vector, wherein n is an integer greater than m;
restricting the coefficient vector $\alpha$ to a subspace corresponding to a signal class of interest;
comparing an ∞ norm of the restricted coefficient vector to a threshold to determine whether the signal s contains significant signal energy in the signal class.

47. A method according to claim 46, wherein the greedy pursuit algorithm is a matching pursuit algorithm.

48. A method according to claim 46, wherein the signal s is a continuous-time signal.

49. A method according to claim 46, wherein the signal s is a discrete-time signal.

50. A method comprising:
receiving a sequence y of m measurements of a signal s, wherein the signal s is of sparsity k with respect to a dictionary $\Psi$ of functions, wherein k is a positive integer, wherein m is a positive integer, wherein the sequence y of m measurements is characterized by the expression y=$\Phi$s, wherein $\Phi$ is a linear operator on a space include the linear span of the dictionary $\Psi$;
for each of L subdictionaries of the dictionary $\Psi$, performing a greedy pursuit algorithm on the sequence y of measurements with respect to the corresponding subdictionary, wherein each of the L subdictionaries represents a corresponding signal class of interest;
determining which of the signal classes the signal s belongs to by determining which of the L performances of the greedy pursuit algorithm converges with smallest iteration index.

51. A method according to claim 50, wherein the greedy pursuit algorithm is a matching pursuit algorithm.

52. A method according to claim 50, wherein the signal s is a continuous-time signal.

53. A method according to claim 50, wherein the signal s is a discrete-time signal.

* * * * *